United States Patent
Epple

(10) Patent No.: US 8,004,756 B2
(45) Date of Patent: *Aug. 23, 2011

(54) CHROMATICALLY CORRECTED CATADIOPTRIC OBJECTIVE AND PROJECTION EXPOSURE APPARATUS INCLUDING THE SAME

(75) Inventor: Alexander Epple, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/834,485

(22) Filed: Jul. 12, 2010

(65) Prior Publication Data

US 2011/0007387 A1    Jan. 13, 2011

Related U.S. Application Data

(63) Continuation of application No. 11/896,689, filed on Sep. 5, 2007, now Pat. No. 7,760,425.

(51) Int. Cl.
*G02B 17/08* (2006.01)

(52) U.S. Cl. .................... 359/366; 359/656

(58) Field of Classification Search .......... 359/366, 359/349, 656

See application file for complete search history.

(56) References Cited

U.S. PATENT DOCUMENTS

| | | | |
|---|---|---|---|
| 620,978 A | 3/1899 | Schupmann | |
| 4,469,414 A | 9/1984 | Shafer | |
| 6,451,507 B1 | 9/2002 | Suenaga et al. | |
| 6,636,350 B2 | 10/2003 | Shafer et al. | |
| 6,665,126 B2 | 12/2003 | Shafer et al. | |
| 6,909,492 B2 | 6/2005 | Omura | |
| 6,995,918 B2 | 2/2006 | Terasawa et al. | |
| 7,760,425 B2 * | 7/2010 | Epple | 359/366 |
| 2003/0011755 A1 | 1/2003 | Omura et al. | |
| 2004/0160677 A1 | 8/2004 | Epple et al. | |
| 2006/0098298 A1 | 5/2006 | Kato et al. | |

FOREIGN PATENT DOCUMENTS

| | | |
|---|---|---|
| DE | 19939088 A1 | 2/2000 |
| EP | 0902329 A1 | 3/1999 |
| EP | 1 069 448 A1 | 1/2001 |
| EP | 1227354 A2 | 7/2002 |
| EP | 1 480 065 A2 | 11/2004 |
| WO | WO 2005/040890 A2 | 5/2005 |

\* cited by examiner

*Primary Examiner* — Joshua L Pritchett

(74) *Attorney, Agent, or Firm* — Sughrue Mion, PLLC

(57) ABSTRACT

A catadioptric objective includes a plurality of optical elements arranged along an optical axis to image a pattern from an object field in an object surface of the objective to an image field in an image surface region of the objective at an image-side numerical aperture NA with electromagnetic radiation from a wavelength band around a central wavelength $\lambda<300$ nm. The optical elements include a concave mirror and a plurality of lenses. The projection objective forms an image of the pattern in a respective Petzval surface for each wavelength $\lambda$ of a wavelength band, the Petzval surfaces deviating from each other for different wavelengths. The plurality of lenses include lenses made from different materials having substantially different Abbe numbers. A longitudinal departure p of the Petzval surface at a given wavelength from a planar reference surface at an edge field point of the image field (at maximum image height y') measured parallel to the optical axis in the image surface region, varies with the wavelength $\lambda$ according to: $dp/d\lambda<(15\lambda/NA^2)/nm$.

36 Claims, 24 Drawing Sheets

NA = 0.5

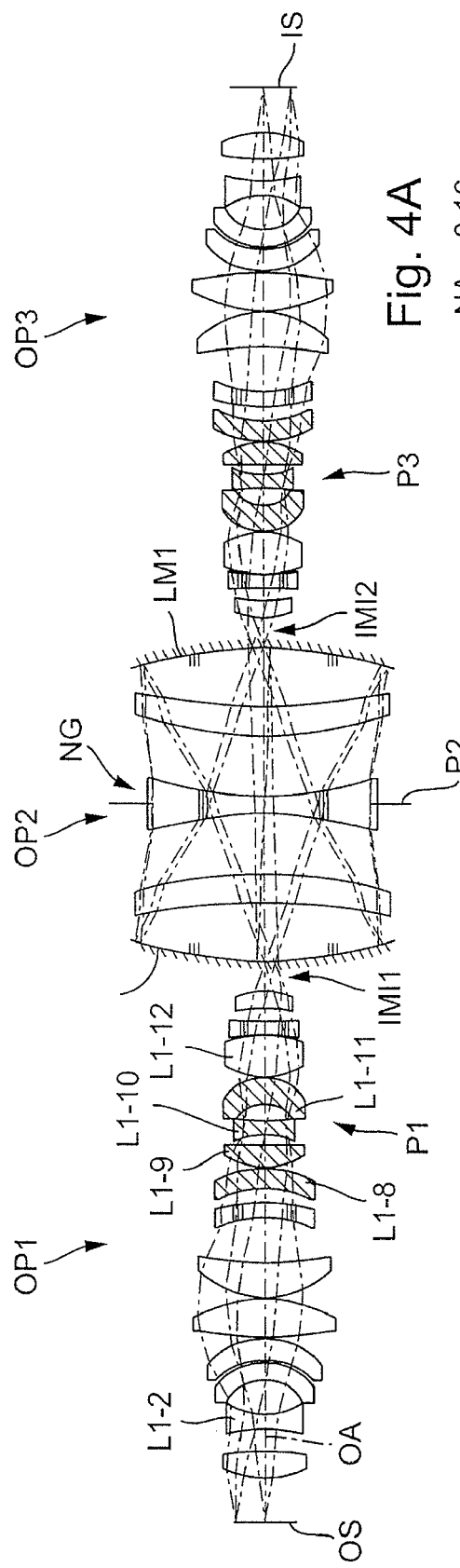
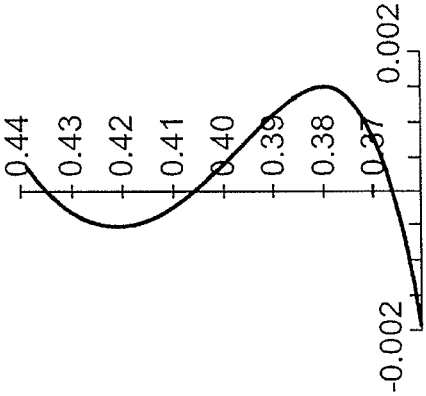
Fig. 4A  NA = 0.16
Fig. 4B

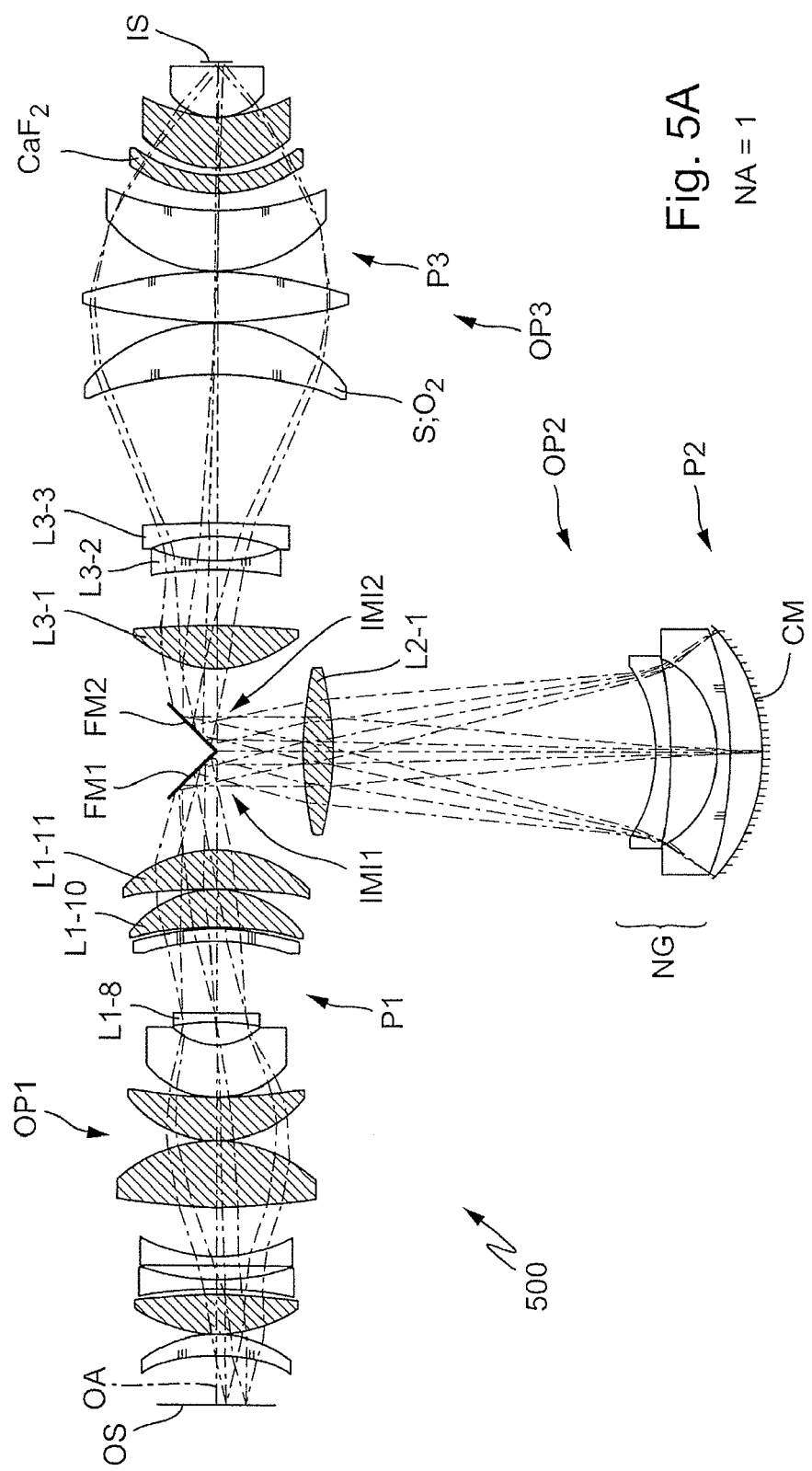

NA = 0.6

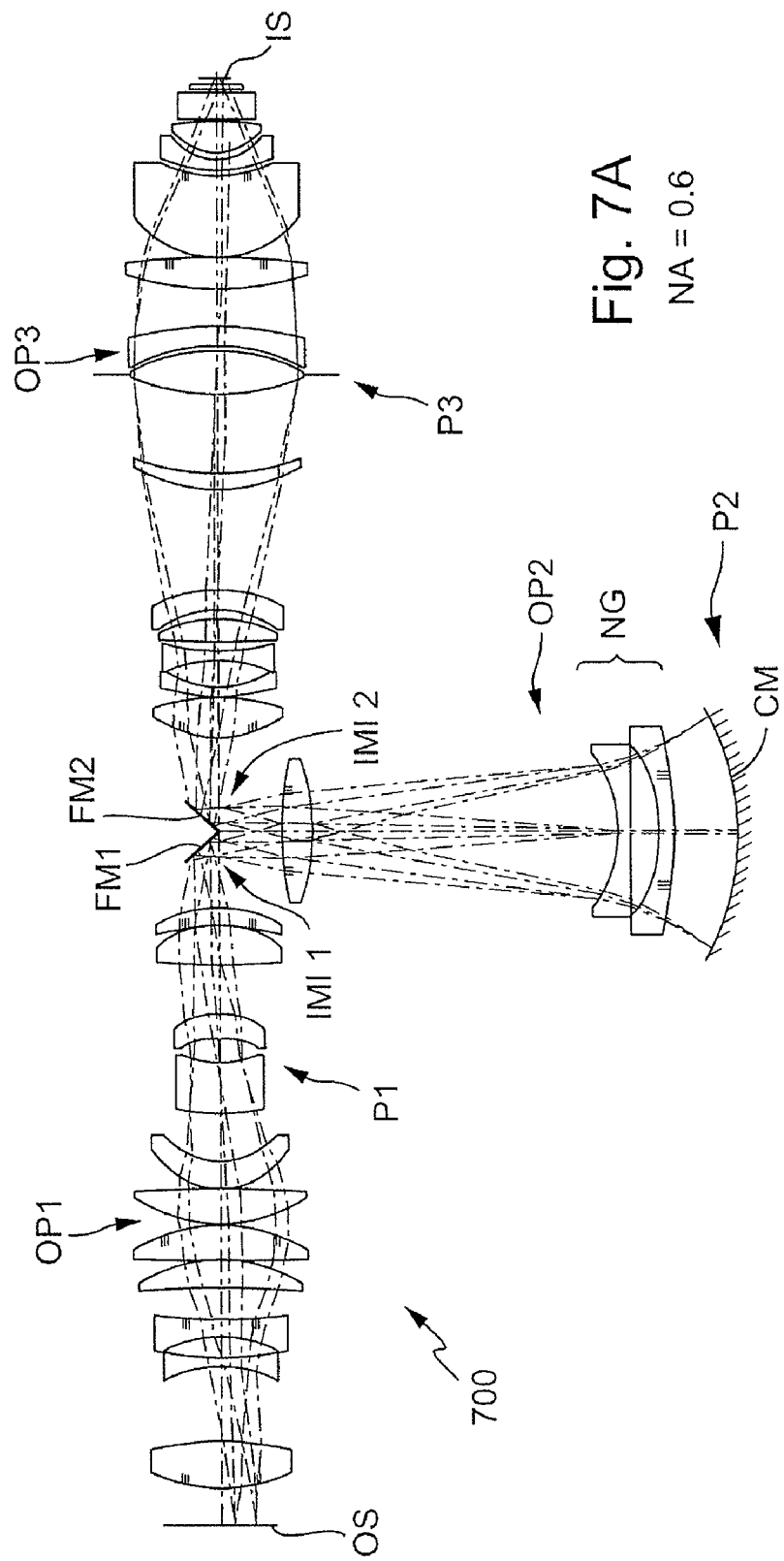

NA = 0.6

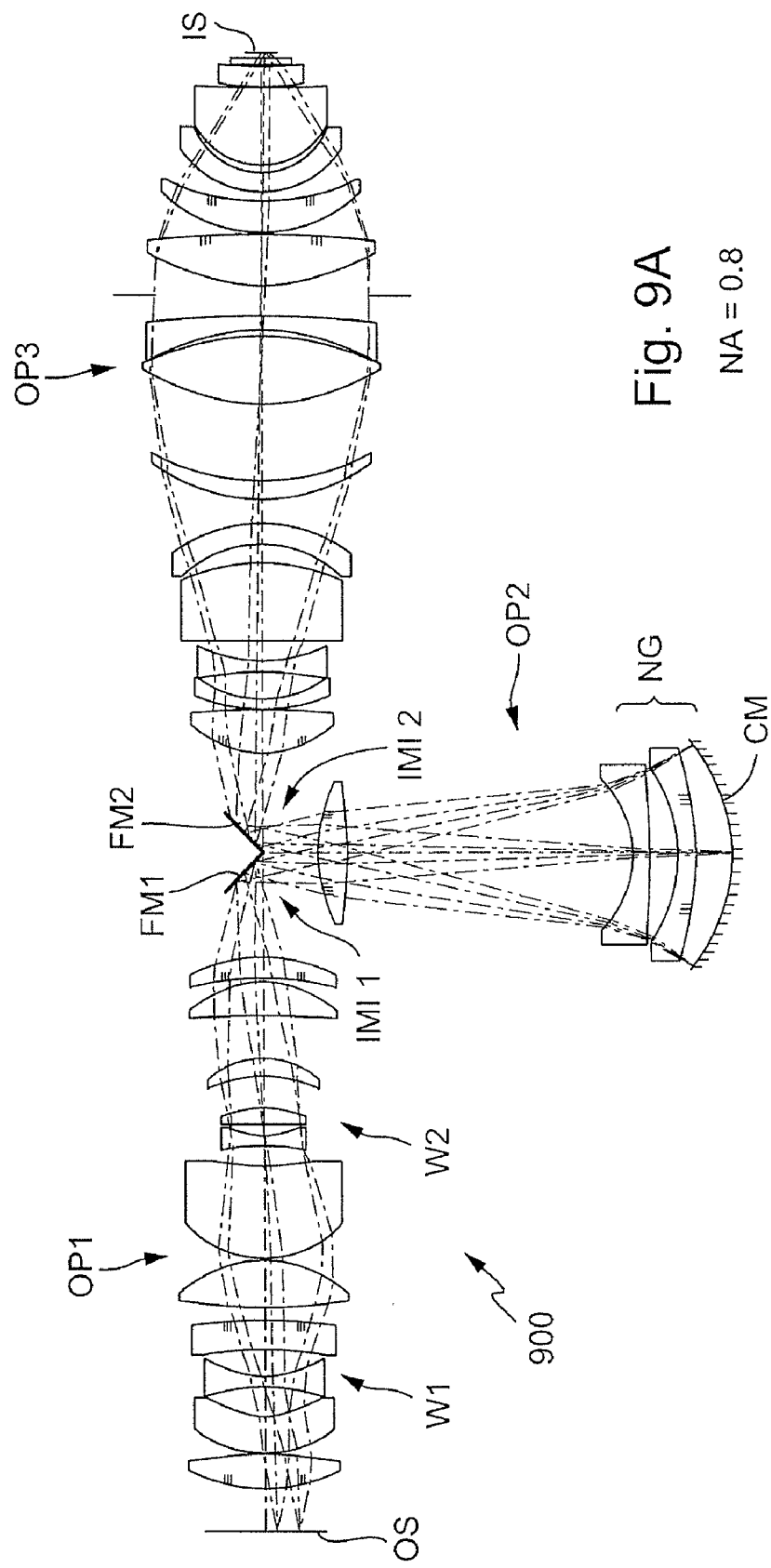

NA = 0.6

NA = 0.5

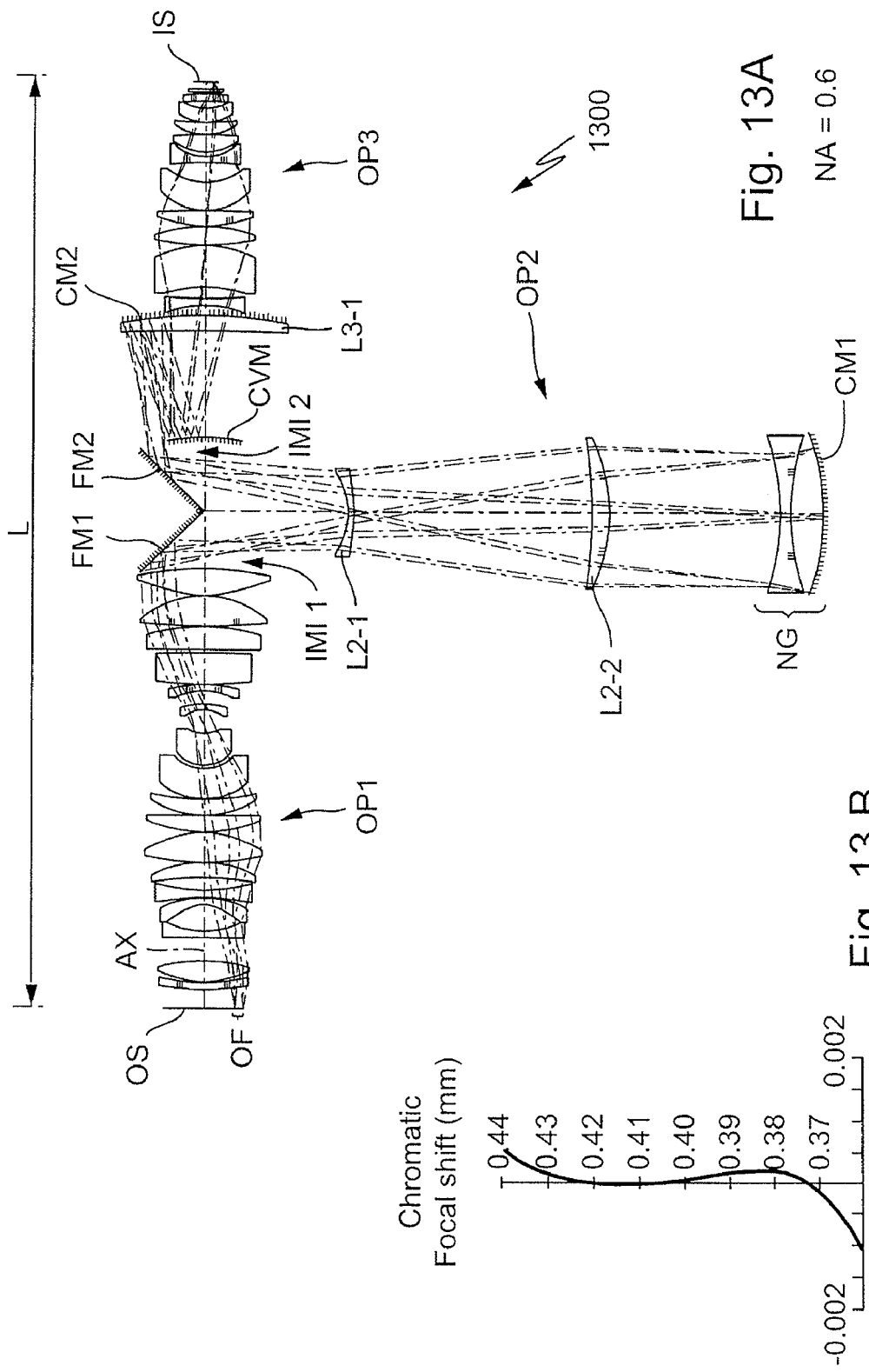

CHROMATICALLY CORRECTED CATADIOPTRIC OBJECTIVE AND PROJECTION EXPOSURE APPARATUS INCLUDING THE SAME

The present application is a Continuation of U.S. patent application Ser. No. 11/896,689, filed on Sep. 5, 2007, the entire disclosure of which is incorporated herein by reference.

FIELD AND BACKGROUND OF THE INVENTION

1. Field of the Invention

The invention relates to a catadioptric objective. The objective may be configured as catadioptric projection objective which may be used in a microlithographic projection exposure apparatus to expose a radiation-sensitive substrate arranged in the region of an image surface of the projection objective with at least one image of pattern of a mask that is arranged in the region of an object surface of the projection objective. The invention also relates to a projection exposure apparatus which includes such catadioptric objective.

2. Description of Related Art

Microlithographic projection exposure methods and apparatus are used to fabricate semiconductor components and other finely patterned components. A microlithographic exposure process involves using a mask (reticle) that carries or forms a pattern of a structure to be imaged, for example a line pattern of a layer of a semiconductor component. The pattern is positioned in a projection exposure apparatus between an illumination system and a projection objective in a region of the object surface of the projection objective. Primary radiation from the ultraviolet electromagnetic spectrum (UV radiation) is provided by a primary radiation source and transformed by optical components of the illumination system to produce illumination radiation directed at the pattern of the mask. The radiation modified by the mask and the pattern passes through the projection objective, which forms an image of the pattern in the image surface of the projection objective, where a substrate to be exposed is arranged. The substrate, e.g. a semiconductor wafer, normally carries a radiation-sensitive layer (photoresist).

Various types of primary radiation sources are currently used in the field of microlithography. In some cases, a laser is used as primary radiation source. A natural bandwidth of the laser may be narrowed by appropriate bandwidth narrowing devices. For example, a natural bandwidth of about $\Delta\lambda=500$ pm may be reduced by three orders of magnitude to obtain radiation having a bandwidth $\Delta\lambda\approx0.5$ pm used for the exposure. Where radiation with a relatively small bandwidth is used for the exposure, chromatic aberrations caused by the optical elements of the projection objective may be kept relatively small without specific efforts for chromatic correction (correction of chromatic aberrations).

The situation is different in microlithographic systems having primary radiation source emitting ultraviolet radiation from a relatively broad wavelength band. For example, a mercury vapour lamp or a light emitting diode (LED) may be used as primary radiation source. Specifically, projection exposure systems having a central wavelength $\lambda=365.5$ nm$\pm2$ nm (so-called i-line system) have been in use for a long time. Those systems utilize the i-line of a mercury vapour lamp, the natural bandwidth thereof being limited to a narrower utilized band width $\Delta\lambda$ of about 2 nm with the aid of filters or in some other way. Other spectral lines of a mercury vapour lamp may also be used for exposure, such as the mercury h-line at about 405 nm and the mercury g-line at about 436 nm. The electromagnetic spectrum of each of the lines is relatively broad, thereby requiring that the projection objective should provide a relatively efficient correction of chromatic aberrations in order to ensure low-aberration imaging even with such broad band radiation at the required resolution. Chromatic correction is also required if it is desired to use a laser source at the natural line width or a laser source having only moderate line width narrowing.

Chromatic aberrations occur basically because of the fact that the index of refraction, n, of transparent optical materials varies as a function of the wavelength $\lambda$. In general, the index of refraction of optical materials is higher for shorter wavelength than for longer wavelength. Chromatic aberrations may be subdivided into different categories. A first category of chromatic aberrations includes deviations of position, shape and/or size of images formed at different wavelength from an ideal image. This accounts for the fact that an image is formed for each wavelength in a paraxial region, and the images usually differ in position, shape and/or size. The chromatic aberrations of the first category are usually referred to as "axial chromatic aberration" (or axial color, AX) and "chromatic difference of magnification" (or lateral color, LAT).

Axial chromatic aberration is the longitudinal variation of paraxial focus (or image position) with wavelength. Where the index of refraction of an optical material is higher for shorter wavelength than for longer wavelength, the short wavelengths are more strongly refracted at each surface of a lens element so that, in a simple positive lens, for example, the relatively shorter wavelength rays are brought to a focus closer to the lens than the relatively longer wavelength rays. The paraxial distance along the optical axis of the lens between the two focus points is the axial chromatic aberration. When the shorter wavelength rays are brought to focus closer to the positive lens than the longer wavelength rays, the longitudinal axial chromatic aberration is usually termed "undercorrected" or "negative".

When a lens system forms images of different sizes for different wavelengths or spreads the image of an off-axis point into a color fringe, the difference between the paraxial image heights for different colors is usually denoted lateral color or chromatic difference of magnification.

The chromatic variation of the index of refraction also produces a variation of monochromatic aberrations, which may be summarized in a second category of chromatic aberrations. The variation of monochromatic aberrations include the chromatic variation of spherical aberration, the chromatic variation of coma, the chromatic variation of astigmatism, the chromatic variation of distortion and the chromatic variation of image field curvature.

In some cases, blurred images with low contrast particularly near the outer edges of extended image fields have been observed in objectives used with relatively broadband radiation sources.

SUMMARY OF THE INVENTION

It is one object of the invention to provide a catadioptric objective useful for microlithography which may be operated with ultraviolet radiation provided by a broadband radiation source.

It is another object of the invention to provide a catadioptric objective useful for microlithography which generates an image with sufficient contrast over the entire image field when operated with ultraviolet radiation provided by a broadband radiation source.

It is another object of the invention to provide a catadioptric objective having a good correction status with respect to chromatic variation of the Petzval sum.

It is another object of the invention to provide a catadioptric objective which may be operated with ultraviolet radiation provided by a broadband radiation source, where manufacturing is facilitated with respect to choice of material and with respect to quality tolerances of materials used for transparent optical elements.

To address these and other objects the invention, according to one formulation, the invention, provides a catadioptric objective comprising a plurality of optical elements arranged along an optical axis to image a pattern from an object field in an object surface of the objective to an image field in an image surface region of the objective at an image-side numerical aperture NA with electromagnetic radiation from a wavelength band around a central wavelength $\lambda$. The optical elements include a concave mirror and a plurality of lenses. The projection objective forms an image of the pattern in a respective Petzval surface for each wavelength $\lambda$ of a wavelength band, the Petzval surfaces deviating from each other for different wavelengths. A longitudinal departure p of the Petzval surface at a given wavelength from a planar reference surface at an edge field point of the image field (at maximum image height y'), measured parallel to the optical axis in the image surface region, varies with the wavelength $\lambda$ according to $dp/d\lambda < (0.2 \lambda/NA^2)/nm$.

According to another formulation, there is provided a catadioptric objective comprising a plurality of optical elements arranged along an optical axis to image a pattern from an object field in an object surface of the objective to an image field in an image surface region of the objective at an image-side numerical aperture NA with electromagnetic radiation from a wavelength band around a central wavelength $\lambda$. The optical elements include a concave mirror and a plurality of lenses. The objective forms a first image of the pattern in a first Petzval surface at a first wavelength $\lambda_1 < \lambda$ of the wavelength band and a second image of the pattern in a second Petzval surface at a second wavelength $\lambda_2 > \lambda$ separated from the first wavelength by a wavelength difference $\Delta\lambda = \lambda_2 - \lambda_1$ greater than 5 nm. A longitudinal Petzval surface departure $\Delta PS$ between the first Petzval surface and the second Petzval surface, measured parallel to the optical axis in the image surface region, is less than $\lambda/NA^2$ for all field points in the image field.

According to another formulation, there is provided a catadioptric objective comprising a plurality of optical elements arranged along an optical axis to image a pattern from an object field in an object surface of the objective to an image field in an image surface region of the objective at an image-side numerical aperture NA with electromagnetic radiation from a wavelength band around a central wavelength $\lambda$. The optical elements include a concave mirror and a plurality of lenses. The projection objective forms an image of the pattern in a respective Petzval surface for each wavelength $\lambda$ of a wavelength band, the Petzval surfaces deviating from each other for different wavelengths. The plurality of lenses includes lenses made from different materials having substantially different Abbe numbers. A longitudinal departure p of the Petzval surface at a given wavelength from a planar reference surface at an edge field point of the image field (at maximum image height y'), measured parallel to the optical axis in the image surface region, varies with the wavelength $\lambda$ according to $dp/d\lambda < (7.7 \lambda/NA^2)/nm$.

According to another formulation, there is provided a catadioptric objective comprising a plurality of optical elements arranged along an optical axis to image a pattern from an object field in an object surface of the objective to an image field in an image surface region of the objective at an image-side numerical aperture NA with electromagnetic radiation from a wavelength band around a central wavelength $\lambda < 300$ nm. The optical elements include a concave mirror and a plurality of lenses. The projection objective forms an image of the pattern in a respective Petzval surface for each wavelength $\lambda$ of a wavelength band, the Petzval surfaces deviating from each other for different wavelengths. The plurality of lenses includes lenses made from different materials having substantially different Abbe numbers. A longitudinal departure p of the Petzval surface at a given wavelength from a planar reference surface at an edge field point of the image field (at maximum image height y'), measured parallel to the optical axis in the image surface region, varies with the wavelength $\lambda$ according to $dp/d\lambda < (15 \lambda/NA^2)/nm$ The planar reference surface mentioned above may be the paraxial image surface of the objective, sometimes denoted as Gaussian image surface. The paraxial image surface extends perpendicularly to the optical axis at the axial position where the paraxial image (image formed by paraxial rays) is formed. The planar reference surface may be the best focal plane of the objective. In general, the best focal plane does not coincide with the paraxial image plane but is slightly defocused relative thereto into a position where all aberrations including defocus are well balanced.

Every optical system has associated with it a sort of basic field curvature, which is conventionally called the Petzval curvature. When there is no astigmatism, the sagittal and tangetial image surfaces coincide with each other and lay on the Petzval surface. Positive lenses (lenses with positive refractive power) introduce inward curvature of the Petzval surface to a system, and negative lenses (lenses with negative refractive power) introduce backward curvature. The Petzval curvature, $1/R_P$, is given by the Petzval sum $1/R_P$, which is the reciprocal of the Petzval radius $R_P$, which is the radius of curvature of the Petzval surface. The Petzval sum of dioptric (refractive) optical elements may be defined as follows:

$$\frac{1}{R_P} = -n_{img} \sum_i \frac{1}{r_i} \left( \frac{1}{n_i} - \frac{1}{n_{i-1}} \right) \quad (1)$$

In this equation, $R_P$ is the radius of curvature of the Petzval surface in the image space, $n_{img}$ is the refractive index in the image space, $r_i$ is the radius of curvature of the $i^{th}$ system surface (positive if convex towards the incoming radiation), and $n_i$ and $n_{i-1}$ are the refractive indices of the medium downstream and upstream of the $i^{th}$ system surface. In the absence of astigmatism, the Petzval curvature corresponds to the curvature of the image surface. For reflective surfaces (mirrors) the condition $n_i = -n_{i-1}$ holds such that:

$$\frac{1}{R_P} = n_{img} \sum_i \frac{2}{r_i \cdot n_i}, \quad (2)$$

wherein $n_i$ is the refractive index of the medium surrounding the mirror surface. Equations (1) and (2) show that the condition $R_P < 0$ holds for a positive lens, corresponding to an inward curvature of the Petzval surface. Therefore, the image of a planar object will be concave towards the radiation direction, which condition is typically referred to as "undercorrection" of field curvature. In contrast, the condition $R_P>0$ holds for a concave mirror, corresponding to overcorrection of the field curvature.

The Petzval surface and the paraxial image surface coincide on the optical axis. The curvature of the Petzval surface may result in a situation where the Petzval surface departs from the ideal image surface for field points further away from the optical axis. The fact that the Petzval surface is curved transforms to a longitudinal departure p of the Petzval surface from the ideal image surface (which is usually flat) at a field point at the outer edge of the image field (at maximum image field height y'), measured parallel to the optical axis in the image space. The term "image field curvature" is conventionally used to refer to such longitudinal departure (or sag) at maximum image field height y', and may not be confused with the "curvature of the image field", which is the reciprocal of the radius of curvature of the image field.

Generally, the image field curvature will be different for different wavelengths, corresponding to a "chromatic variation of image field curvature" (or chromatic variation of the Petzval sum) of an optical system. With other words: the image field curvature (or the Petzval sum) is a function of the wavelength λ. Considering an optical system having lenses made from one material only (one-material system) equation (1) may be reformulated using parameter $n_g$ for the refractive index of all the lenses and parameter $n_a$ for the refractive index of the medium in the spaces between lenses according to:

$$\frac{1}{R_P} = \left(\frac{1}{n_g} - \frac{1}{n_a}\right) n_{img} \cdot \sum_{lenses}\left(\frac{1}{r_{i,1}} - \frac{1}{r_{i,2}}\right) \quad (3)$$

$$\frac{1}{R_P} = \left(\frac{1}{n_g} - \frac{1}{n_a}\right) n_{img} \cdot G, \text{ with} \quad (3a)$$

$$G = \sum_{lenses}\left(\frac{1}{r_{i,1}} - \frac{1}{r_{i,2}}\right) \quad (3b)$$

$$\frac{d}{d\lambda}\left(\frac{1}{R_P}\right) = \left(-\frac{1}{n_g^2}\right) n_{img} \cdot G \cdot \frac{dn_g}{d\lambda} \quad (3c)$$

Equation (3) gives the dioptric contribution to the system Petzval sum. In the sum term on the right hand side of equation (3), parameters $r_{i,1}$ and $r_{i,2}$ refer to the radius of curvature of the entry surface and the exit surfaces of the lenses, respectively. It is apparent that the sum term in the product on the right hand side of the equation (3), corresponding to sum term G as defined in equation (3b), describes a purely geometrical property of the optical system, whereas the first factor of the product in equation (3) includes the refractive index of the lenses, is generally different from zero and varies with the wavelength. Therefore, if the sum term (purely geometrical term G) differs from 0, and if the transparent material used for the lenses is a dispersive material (index of refraction varies with wavelength) then the contribution to Petzval sum given in equation (3) varies with the wavelength as given in equation (3c) assuming that the dispersion of the medium adjacent to the mirrors is negligible As evident from equation (2), the contribution to Petzval sum of reflective surfaces does not depend on the wavelength as long as the reflective surfaces lie in a substantially dispersion-free medium such as air or another gas. Therefore, the entire chromatic variation of the Petzval sum in a catadioptric optical system equals the chromatic variation of the Petzval sum of the dioptric (refractive) optical components of the optical system.

As outlined above, the Petzval sum is a parameter representing the curvature of the image field in which an image with optimum quality is generated (if no other aberrations such as astigmatism exist). Where it is desired to determine whether or not a given image field curvature is acceptable for an optical system the problem may be described as follows. A longitudinal departure p of the Petzval surface from a reference image surface at an edge field point of the image field at image height y' measured parallel to the optical axis in the image surface region, may be written as follows:

$$p = \frac{1}{2R_P}y'^2 \quad (4)$$

where $R_p$ is the Petzval radius (radius of the Petzval surface). The longitudinal departure p effectively corresponds to a defocus at the outer edge of the image field from a reference surface, which may be a planar surface perpendicular to the optical axis or a surface of another shape. Where it is desired to obtain a diffraction limited image across the entire image field this defocus (longitudinal departure) must not exceed a predefined fraction of the depth of focus (DOF), which is proportional to the Rayleigh unit RU defined as:

$$RU = \frac{\lambda}{NA^2} \quad (5)$$

Therefore, the defocus resulting from the Petzval sum should not exceed a given threshold value according to:

$$p < A \cdot \frac{\lambda}{NA^2} \quad (6)$$

Generally, the condition A<1 should hold if diffraction limited imaging is desired.

Where the Petzval sum varies with the wavelength, the longitudinal departure p defined above also varies with the wavelength such that the derivative of p with respect to wavelength λ, dp/dλ, has a finite value differing from zero. The derivative of p with respect to wavelength λ, dp/dλ, may be used to characterize the magnitude of the chromatic variation of image field curvature in an optical system. The derivative of p with respect to wavelength λ, dp/dλ, should not exceed a threshold value B in the wavelength band of intended use such that $$dp/d\lambda < B \quad (7)$$

In broadband applications, where it is desired to use at least two wavelengths $\lambda_1$ and $\lambda_2$ spaced apart by the wavelength difference Δλ condition (6) may be reformulated as $$dp/d\lambda * \Delta\lambda < A * 1 RU \quad (8)$$

Where the objective is configured to be used as a projection objective in a microlithographic system it may be desirable that the images formed for different wavelengths lay relatively close together in a common image field region and the common image field region is essentially flat in an area large enough to allow economic manufacturing of components. In those embodiments the objective may be configured to reduce an image field curvature for each of the first and second wavelength in the image region to less than a depth of focus of the objective. The depth of focus (DOF) is proportional to the Rayleigh unit $RU=\lambda/NA^2$.

In some embodiments the image field has an image field size defined by a maximum image field height y' greater than 3 mm. Twice the maximum image field height corresponds to the image field diameter which may actually be used for lithographic purposes, for example. The maximum image field height y' may be 5 mm or more, or 8 mm or more, or 10 mm or more, or 15 mm or more for example.

Embodiments may have an image-side numerical aperture NA>0.2, thereby allowing use in microlithography, for example. In some embodiments an image-side numerical aperture NA>0.3 or NA>0.4 or NA≧0.5 is obtained. The image-side numerical aperture may be even greater, such as NA≧0.6 or NA≧0.7 or NA≧0.8. Embodiments may be used in an immersion configuration, thereby allowing NA≧1.0 in cases where the objective is configured for such immersion operation.

The wavelength band may include wavelengths λ≧300 nm. For example where primary radiation is provided by a mercury vapour radiation source the wavelength band may include at least one of the mercury g-, h- and i-lines. In some embodiments the wavelength band may include at least two mercury spectral lines, for example each of the mercury g-, h- and i-lines. The wavelength band may include wavelengths λ<300 nm, such as λ<260 nm or λ<200 nm, for example. The wavelength may be larger than 100 nm or larger than 150 nm. Wavelengths smaller than 300 nm may be provided by a laser radiation source.

The wavelength band may include radiation of one spectral line region only, where a considerable amount of energy of the spectral line region may be used. The wavelength difference Δλ may be 0.1 nm or more or 1 nm or more or 2 nm or more in some cases. Larger wavelength differences are possible, such as Δλ>5 nm. In some embodiments Δλ>10 nm, or Δλ>25 nm, or Δλ>50 nm. For example where the wavelength band includes each of the mercury g-, h- and i-lines Δλ may be larger than 70 nm. Δλ may be smaller than 200 nm or smaller than 100 nm.

Catadioptric objectives useful for broadband application with sufficient control of the chromatic variation of image field curvature may be configured in a variety of ways.

In some embodiments, the concave mirror is arranged at or optically close to a pupil surface of the objective and a negative group comprising at least one negative lens is arranged in front of the concave mirror on a reflecting side thereof in a double pass region such that radiation passes at least twice in opposite directions through the negative group. The negative group may be positioned in direct proximity to the concave mirror in a region near the pupil, where this region may be characterized by the fact that the marginal ray height (MRH) of the imaging is greater than the chief ray height (CRH). Preferably, the marginal ray height is at least twice as large, in particular at least 5 to 10 times as large, as the chief ray height in the region of the negative group. A negative group in the region of large marginal ray heights can contribute effectively to the chromatic correction, in particular to the correction of the axial chromatic aberration AX, since the axial chromatic aberration AX of a thin lens is proportional to the square of the marginal ray height at the location of the lens (and proportional to the refractive power and to the dispersion of the lens). Added to this is the fact that the projection radiation passes twice, in opposite through-radiating directions, through a negative group arranged in direct proximity to a concave mirror, with the result that the chromatically overcorrecting effect of the negative group is utilized twice. The negative group may e.g. consist of a single negative lens or contain at least two negative lenses.

A combination—acting in the manner of a "Schupmann achromat" (cf. U.S. Pat. No. 620,978)—of a concave mirror arranged near or at the pupil with a negative group arranged directly in front of the mirror surface can be utilized in catadioptric systems with a variety of constructions.

In some embodiments at least two transparent optical materials are used for the lenses to support chromatic correction, particularly correction of chromatic variation of Petzval curvature. In those embodiments the plurality of lenses includes lenses made from different materials having different Abbe numbers. The Abbe number ν for a material having a refractive index n (dependent on the wavelength λ) may be generally defined as follows:

$$v = \frac{n-1}{n_{\lambda_1} - n_{\lambda_2}}, \qquad (9)$$

where $\lambda_1$ and $\lambda_2 > \lambda_1$ are different wavelengths that determine the bandwidth for the calculation of the Abbe number, n is the index of refraction at a wavelength λ between $\lambda_2$ and $\lambda_1$ and $n_{\lambda_1}$, $n_{\lambda_2}$ are the refractive indices for $\lambda_1$ and $\lambda_2$, respectively. The Abbe number is sometimes referred to as "reciprocal relative dispersion" indicating that, in general, relatively high Abbe numbers correspond to materials having relatively low dispersion and vice versa, where the dispersion of a material is the rate of change of the index of refraction with respect to wavelength, that is dn/dλ.

Classical theory of correction of chromatic aberrations in refractive optical systems teaches that at least two different optical materials having different dispersion (or Abbe number) need to be combined to correct axial chromatic aberration for two or more different wavelengths in a wavelength band. Conventionally, an optical system in which two wavelengths are brought to a common focus is called an "achromat". An optical system in which three wavelengths are brought to a common focus is usually called an "apochromat". The term "superapochromat" may be used to denote optical systems in which four or more wavelengths are brought into a common focus.

While correction of axial chromatic aberration (AX) may be considered as a prerequisite for obtaining a chromatically corrected objective, the correction of AX alone is not a sufficient condition to obtain a useful image in an extended image field region where a broadband radiation source is used. Instead, additional measures are required to address the correction of chromatic variation of image field curvature, which will now be explained in further detail.

For all optical systems employing a plurality of different materials having different Abbe numbers a "median Abbe number" may be defined. The "median Abbe number" may be determined in analogy to statistics as a number dividing a higher half of sample from a lower half. The median of a finite list of numbers can be found by arranging all the numbers of the finite list from the lowest value to the highest value and picking the middle one of the elements which determines the median value. If there is an even number of numbers on the list, the median is defined, for the purpose of this application, as the mean value of the two middle values. For example, if 60% of all the lenses of the plurality of lenses are made from one and the same first material, and 40% are made from the second material, then the median Abbe number is the Abbe number of the first material.

At least one of the plurality of lenses may be a first lens made from a first material having a first Abbe number equal to or greater than the median Abbe number and at least one of the plurality of lenses may be made from a second material having an Abbe number smaller than the median Abbe number. For the purpose of this application, the first material (having the relatively greater Abbe number, generally corresponding to a relatively smaller dispersion) will be denoted as "relative crown material" or simply "crown material", whereas the second material having the relatively smaller Abbe number (generally corresponding to relatively higher dispersion) will be denoted as "relative flint material" or, simply, "flint material".

In some embodiments, more than 50% of all the lenses are made from a first material and less than 50% are made from a second material. In some embodiments, less than 30% of all the lenses or less than 20% of all the lenses are made from a second (relatively high dispersion) material.

In some embodiments, more than 50% of all the lenses are made from a second material and less than 50% are made from a first material.

It has been found useful for the correction of chromatic variation of the image field curvature if at least one second lens (made from the second material) is a negative lens. With other words: at least one lens made from a relative flint material combined with lenses made of relative crown material may be a powerful refractive means to correct chromatic aberration of image field curvature.

It may be preferable that the negative lens has relatively strong refractive power. Therefore, although the negative lens may be designed as a meniscus lens, in some embodiments the negative lens is a biconcave negative lens. The negative lens may be a plano-concave lens.

Unlike negative lenses which are primarily provided to support correction of axial chromatic aberration (AX) a negative lens dedicated to support correction of chromatic variation of image field curvature should be relatively small in diameter, e.g. when compared to adjacent lenses. The negative lens may have an optically free diameter substantially smaller than an optically free diameter of at least one lens directly adjacent to the negative lens. For example, the negative lens may be arranged between two adjacent lenses, where each of the two adjacent lenses has an optically free diameter substantially larger than the optically free diameter of the negative lens, e.g. by at least 10% or at least 20%. In some embodiments, the negative lens has an optically free diameter which is less than 80% of an optically free diameter of a largest lens (lens having the largest optically free diameter) of the objective. The optically free diameter of the negative lens may be less than 70% and/or less than 60% and/or less than 50% of the optically free diameter of the largest lens of the objective.

The negative lens may be arranged in a region of relatively low marginal ray height. This allows designing the negative lens with relatively strong negative refractive power while at the same time the contribution of the negative lens to the overall refractive power of the objective may be kept relatively small such that it is not necessary to provide high power positive lenses to compensate the dispersive effect of the negative lens. In some embodiments the objective includes at least one waist region where a beam diameter of a radiation beam passing through the objective has a local minimum and the negative lens is positioned in the waist region.

A negative lens as mentioned above may also be positioned close to a field surface of the objective, such as the object surface or the image surface. In embodiments having one or more real intermediate images, a negative lens may be positioned close to the intermediate image.

Although one single negative lens made of relative flint material may be sufficient to correct chromatic variation of the image field curvature in some embodiments, other embodiments have at least two negative lenses of the second material. More than two negative lenses of a second material may be provided if desired. The negative lenses may be made from the same or different relative flint materials.

In some embodiments most of the lenses are made of fused silica ($SiO_2$) which is essentially free of absorption down to ultraviolet wavelength of about 190 nm and may be manufactured at moderate costs with established processes.

Fused silica may be combined with different materials. For example, in some embodiments lenses of fused silica are combined with lenses made of one or more materials having a larger relative dispersion than fused silica. In these combinations, fused silica lenses are made from "relative crown material", whereas the other lenses are made from "relative flint material". In theses combinations, special optical glasses such as FK5, LF5 or LLF1 (sold by SCHOTT, Mainz, Germany) or comparable glasses with similar optical properties provided by other manufacturers, such as OHARA, may be used as relative flint material. In other material combinations fused silica may be the relative flint material, having a relatively higher dispersion than other lenses of the objective. For example, fused silica lenses may be combined with lenses made of calcium fluoride, for example in embodiments of objectives designed for 193 nm operating wavelength. In this material combination, calcium fluoride functions as the relative crown material.

In some embodiments, the objective includes at least one convex mirror in addition to the at least one concave mirror such that the objective includes at least two curved mirrors having opposite sense of curvature of the reflective surfaces. A convex mirror has negative optical power like a diverging (negative) lens, but no dispersion. The contribution of the convex mirror to Petzval sum only depends on the radius of curvature of the curved mirror. The contribution to Petzval sum of convex mirror has opposite sign than the contribution of a concave mirror.

If at least one convex mirror is provided in addition to at least one concave mirror, the choice for the materials or material used for the refractive optical elements may be simplified since a mix of materials with different Abbe numbers may no longer be required to obtain sufficient chromatic correction, particularly correction of chromatic variation of image field curvature (Petzval sum) In some embodiments, at least 90% of the plurality of lenses or all of the plurality of lenses are made from one or plurality of materials having essentially the same Abbe number. A difference in Abbe number may be less than 20%, for example. In some embodiments, all lenses of the plurality of lenses are made from the same material. The same material may be fused silica ($SiO_2$), calcium fluoride ($CaF_2$) or a common crown glass like BK7, or FK5 or glasses with similar optical properties.

If only one optical material is used for all lenses of an objective (one-material system) the manufacturer of the objective is less dependent on exact specifications for material properties such as dispersion or partial dispersion of different glass types. For example, if the dispersion or partial dispersion of the one material used for all lenses of an optical system varies due to charge fluctuations, theses variations are basically the same for all used optical elements and thus may be relatively easily be compensated for by relatively simple adjustments. Such compensations may generally be more difficult if more than one material is used, where the optical properties of each of the used materials may fluctuate due to charge fluctuations in a different way no longer allowing compensation with relatively simple adjustments.

The Petzval sum of a catadioptric system, characterizing the image field curvature, is a sum of the Petzval sum of all dioptric (refractive) and of all catoptric (reflective) system members. As can be seen from equation (3c), the variation of Petzval sum with wavelength for the dioptric lenses depends on the dispersion $dn/d\lambda$ of the used lens material. However, as can be seen from equation (3a) the Petzval sum of the catoptric system elements does not change with wavelength (assuming that the surrounding medium, in general air or other gas does not show dispersion) therefore, the total change of the Petzval sum with wavelength is given by the dioptric contribution to the Petzval sum. Where it is desired to correct the chromatic variation of image field curvature in an optical system having only one material or materials having very similar Abbe numbers it is preferred that the Petzval sum of all dioptric components is substantially 0 or obtains a very small value, so that it does not change significantly with wavelength.

Where it is desired to have a sufficient correction of the overall Petzval sum of the objective across a relatively large field size it is then required that the total Petzval sum vanishes, and thus the contribution to Petzval sum of all reflective components should also be essentially zero. This may be achieved by providing that each of the concave mirror and the at least one convex mirror has a base curvature (i.e. the curvature of the reflective surface at the vertex of the mirror, also denoted vertex curvature) and wherein a sum of the base curvatures of all curved mirrors is substantially zero. One or more convex mirrors may be provided.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIG. 4 shows a second embodiment of a catadioptric projection objective in FIG. 4A and a diagram representing optical properties of the embodiment in FIG. 4B;

FIG. 13 shows a tenth embodiment of a catadioptric projection objective in FIG. 13A and a diagram representing optical properties of the embodiment in FIG. 13B;

DETAILED DESCRIPTION OF PREFERRED EMBODIMENTS

In the following description of preferred embodiments, the term "optical axis" refers to a straight line or a sequence of a straight-line segments passing through the centers of curvature of optical elements. The optical axis can be folded by folding mirrors (deflecting mirrors) such that angles are included between subsequent straight-line segments of the optical axis. In the examples presented below, the object is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible.

Where tables are provided to disclose the specification of a design shown in a figure, the table or tables are designated by the same numbers as the respective figures. Corresponding features in the figures are designated with like or identical reference identifications to facilitate understanding. Where lenses are designated, an identification L3-2 denotes the second lens in the third objective part (when viewed in the radiation propagation direction).

Figure 1:
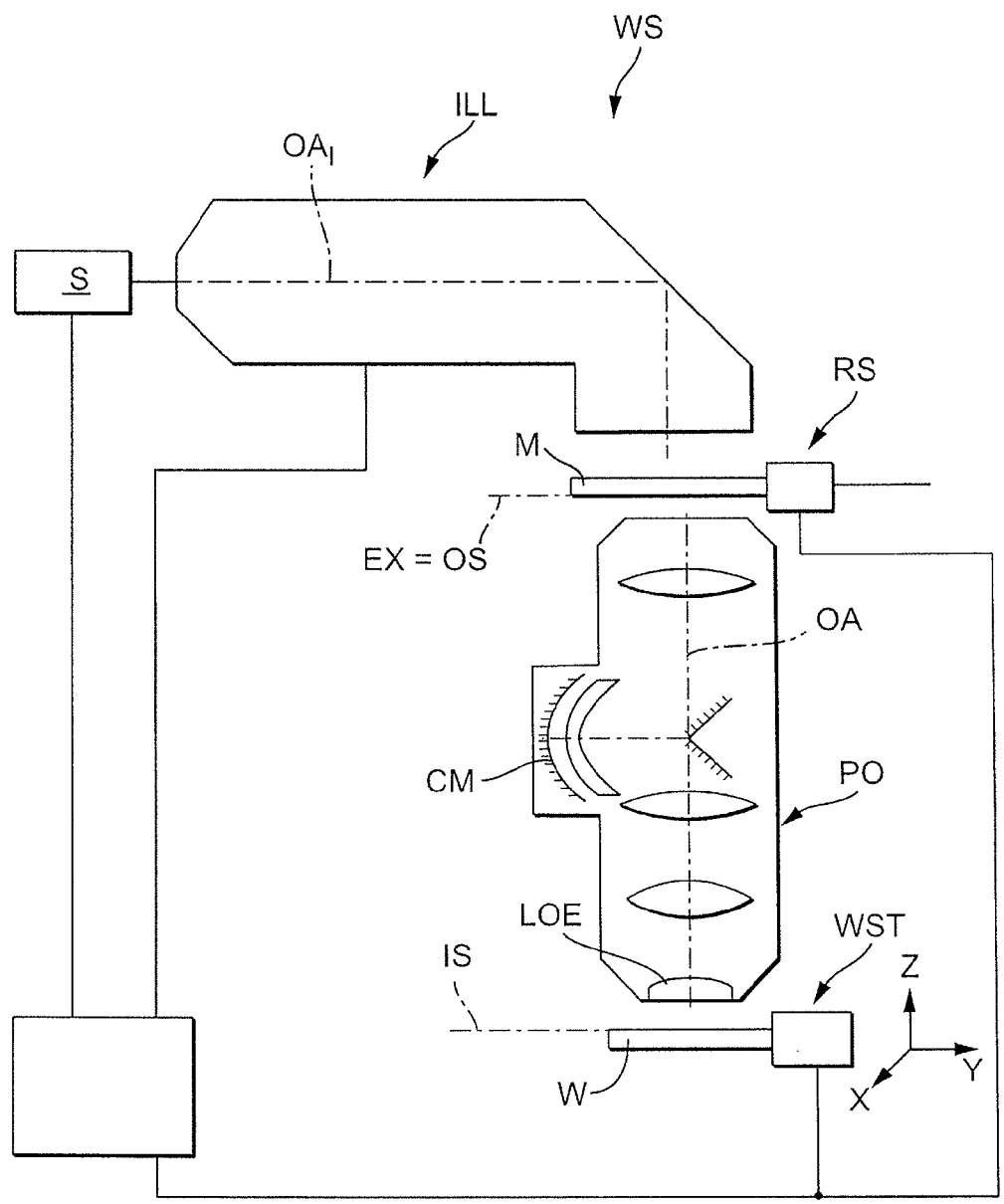
FIG. 1 shows a schematic drawing of an embodiment of a projection exposure apparatus for microlithography having an illumination system and a projection objective.

FIG. 1 schematically shows a microlithography projection exposure apparatus in the form of a wafer scanner WS set up for producing specific layers of large-scale integrated semiconductor components and permits exposures with a resolution capability of down to R=180 nm or lower depending on the setting. A primary radiation source S of the exposure apparatus includes a high power mercury-arc lamp emitting ultraviolet radiation in a wavelength band including the mercury g-line at about 436 nm, the mercury h-line at about 405 nm and the mercury i-line at about 365 nm (compare FIG. 2). In some embodiments, radiation intensity from each of the three mercury lines is used for exposure such that the optical systems downstream of the primary radiation source must be configured to operate properly with different wavelengths from a broad wavelength band having a wavelength difference $\Delta\lambda$ of about 70 nm (or more) between the shortest wavelength (i-line) and the largest wavelength (g-line).

A downstream illumination system ILL receives the light from the primary radiation source S and generates, in its exit plane EX, a large, sharply delimited, homogeneously illuminated illumination field that is adapted to the telecentricity requirements of the projection objective PO and is centered about the optical axis $OA_I$ of the illumination system. The illumination system ILL has devices for setting the illumination mode and, in the example, can be changed over between conventional illumination with a variable degree of coherence, annular illumination and dipole or quadrupole illumination.

Arranged between the exit-side last optical element of the illumination system and the entrance of the projection objective is a device RS for holding and manipulating a mask M such that a pattern—arranged on the mask—of a specific layer of the semiconductor component to be produced lies in the object plane OS of the projection objective, said object plane coinciding with the exit plane EX of the illumination system. The optical axis $OA_I$ of the illumination system and the optical axis OA of the projection objective PO are laterally offset relative to one another in order to produce an off-axis field in relation to the optical axis OA of the projection objective. The device RS—usually referred to as "reticle stage"—for holding and manipulating the mask contains a scanner drive enabling the mask to be moved parallel to the object surface OS of the projection objective or perpendicular to the optical axis of projection objective and illumination system in a scanning direction (y-direction).

The projection objective PO follows in the radiation path downstream of the plane EX, also designated as mask plane. The projection objective may be a reducing objective set up for imaging a demagnified image of the structure borne by the mask on a reduced scale, for example on a scale of 4:1 or 5:1 or 10:1, onto a wafer W coated with a photoresist layer. The projection objective may be a unit magnification (1:1) system. The wafer W serving as a light-sensitive substrate is arranged in such a way that its planar substrate surface coincides with the planar image surface (image plane) IS of the projection objective PO. The wafer is held by a device WST (wafer stage) comprising a scanner drive in order to move the wafer synchronously with the mask M in a fashion parallel to the latter.

The projection objective PO has a last optical element LOE as last, transparent optical component nearest the image surface IS. The exit surface of the last optical element is the last optical surface of the projection objective, being arranged at a working distance of a few millimetres above the substrate surface of the wafer in such a way that there is a gas-filled gap situated between the exit surface of the projection objective and the substrate surface (dry system). In other embodiments an immersion system is used where the working distance between the last optical element LOE and the wafer is filled with an immersion liquid (e.g. water). The last optical element LOE may be a plano-convex lens, providing a planar exit surface. In some embodiments, the last optical element may be formed by a plane parallel plate, equally providing a planar exit surface of the projection objective. The exit surface of the projection objective may also be curved. Such curved exit surface may be provided by a last optical element formed like a biconvex lens, for example. In some embodiments the last optical surface (exit surface of the projection objective) may be concave.

The projection objective PO may be designed as a reducing objective or as a 1:1 objective. The objective has, in addition to a plurality of schematically indicated lenses (typical numbers of lenses are often more than 10 or more than 15 lenses) and, if appropriate, other transparent optical components, a (at least one) concave mirror CM, which in the case of the example is arranged in proximity to a pupil surface of the projection objective. For many applications in the field of microlithograpy the image-side numerical aperture of the projection objective is NA>0.6, and in many embodiments NA is between approximately NA=0.65 and NA=0.85. As a result, typical resolutions of down to R=180 nm or below are possible at the operating wavelength predefined by the radiation source S. Typical resolutions down to about 150 nm, or 130 nm, or 100 nm, or 90 nm or less are also possible basically depending on the combination of image-side NA and the wavelength of the radiation source.

In order for the projection objective to function properly at a given wavelength or a given plurality of wavelengths within a desired wavelength band the projection objective must be configured to allow an exposure of substrates utilizing light from the wavelength band for which the projection objective is designed. This wavelength band may be denoted as "design wavelength band" and denotes a range of wavelengths including those wavelengths for which the optical performance of the projection objective is sufficiently good to allow diffraction limited imaging with relatively low aberration level. For example, where the configuration of the projection objective is such that the design wavelength band includes mercury g-, h- and i-lines, the projection objective may be used in conjunction with a high power mercury-arc lamp as a light source of the projection exposure apparatus. Therefore, a projection objective configured for use with a mercury-arc lamp should be optimized for at least one of the mercury lines at about 365 nm (i-line), about 405 nm (h-line) and about 436 nm (g-line), whereas the optical performance may deteriorate significantly outside the design wavelength band. Typically, a projection objective exclusively optimized for a design wavelength band including mercury g-, h- and i-lines cannot be properly operated for exposure at significantly smaller wavelength, such as in the deep ultraviolet (DUV) region with wavelengths smaller than about 260 nm and/or in the visible wavelength range, e.g. at wavelengths larger than about 500 nm.

A projection objective may be designed such that a useful image is formed for only one wavelength in a relatively narrow wavelength band. Embodiments described in this application are corrected to operate at two or more wavelengths spaced apart by a wavelength difference $\Delta\lambda$. The wavelength difference may be about 50 pm (50 picometers) or more, or 100 pm or more, or 1 nm (1 nanometer) or more, 2 nm or more, for example. The wavelength difference may be up to several tens of nanometers or more, for example according to the condition $\Delta\lambda<0.25$ μm. The exemplary embodiment of FIG. 2 is chromatically corrected for three wavelengths essentially corresponding to the wavelength of the mercury g-, h- and i-lines, which corresponds to a wavelength difference $\Delta\lambda$ of more than 70 nm. In such case all mercury lines can be used for exposure, whereby a larger fraction of the output power of the primary radiation source can be utilized for the exposure, thereby allowing a higher throughput of exposed substrates per time unit.

As outlined above, every optical imaging system designed to provide an image in an image field region has associated with it a sort of basic field curvature, conventionally denoted as Petzval curvature. The Petzval curvature is proportional to the Petzval sum $1/R_P$, which is the reciprocal of the Petzval radius $R_P$, which is the radius of curvature of the Petzval surface. Where the optical system includes refractive optical elements, such as lenses L1, L2, the image field curvature may be different for different wavelengths, which effect is denoted here as "chromatic variation of image field curvature". With other words: the objective forms a first image of a pattern in a first Petzval surface PS1 at a first wavelength $\lambda_1$ of a wavelength band, and a second image of the pattern in the second Petzval surface PS2 at a second wavelength $\lambda_2>\lambda_1$, where the first and second Petzval surface do not coincide. This situation is shown schematically in FIG. 2A, where projection objective PO generates a first Petzval surface PS1 for $\lambda=365$ nm (1-line), a second Petzval surface PS2 for $\lambda=436$ nm (g-line) and a third Petzval surface PS3 for λ=405 nm (h-line). In the exemplary embodiment the design of the projection objective is configured such that the Petzval surface of the intermediate wavelength λ=405 nm is essentially planar and coincides with the planar image surface IS of the projection objective (where the planar radiation entry side of the substrate is arranged in a lithographic process). Under these conditions, the Petzval surface PS1 for the relatively shorter wavelength (i-line) is curved inwardly (concave towards the projection objective, i.e. undercorrected), whereas the Petzval surface PS2 of the greater wavelength (g-line) has the opposite sense of curvature.

Figure 2A:
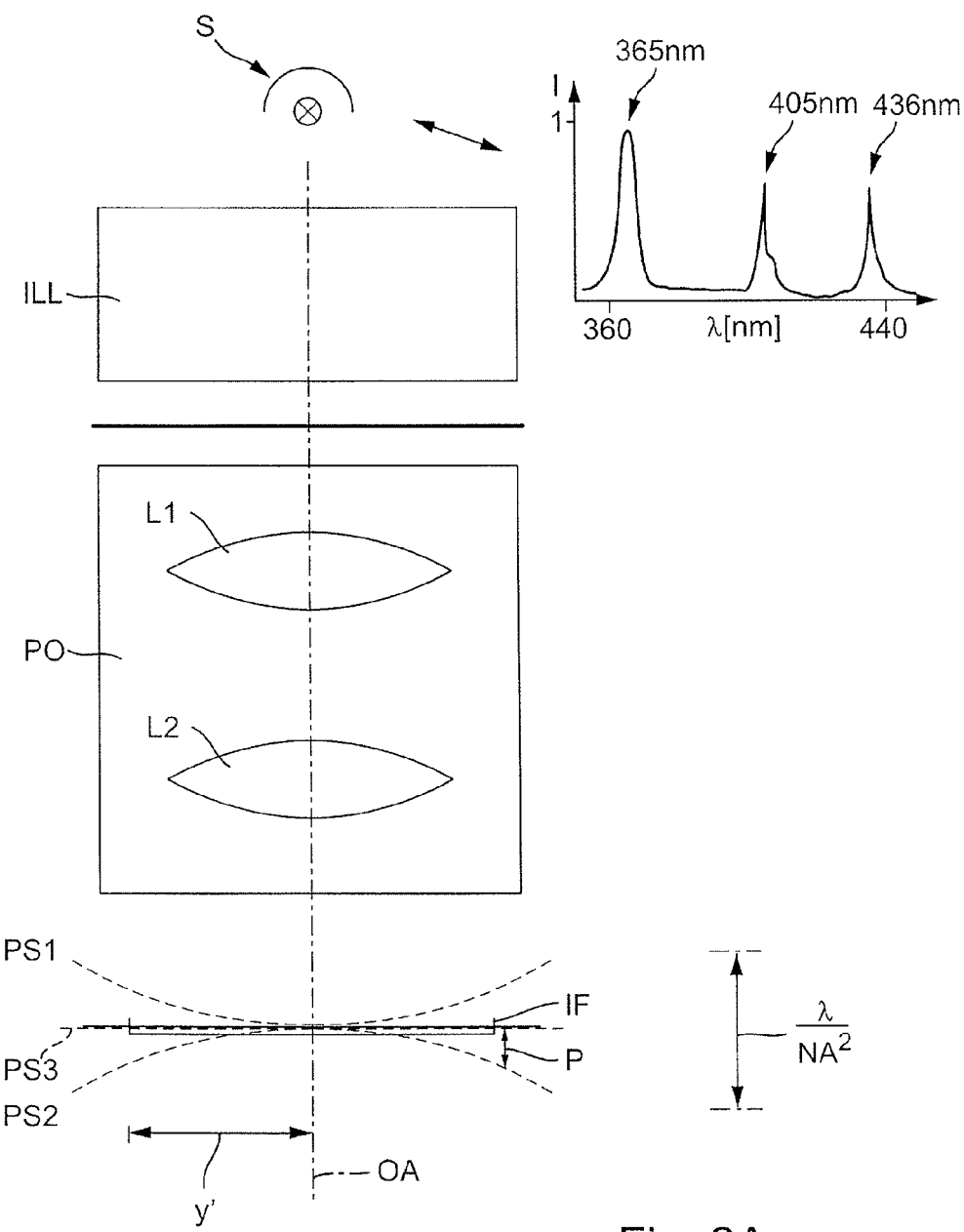
FIG. 2 shows a schematic drawing of a projection exposure apparatus with a mercury vapor radiation source and a chromatically corrected projection objective in FIG. 2A, different radiation spectra in FIGS. 2B and 2C, and an illustration related to the image field size and shape in FIG. 2D.

In the exemplary system of FIG. 2A, the Petzval surfaces of all three wavelengths essentially coincide with the axial position of the image surface IS on the optical axis OA. This corresponds to a correction status where the axial chromatic aberration (AX) is essentially corrected for each of the three wavelengths. Objectives of this type are sometimes referred to as systems having three common focii in the design wavelength band, or as apochromatic systems. However, the situation is different for field points at the outer edges of the effective image field IF corresponding to field points having a maximum image field height y'. Due to the bending of the Petzval surfaces, a longitudinal departure p (also denoted as sag) of the Petzval surface (measured parallel to the optical axis) for each of the largest and smallest wavelength is given at the edge field point. The longitudinal departure p effectively corresponds to a defocus at the outer edge of the image field IF from the planar image surface IS, which is a reference surface extending perpendicular to the optical axis in the image space. The magnitude of the departure p is given in equation (4) above. It may be seen qualitatively from FIG. 2A that such longitudinal departure may cause the image quality to deteriorate in regions close to the outer edges of an extended image field since the Petzval surfaces of different wavelength no longer coincide. A significant loss of contrast or a blurred image may therefore result in regions further a part from the optical axis, which effect becomes worse the larger image field size (characterized by the maximum image field height Y') becomes. On the other hand, if the chromatic variation of the image field curvature is actively controlled by appropriate technical measures within the projection objective, an image with sufficient quality in the entire image field IF may be obtained. Embodiments may be optimized in this regard by providing that the longitudinal departure p between the relevant Petzval surfaces corresponding to the wavelength used in the projection radiation is less than the Rayleigh unit $RU=\lambda/NA^2$ for all field points in the image field IF. Specifically, where all relevant Petzval surfaces lie within the region of the depth of focus DOF (which is proportional to RU) the image quality will normally be sufficient for all field points in the image field IF to allow diffraction limited exposure.

Note that FIG. 2A is purely schematic and not to scale for any of the features discussed in connection with FIG. 2A.

Figure 2B:
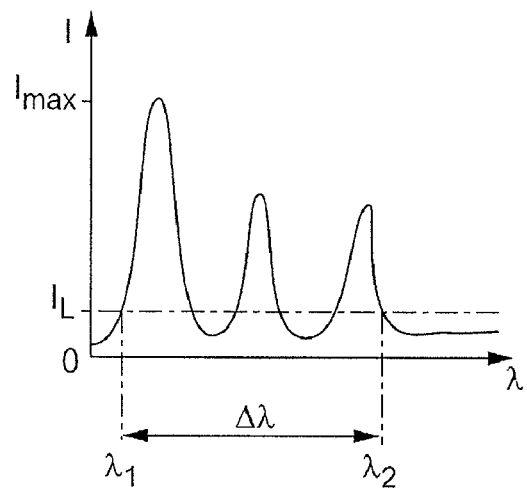

The meaning of some of the terms used in this application, such as the term "wavelength difference Δλ" and "maximum image field height y'" will now be explained in more detail in connection with FIGS. 2B, 2C and 2D. FIG. 2B shows schematically the dependence of the intensity I of radiation source on the wavelength λ in a region where three defined spectral lines occur within the spectrum. The three spectral lines may correspond to the mercury g-, h- and i-lines, for example. The spectral line arranged at the lower end of the spectrum in the example has the maximum value $I_{MAX}$ of intensity of the considered spectral range. In order to define the corresponding wavelength difference Δλ the lower limit of the spectral band, i.e. the first wavelength $\lambda_1$, may be defined as the wavelength where the intensity first exceeds a lower intensity limit $I_L$ when coming from the smaller wavelength, and the upper limit of the wavelength band may be defined as the second wavelength $\lambda_2$ where the intensity falls below the lower limit $I_L$ at wavelength larger than the wavelength corresponding to the spectral line on the upper end of the group of spectral lines. The lower limit of intensity, $I_L$ may be selected such that the condition $I_L=0.1\,I_{MAX}$ is fulfilled. In the case of the mercury g-, h- and l-lines the wavelength difference Δλ is larger than 70 nm according to this definition. It might be useful to block other spectral lines around the considered wavelength band with appropriate filters or other means.

Figure 2C:
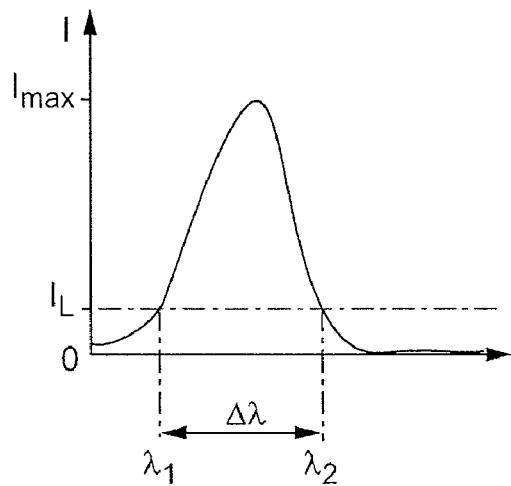

A similar definition of the wavelength difference Δλ may be applied in a wavelength region including only one spectral line, as schematically illustrated in FIG. 2C. The single spectral line may be the mercury i-line, for example. Where a laser radiation source is used, the wavelength of the maximum value of intensity, $I_{MAX}$, of the single spectral line may correspond to the nominal operating wavelength of the laser radiation source such, as about 193 nm for a ArF laser, for example. It is evident that a corresponding value for the wavelength difference Δλ becomes smaller where the radiation source is provided with specific means to narrow the natural bandwidth of the radiation source. For example, in case of using a mercury i-line, interference filters or the like may be used to narrow the natural band width of the mercury i-line. In the case of laser radiation sources, band width narrowing apparatus with relatively complex structure may be used to narrow the natural bandwidth of the laser.

Conditions on the image-side of the objective are now explained in connection with FIG. 2D. In embodiments of objectives intended to be used in a microlithographic process, a relatively large image field size is generally desired. For the purpose of this application the image field size may be characterized by a maximum image field height y', which corresponds to the radius of the (circular) "design image field" of the objective. The design image field $IF_D$ includes all field points of the image surface for which the imaging fidelity of the objective is sufficiently good for the intended lithographic process. With other words: all imaging aberrations are corrected sufficiently for the intended application within zones having radial coordinates equal to or smaller than the maximum image field height y', whereas one or more aberrations may be higher than a required threshold value for field points outside the design image field $IF_D$.

In general, not all field points within the design image field $IF_D$ are used for a lithographic process. Instead, exposure is only performed using field points lying within an effective image field IF, which should be sufficiently large in size to allow reasonably sized substrates to be exposed in a lithographic process. In many projection exposure systems, particularly those designed for a scanning operation, a slit-shaped effective image field IF is used and a pattern to be imaged as well as the substrate to be exposed are synchronously moved parallel to a scanning direction during a projecting step, the scanning direction corresponding to the y direction in the embodiment of FIG. 1. FIG. 2D shows three examples of effective image fields IF1, IF2 and IF3 which may be utilized in connection with embodiments of catadioptric projection objectives as discussed here. The size of an effective image field may generally be described in terms of a length A parallel to the scanning direction and a width B>A perpendicular to the scanning direction, thereby defining an aspect ratio AR=B/A>1. In many embodiments the aspect ratio may be in the range from 2:1 to 10:1, for example.

The effective image field must fit into the design image field $IF_D$ in order to include only field points for which the objective is sufficiently corrected and for which no vignetting occurs. There are various ways to fit an effective image field into a design image field depending on the design of a catadioptric objective. In some embodiments an on-axis image field (image field centred about the optical axis) may be used. Centred image fields may be used for example in systems having a central pupil obscuration (compare FIG. 4 or 11, for example) or in systems having a physical beam splitter. Third effective image field IF3 having length A3 and width B3 is one example of a centred effective image field fitting into the design image field $IF_D$. In some embodiments an effective image field having all field points outside the optical axis (so-called off-axis field) must be used in order to avoid vignetting. First effective image field IF1 is an example of a rectangular off-axis effective image field having length A1 and width B1. In some embodiments, effective image fields with an arcuate shape (sometimes noted as annular field or ring field) such as second effective image field IF2 are used. Note that the first and second effective image fields, both situated entirely outside of and at a radial distance from the optical axis OA, have same length A1, A2 and width B1, B2, respectively. It is evident from FIG. 2D that the useful dimensions of an effective image field used for an exposure process may be larger the larger the maximum image field height Y' (also denoted as image field semidiameter) is.

A number of embodiments capable of obtaining relatively small values for the chromatic variation of the Petzval sum will now be described in detail.

FIG. 3 shows a first embodiment of a catadioptric projection objective 300 designed for primary UV radiation including three mercury lines at about 365 nm (i-line), about 405 nm (h-line) and about 436 nm (g-line), i.e. an operating wavelength band with wavelengths spaced apart by at least a wavelength difference $\Delta\lambda$=71 nm. Given a demagnifying imaging scale of 4:1 ($\beta$=−0.25) the projection objective is telecentric on the object side and on the image side has an image-side numerical aperture NA=0.5. The image field size is 26 mm by 5.5 mm. The specification is given in tables 3, 3A.

Projection objective 300 is designed to project an image of a pattern on a reticle arranged in the planar object surface OS (object plane) into the planar image surface IS (image plane) on a reduced scale, for example, 4:1, while creating exactly two real intermediate images IMI1, IMI2. The rectangular effective object field OF and image field IF are off-axis, i.e. entirely outside the optical axis OA. A first refractive objective part OP1 is designed for imaging the pattern provided in the object surface into the first intermediate image IMI1. A second, catadioptric (refractive/reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

Projection objective 300 is an example of a "concatenated" projection objective having a plurality of cascaded objective parts which are each configured as imaging systems and are linked via intermediate images, the image (intermediate image) generated by a preceding imaging system in the radiation path serving as object for the succeeding imaging system in the radiation path. The succeeding imaging system can generate a further intermediate image (as in the case of the second objective part OP2) or forms the last imaging system of the projection objective, which generates the "final" image field in the image plane of the projection objective (like the third objective part OP3). Systems of the type shown in FIG. 3 are sometimes referred to as R-C-R system, where "R" denotes a refractive imaging system and "C" denotes a catadioptric (or catoptric) imaging system.

The path of the chief ray CR of an outer field point of the off-axis object field OF is drawn bold in FIG. 3 in order to facilitate following the beam path of the projection beam. For the purpose of this application, the term "chief ray" (also known as principal ray) denotes a ray running from an outermost field point (farthest away from the optical axis) of the effectively used object field OF to the center of the entrance pupil. Due to the rotational symmetry of the system the chief ray may be chosen from an equivalent field point in the meridional plane as shown in the figures for demonstration purposes. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective object field is used. The chief ray and marginal ray are chosen to characterize optical properties of the projection objectives. The radial distance between such selected rays and the optical axis at a given axial position are denoted as "chief ray height" (CRH) and "marginal ray height" (MRH), respectively. In so far as reference is made to a "marginal ray height" (MRH) or a "chief ray height" (CRH) in this application, this is taken to mean the paraxial marginal ray height and the paraxial chief ray height.

Three mutually conjugated pupil surfaces P1, P2 and P3 are formed at positions where the chief ray CR intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a single concave mirror CM situated at the second pupil surface P2. A first planar folding mirror FM1 is arranged optically close to the first intermediate image IMI1 at an angle of 45° to the optical axis OA such that it reflects the radiation coming from the object surface in the direction of the concave mirror CM. A second folding mirror FM2, having a planar mirror surface aligned at right angles to the planar mirror surface of the first folding mirror, reflects the radiation coming from the concave mirror CM in the direction of the image surface, which is parallel to the object surface. The folding mirrors FM1, FM2 are each located in the optical vicinity of, but at a small distance from the closest intermediate image. A double pass region where the radiation passes twice in opposite directions is thereby formed geometrically between the deflecting mirrors FM1, FM2 and the concave mirror CM. A single positive lens L2-1 is arranged in the double pass region geometrically close to the folding mirrors FM1, FM2 and optically close to both the first and second intermediate images, thereby acting as a positive field lens. A negative group NG having exactly one negative lens L2-2 is arranged in a region with large marginal ray height near the concave mirror and coaxial with the concave mirror such that the radiation passes twice in opposite directions through the negative group. No optical element is arranged between the negative group and the concave mirror.

As a broadband radiation source is used, the projection objective should be capable of reducing the chromatic aberrations to an extent enabling a polychromatic imaging with sufficient quality in the entire image field for the lithographic application. For example, it is necessary to correct the primary chromatic aberrations such as the longitudinal chromatic aberration (AX) and the chromatic magnification aberration (LAT). The correction of these chromatic aberrations is largely influenced by selecting approriate diameters the concave mirror CM and the diverging lens L2-2 that is passed through twice upstream of the concave mirror and also the diameters of the lenses in the rear, third objective part near the image. These are important for the correction of the longitudinal chromatic aberration. The chromatic magnification aberration LAT is substantially influenced by the refractive power distribution of the lenses upstream and downstream of the pupil positions and by the skilful positioning of the lenses in relation to the chief ray heights.

The chromatic overcorrection required in an overall system having positive refractive power takes place predominantly in the region of the negative group NG which directly precedes the concave mirror CM of the second objective part OP2. In the embodiment the negative group is dimensioned with regard to diameter and refractive power such that the sum of overcorrecting contributions to the chromatic correction of axial color essentially balances the sum of the undercorrecting contributions of the first objective part OP1, which serves as relay system, and of the refractive third objective part OP3, which serves as focusing system.

Options for correcting the chromatic variation of image field curvature will now be described in detail. The embodiment includes a single concave mirror CM combined with a negative group NG (Schupmann achromat) to primarily correct primary chromatic aberrations such as axial colour (AX) and lateral colour (LAT). A concave mirror provides an overcorrecting contribution to Petzval sum, therefore concave mirrors are comparable to negative lenses in this respect. The dioptric components, such as lenses, contribute an undercorrecting effect in order to obtain an essentially flat image. In general, the magnitude of the undercorrecting effect increases as the wavelength decreases. As outlined above, reflective components, such as the concave mirror CM, do not contribute to a variation of image field curvature. Therefore, one means for effectively reducing a variation of Petzval sum in a catadioptric objective containing at least one concave mirror is to provide at least one overcorrecting dioptric (refractive) optical element made from material having substantially higher dispersion (smaller Abbe number) than other refractive optical elements in the objective. In a situation where different wavelengths from a broad wavelength band are to be used for the imaging such overcorrecting dioptric element (or elements) made from a relatively high dispersion material (relative flint material) may contribute in an overcorrecting fashion to the Petzval sum. Where the magnitude of dispersion (or Abbe number) and the refractive power of the overcorrecting element or elements is selected properly, such overcorrecting element or elements are capable of effectively reducing a chromatic variation of image field curvature to such a degree that the imaging performance is no longer limited by the chromatic variation of the Petzval sum.

Figure 3A:
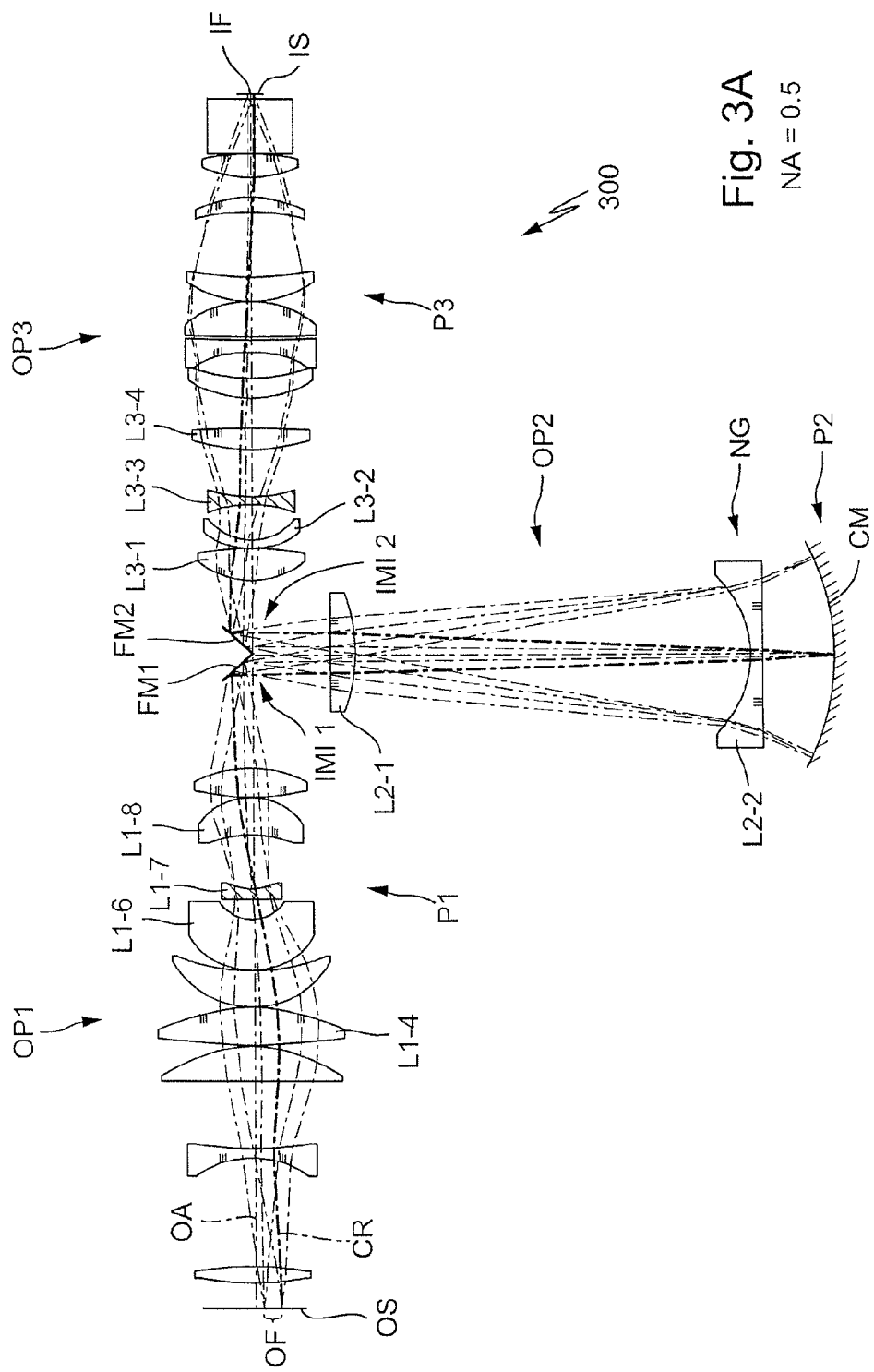
FIG. 3 shows a first embodiment of a catadioptric projection objective in FIG. 3A and diagrams representing optical properties of the embodiment in FIGS. 3B and 3C.

In the embodiment of FIG. 3A all lenses, with the exception of two relatively small negative lenses L1-7 and L3-3 in the first and third objective part OP1, OP3, respectively, are made from the same material, namely synthetic fused silica ($SiO_2$). The two relatively small (small diameter) negative lenses L1-7 and L3-3 are made of a special glass provided by SCHOTT, Mainz, Germany sold under the designation LLF1. In this material combination, fused silica is a typical representative of a glass having relatively low dispersion (relatively high Abbe number, crown glass), while LLF1 is a typical representative of a glass having relatively high dispersion (relatively low Abbe number, flint glass). Table A below summarizes some relevant properties, such as refractive index and Abbe number, for various transparent optical materials (left column) which may be used to from lenses in optical systems in the ultraviolet spectrum range (wavelength in top row).

TABLE A

|  | 192.999 | 193.000 | 193.001 | 360.000 | 365.500 | 370.000 | 405.000 | 436.000 | ν (Abbe) |
| --- | --- | --- | --- | --- | --- | --- | --- | --- | --- |
| SILUV | 1.560972 | 1.560970 | 1.560969 | 1.475299 | 1.474477 | 1.473834 | 1.469595 | 1.466705 | 60.4 |
| CAFUV | 1.501396 | 1.501395 | 1.501394 | 1.445430 | 1.444863 | 1.444419 | 1.441484 | 1.439477 | 82.0 |
| FK5 |  |  |  | 1.504780 | 1.503934 | 1.503272 | 1.498902 | 1.495918 | 62.2 |
| LF5 |  |  |  | 1.621262 | 1.619068 | 1.617371 | 1.606590 | 1.599610 | 31.2 |
| LLF1 |  |  |  | 1.580929 | 1.579164 | 1.577796 | 1.569035 | 1.563301 | 35.9 |

The designation "SILUV" represents fused silica, the designation "CAFUV" represents calcium fluoride ($CaF_2$) and the designations FK5, LF5, and LLF1 represent special optical glasses sold by SCHOTT, Mainz, Germany. Similar or comparable glasses with similar optical properties provided by other sources, such as OHARA, may also be used. While fused silica and calcium fluoride are essentially free of absorption down to about 193 nm and below, the special glasses FK5, LF5 and LLF1 are predominantly used for wavelengths λ>300 nm, particularly for optical systems for the mercury i-line. The right column lists the Abbe numbers ν for the materials, calculated for the wavelength band including the mercury g-, h- and i-line according to the following equation:

$$v = \frac{n_{405} - 1}{n_{365.5} - n_{436}} \quad (10)$$

where $n_{405}$, $n_{365.5}$ and $n_{436}$ are the refractive indices of the material at 405 nm, 365 nm and 436 nm, respectively. It is evident from the Abbe numbers in table A that fused silica is the relative crown material (ν=60.4), whereas LLF1 is the relative flint material (ν=35.9) and that the Abbe number difference, Δν, is relatively large (Δν=24.5). Since the majority of lenses (20 out of 22 lenses) are made from fused silica, the median Abbe number corresponds to the Abbe number of fused silica (ν=60.4).

It has been found useful that the negative lenses of relatively high dispersion material predominantly dedicated to correcting chromatic variation of Petzval sum should be relatively small in diameter and should have relatively large refractive power. This may be understood as follows. As evident from equations (3) (3a) (3b) (3d) above, the Petzval sum is a purely geometrical property determined by the respective radii of curvature of the optical surfaces within the optical system. The radius of curvature of a lens or a mirror, however, determines the refractive (or reflective) optical power of an optical surface. Therefore, a correlation exists between the radii of curvature and the optical power. As mentioned above, one or more negative lenses made from a material with relatively high dispersion have been found to be effective to correct chromatic variation of Petzval sum. Therefore, one or more negative lenses made of relative flint material would be desirable. On the other hand, overall positive optical power is required for an imaging optical system, such as a projection objective useful for microlithography, to form an image of an object. In order to keep the optical system simple, negative refractive power should be avoided as much as possible within the objective. A reasonable compromise between those conflicting requirements may be obtained if the negative refractive power in high dispersion material (useful for correcting variation of chromatic variation of Petzval sum) is provided by one or more negative lenses having relatively small optically free diameter. Where the optically free diameter of a negative lens is relatively small, the negative lens may have strong negative refractive power (relatively small radii of curvature of the optical surface) while at the same time the contribution to overall refractive power of the optical system may be kept relatively small due to the fact that the relatively small negative lens is only effective in a region of relatively small marginal ray height. With other words: where a negative lens with strong negative power is provided in a region of small marginal ray height (corresponding to a relatively small utilized free diameter of the negative lens), such negative lens may have a strong impact on the correction of chromatic variation of Petzval sum, while at the same time an undesirable influence on the imaging performed by the overall optical system may be kept relatively small.

The design of the embodiment in FIG. 3A uses this basic concept. Negative lens L1-7 having almost flat entry surface and concave exit surface is placed very close to the first pupil surface P1 of the first objective part OP1 in a region where the diameter of the radiation beam forms a local minimum (a so-called waist) between a group of positive lenses upstream of the waist and a group of positive lenses downstream of the waist. The optically free diameter of lens L1-7 is significantly smaller (more than 10% or more than 20% or more than 30% smaller) than the optically free diameter of the positive lenses L1-6 upstream and L1-8 downstream of the negative lens. The optically free diameter of negative lens L1-7 is less than 50% or even less than 40% of the diameter of the largest lenses of the optical system, such as biconvex positive lens L1-4 or negative lens L2-2 forming negative group NG. The marginal ray height at negative lens L1-7 is only about 25% of the maximum marginal ray height attained at the concave mirror CM. Comparable conditions are obeyed for biconcave negative lens L3-3 provided in the third objective part OP3 between the second intermediate image IMI2 and a third pupil surface P3 in a region of a small waist in the radiation beam between negative meniscus lens L3-2 upstream and biconvex positive lens L3-4 downstream of negative lens L3-3. Each of the lenses upstream and downstream of the flint material negative lens L3-3 have larger optically free diameter than the negative lens, and the marginal ray height at the negative lens is only about 35% of the marginal ray height of the concave mirror CM.

Since only a small fraction (less than 10%, namely two out of twenty-two lenses) are made from a second material with relatively high dispersion, only a small amount of a second material is used, which is advantageous in terms of costs and manufacturing.

According to the teaching outlined above, an effective contribution to correction of chromatic variation of Petzval sum may also be obtained by providing at least one negative lens from relative flint material in another position with relatively small marginal ray height, such as optically close to an intermediate image or optically close to the object or image surface, i.e. in a manner of a field lens. For example, a small negative lens made from relative flint material may be placed immediately upstream of the first intermediate image and/or immediately downstream of the second intermediate image. Such lenses may be provided alternatively or in addition to small negative lenses of flint material at other optical positions within in the optical system.

Alternatively, or in addition, the general concept may be used in such a way that one or more positive lenses made from a relative crown material (smaller dispersion than the majority of the other lenses) is provided in a region of relatively small marginal ray height, such as near a field surface. For example, in a projection objective having most or all lenses made from fused silica, a positive lens made from calcium fluoride may be placed optically near to one of the intermediate images IMI1 or IMI2, for example. For example, biconvex positive lens L3-1 immediately downstream of the second intermediate image IMI2 may be made from calcium fluoride instead of fused silica to support correction of chromatic variation of image field curvature.

Figure 3B:
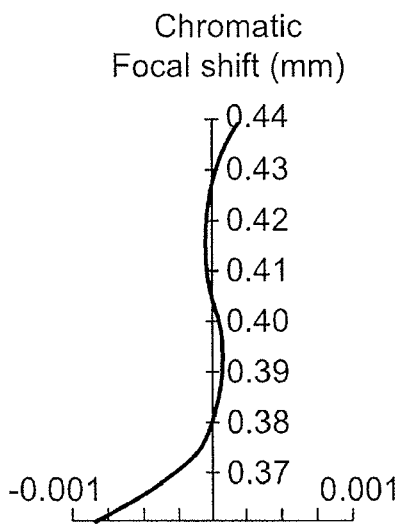
Figure 3C:
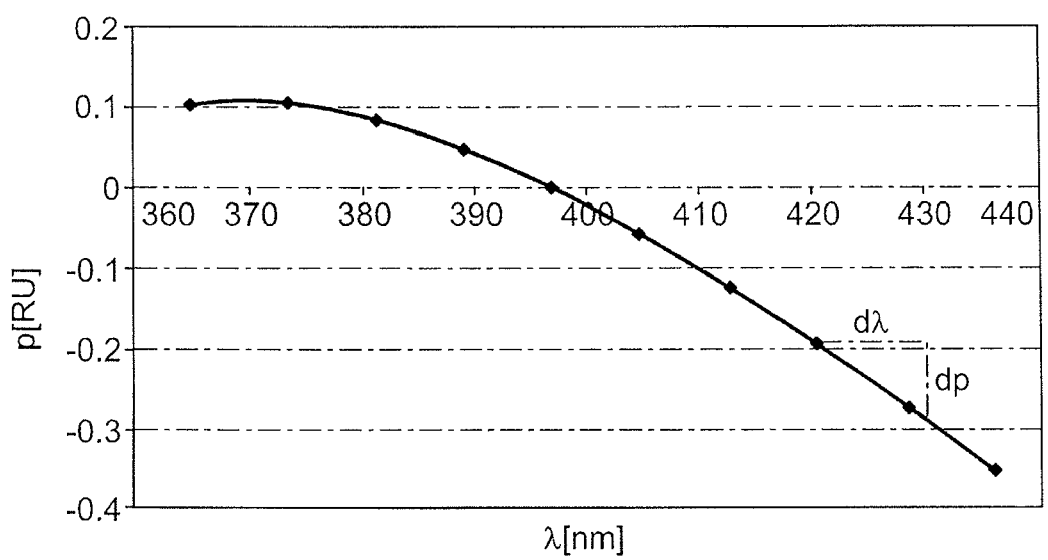

Some relevant optical properties of the first embodiment in FIG. 3A are shown in FIGS. 3B and 3C. The diagram of FIG. 3B shows the chromatic focal shift, i.e. the position of the focal plane with respect to the reference image plane for different wavelengths between 360 nm and 440 nm. The curve exhibits three-zero-crossings at about 380 nm, 405 nm and 428 nm, essentially corresponding to the mercury i-, h- and g-lines, respectively. With other words: the optical system of FIG. 3A has three common foci in the wavelength band including the mercury i-, g- and h-lines indicating that axial chromatic aberration (AX) is corrected for all mercury lines (apochromatic system).

FIG. 3C shows a diagram representing the chromatic variation of image field curvature, where the abscissa represents the wavelengths $\lambda$ and the ordinate represents the longitudinal departure p of the Petzval surface from an ideal image surface at an edge field point of the image field at maximum image height y' in units of the Rayleigh unit $RU=\lambda/NA^2$. It can be seen that the rate of change of the longitudinal departure p with wavelength, $dp/d\lambda$, is about 0.0085 RU/nm or less over the entire wavelength band between about 365 nm and about 440 nm. As a consequence, the Petzval surfaces for all three wavelengths provided by the mercury arc radiation source are well within the depths of focus of the optical system from the center of the image field around the optical axis up to the outer edges of the image field, thereby allowing high contrast imaging with a broadband radiation source (compare FIG. 2).

FIG. 4A shows a second embodiment of a catadioptric projection objective 400 designed for primary UV radiation including three mercury lines at about 365 nm (i-line), about 405 nm (h-line) and about 436 nm (g-line), i.e. an operating wavelength band with wavelengths spaced apart by at least a wavelength difference $\Delta\lambda=71$ nm. (NA=0.16). The projection objective is a unit magnification system (imaging scale $|\beta|=1$) with a construction symmetric to a symmetry plane coinciding with pupil surface P2. The specification is given in Tables 4, 4A.

Projection objective 400 is designed to project an image of a pattern from the planar object surface OS to the planar image surface IS while creating exactly two intermediate images IMI1, IMI2. An image field centred about the optical axis OA (on-axis field) is imaged with a central pupil obscuration. A first refractive part OP1 generates the first intermediate image IMI1 with radiation from the object surface, a second, catadioptric objective part OP2 creates a second intermediate image IMI2 from the first intermediate image IMI1, and a refractive third objective part OP3 generates the final image from the second intermediate image IMI2 on the planar image surface IS. All optical elements are aligned along one straight optical axis (in-line system).

The second objective part includes a first concave mirror CM1 having a reflective surface facing the object surface and receiving radiation from the first intermediate image IMI1, and a second concave mirror CM2 having a reflective surface facing the image surface and receiving radiation reflected from the first concave mirror and reflecting such radiation towards the second intermediate image IMI2. Each of the concave mirrors has a central bore (hole or aperture) around the optical axis to allow the radiation coming from the first intermediate image IMI1 to enter the second objective part and to allow the radiation to exit the second objective part to from second intermediate image IMI2, respectively. Both intermediate images are formed in the region of the bores. A large diameter biconcave negative lens disposed symmetrically between the first and second concave mirrors CM1, CM2 forms a negative group NG optically close to the concave mirrors. Thin and essentially powerless meniscus lenses are disposed between the negative group NG and each of the concave mirrors CM1, CM2. Those lenses may be omitted in other embodiments.

A majority of lenses (more than 75%) are made of fused silica. Eight out of 31 lenses, indicated with hatching in FIG. 4A, are made from a second material with relatively high dispersion, namely LLF1.

Radiation from the object surface is transformed by the first objective part OP1 to form the first intermediate image, and then diverges through a negative group NG towards first concave mirror CM1, which collects radiation and reflects the radiation beam through the negative group NG towards the second concave mirror CM2, which converges radiation beam and reflects the radiation to pass a third time through a negative group NG prior to forming the second intermediate image IMI2. The radiation is then re-imaged by third objective part OP3 to form the final image in the image surface IS. Each of the concave mirrors CM1, CM2 is positioned optically close, but at the small distance from the second pupil surface P2 in a region of large marginal ray height. Negative group NG is positioned exactly in second pupil surface P2.

The combined action of the concave mirrors and the negative group NG in the region of large marginal ray heights close to the second pupil surface provides a major contribution to correction of axial chromatic aberration in a manner similar as described above in connection with the Schupmann achromat (concave mirror CM and negative group NG) in the first embodiment in FIG. 3A. FIG. 4B shows the effect on chromatic focal shift indicating that the projection objective is an apochromatic optical system capable to be operated at all three wavelengths (g-, h- and i-line) of the mercury lamp.

Correction of chromatic variation of image field curvature is primarily effected by the relatively high dispersion lenses L1-8 to L1-11 in first objective part (and symmetry related lenses in the third objective OP3). These groups of lenses include a biconcave negative lens L1-10 forming the smallest lens of that lens groups surrounded by relatively larger lenses of flint material. The negative lens L1-10 is arranged in a waist region with local minimum of radiation beam diameter at a position with a marginal ray height which is only about half of the marginal ray height in the positive belly upstream of the negative lens and less than about 30% of the marginal ray height in the region of negative group NG or the concave mirrors CM1, CM2. Although the group of relative flint material lenses includes one positive lens L1-9, the overall refractive power of the group of lenses is negative allowing to transform a convergent beam provided by lenses upstream of the group into a diverging beam entering a thick biconvex positive lens L1-12 downstream of the lens group.

This exemplary embodiment shows that the general effect described in connection with the first embodiment may also be obtained by distributing the desired negative refractive power in the region of small marginal ray heights over two or more relatively small lenses with overall negative refractive power. Another contribution to correcting variation of image field curvature may be obtained if the negative lens L1-2 in a first minor waist region close to the object surface OS would be made of a relatively high dispersion material, such as LLF1 instead of fused silica:

The variation of image field curvature with wavelength may be characterized by $dp/d\lambda = 0.0121$ RU/nm.

A third embodiment of catadioptric projection objective 500 having a general layout similar to the projection objective 300 of FIG. 3A is shown in FIG. 5A. The general design with regard to the folding of the optical axis with folding mirrors FM1, FM2 and a catadioptric group with a single concave mirror CM and a negative group NG immediately in front of the concave mirror and passed twice by radiation is similar to the embodiment of FIG. 3A, therefore, reference is made to that corresponding description.

Projection objective 500 is designed for primary UV radiation from the very deep ultraviolet (VUV) spectral range at about 193 nm, which may be provided by a ArF excimer laser radiation source. Field size is 26 mm*5.5 mm and NA=1.0 in water immersion.

In the spectral region below about 200 nm only a few materials are sufficiently transparent to allow use as lens material in a projection objective. Specifically, synthetic fused silica and crystalline alkaline fluoride materials, such as barium fluoride or calcium fluoride ($CaF_2$) may be used as lens materials. A combination of fused silica (lenses without hatching) and calcium fluoride (lenses with hatching, appearing dark) is used in the projection objective 500. In this material combination, fused silica is the relative flint material (having larger dispersion and smaller Abbe number, and calcium fluoride is the relative crown material (see table A for general relationship, absolute values are different at 193 nm).

Figure 5B:
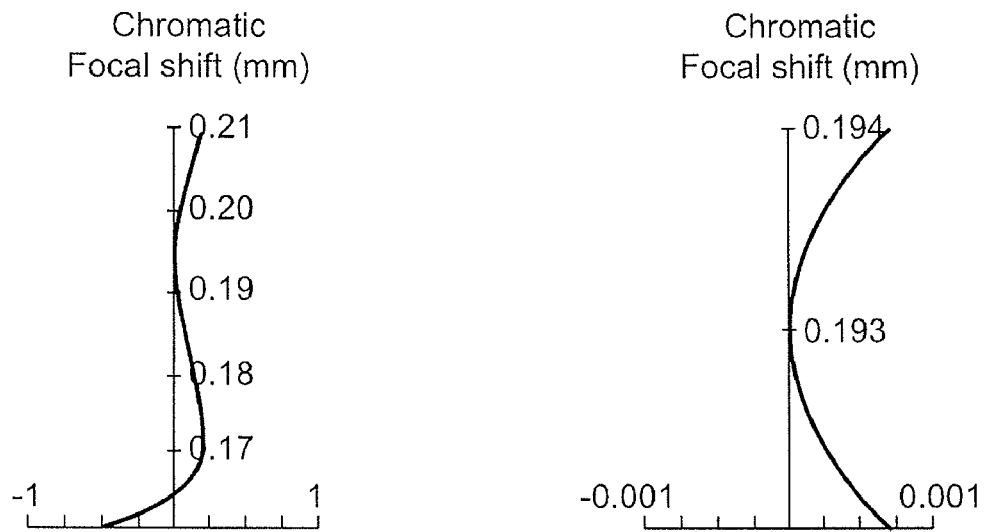
FIG. 5 shows a third embodiment of a catadioptric projection objective in FIG. 5A and diagrams representing optical properties of the embodiment in FIGS. 5B, 5C and 5D.
Figure 5C:
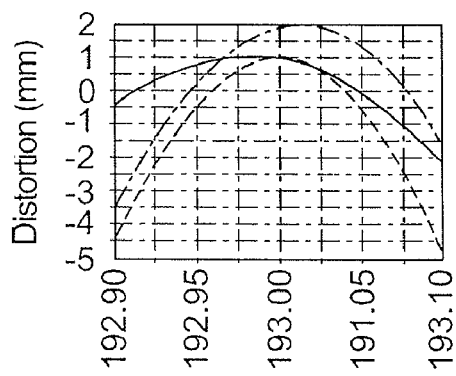
Figure 5D:
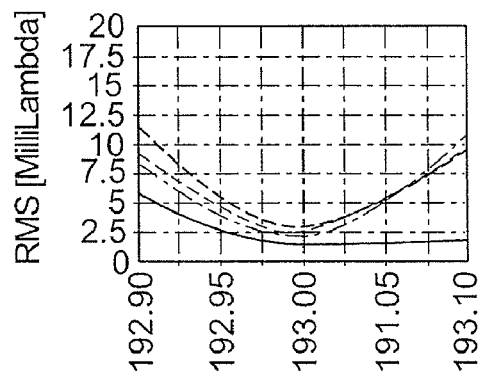

As evident from FIG. 5A, the material having the relatively smaller dispersion ($CaF_2$) is predominately used in positive lenses. Specifically positive lenses L1-10 and L1-11 immediately upstream of the first intermediate image IMI1, positive lens L2-1 close to the intermediate images in the second objective part OP2, and positive lens L3-1 being the first lens of the third objective part OP3 following the second intermediate image IMI2 are made of the relative crown material. On the other hand, the relative flint material is used in other lenses, including small negative lens L1-8 in a waist region near the first pupil surface P1 or negative lenses L3-2 and L3-3 near a waist in the third objective part OP3. The combined use of relative crown material and relative flint material contributes to correction of chromatic aberrations to improve bandwidth. As evident from FIG. 5B, a broad minimum of axial chromatic aberration is obtained around the central wavelength 193 nm. A corresponding bandwidth may be determined by evaluating the relation between the wavefront aberrations and the wavelength, as schematically shown in the diagram of FIG. 5D, where the root-mean-square (RMS) value of the wavefront error (in m$\lambda$) is presented as a function of wavelength λ. For the purpose of this application, a wavefront error less than 10 mλ is considered as defining a useful objective. Under this condition, each of the wavelength between about 192.91 and 193.09 may be used for forming the image. Defining the wavelength difference Δλ between the outer limits as the useful bandwidth, the bandwidth of the system is about Δλ=0.18 nm (about 180 picometers). A value dp/dλ=5.35 RU/nm is obtained for this embodiment, indicating that partial correction is obtained for the chromatic variation of image field curvature. This is basically due the fact that the difference in dispersion of available materials in VUV region limits the options for correcting those aberrations with purely dioptric means FIG. 5C shows the relatively small distortion.

The embodiments of projection objectives 600, 700, 800 and 900 in FIGS. 6A, 7A, 8A and 9A, respectively, may be used to demonstrate ways to influence the chromatic properties of projection objectives by using more than two different materials having different dispersion. The general layout of the systems is similar to those in FIGS. 3A and 5A, therefore reference is made to the corresponding description. The specifications are given in tables 6, 6A, 7, 7A, 8, 8A and 9, 9A, respectively.

Figure 6A:
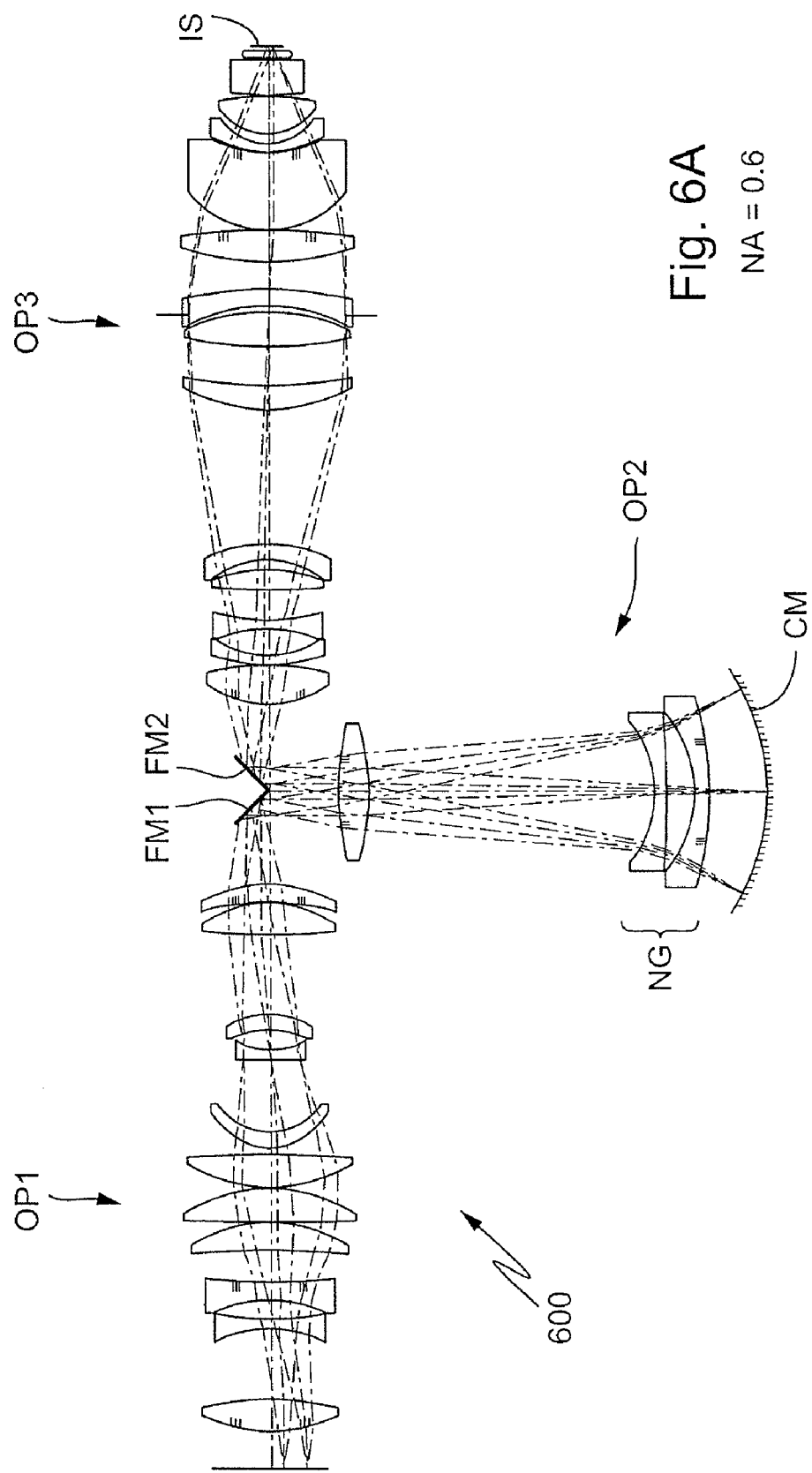
FIG. 6 shows a fourth embodiment of a catadioptric projection objective in FIG. 6A and diagrams representing optical properties of the embodiment in FIGS. 6B, 6C, 6D and 6E.
Figure 6B:
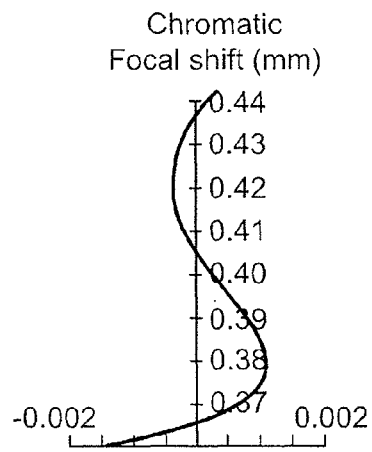
Figure 6C:
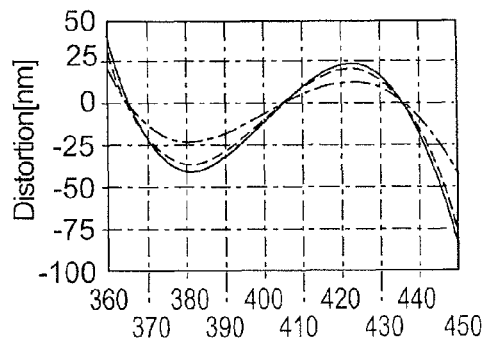
Figure 6D:
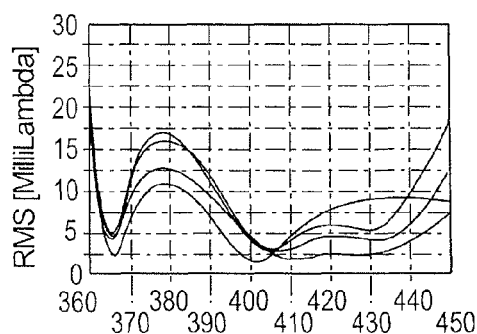
Figure 6E:
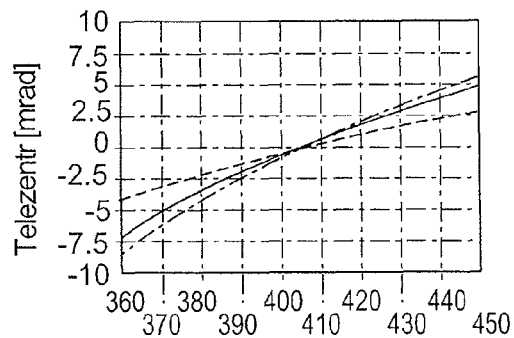

In the projection objective 600 of FIG. 6A (fourth embodiment) five different materials (fused silica, calcium fluoride, FK5, LF5 and LLF1, see table A) are used in combination to improve chromatic correction. An image-side numerical aperture NA=0.60 is obtained in an 26 mm*5.5 mm image field. The system is apochromatic, operating with almost no axial chromatic aberration for each of the spectral lines of the mercury lamp (see FIG. 6B). The distortion in the image field (FIG. 6C) and the wavefront error (FIG. 6D) are well corrected for each of the spectral lines. As evident from FIG. 6E, image-side telecentricity is well corrected for the central wavelength λ=405 nm. Deviations from perfect telecentricity occur for smaller wavelength (about −7.5 mrad for the i-line) and larger wavelength (about ±5 mrad for the g-line).

Projection objective 700 (fifth embodiment) may be understood as a variant of projection objective 600 since the number, types and distribution of lenses is rather similar to that embodiment. An image-side numerical aperture NA=0.60 is obtained in an 26 mm*5.5 mm image field. However, the system is designed to avoid use of calcium fluoride (which is relatively expensive) and use of special glass LLF1 to reduce the total number of materials used, thereby facilitating manufacturing. Consequently, only three different materials, namely fused silica, FK5 and LF5 are used for the lenses.

Figure 7B:
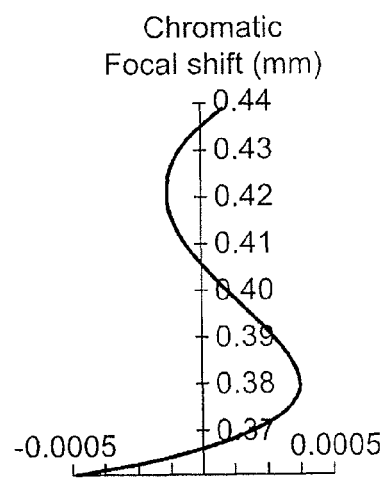
FIG. 7 shows a fifth embodiment of a catadioptric projection objective in FIG. 7A and diagrams representing optical properties of the embodiment in FIGS. 7B, 7C and 7D.
Figure 7C:
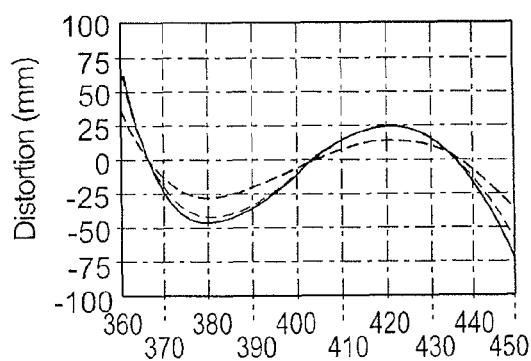
Figure 7D:
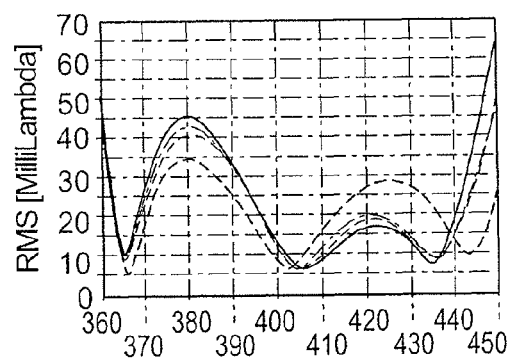

Apochromatic correction is still obtained (FIG. 7B), however, some sacrifice is made with respect to correction of distortion (FIG. 7C) and wavefront aberrations (FIG. 7D).

Figure 8A:
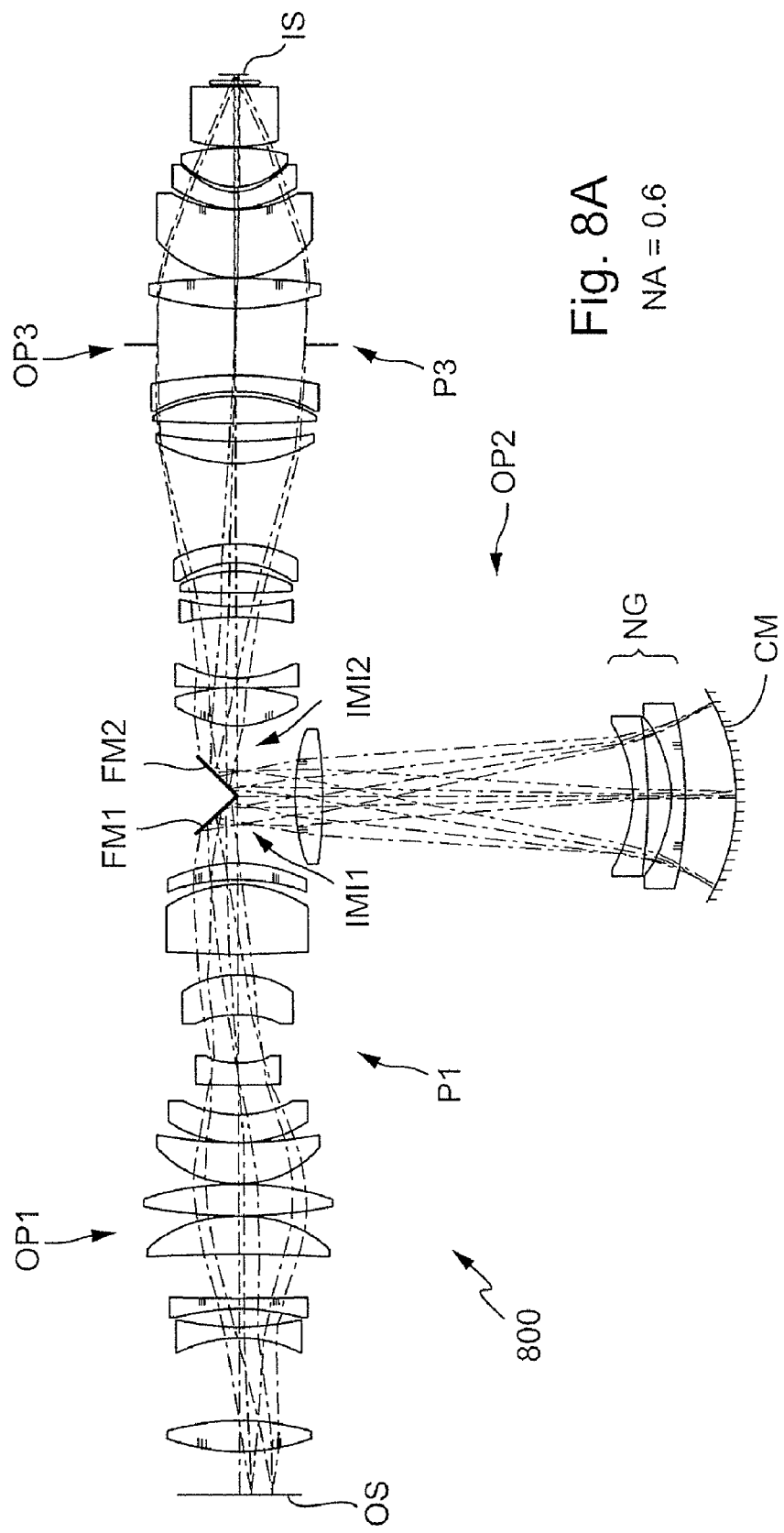
FIG. 8 shows a sixth embodiment of a catadioptric projection objective in FIG. 8A and diagrams representing optical properties of the embodiment in FIGS. 8B, 8C and 8D.
Figure 8B:
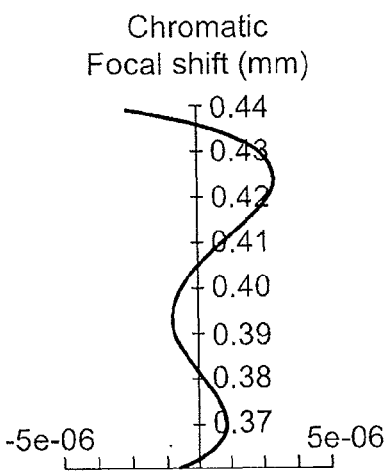
Figure 8C:
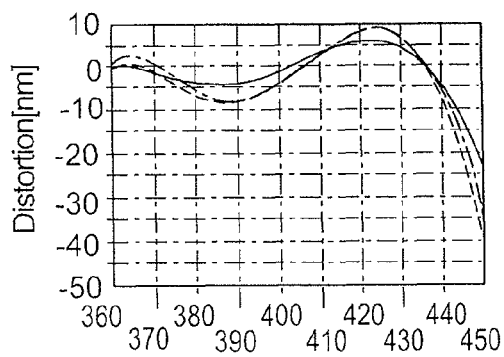
Figure 8D:
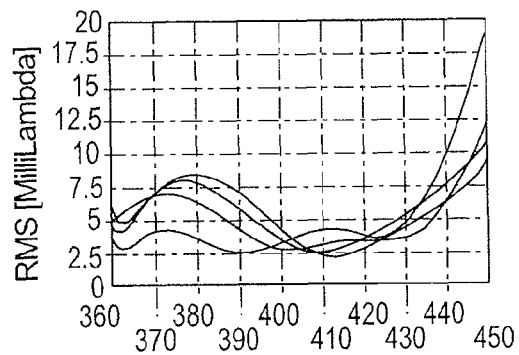

Projection objective 800 (sixth embodiment) in FIG. 8A is a variant providing improved bandwidth, which is enabled by using five different materials as listed in table A. An image-side numerical aperture NA=0.60 is obtained in an 26 mm*5.5 mm image field. The diagram of chromatic focal shift in FIG. 8B shows four zero-crossings at about 360 nm, 380 nm, 405 nm and 436 nm, indicating four common foci in the wavelength range covered by the mercury spectral lines. Distortion is very well corrected (FIG. 8C). A wavefront aberrations significantly smaller than 10 mλ rms is obtained for all wavelengths between 360 nm and 440 nm indicating that the projection objective may be modified to form a super-apochromtic projection objective for broadband application using a continuous spectral range including the mercury g-, h-, and i-lines.

Figure 9B:
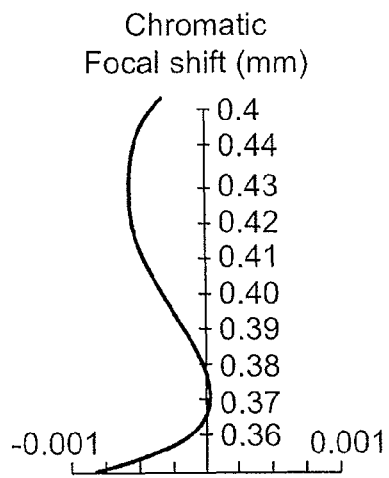
FIG. 9 shows a seventh embodiment of a catadioptric projection objective in FIG. 9A and diagrams representing optical properties of the embodiment in FIGS. 9B, 9C and 9D.
Figure 9C:
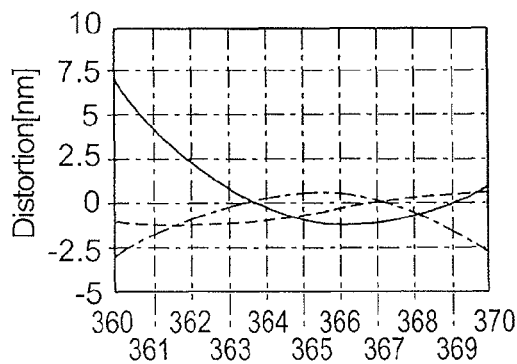
Figure 9D:
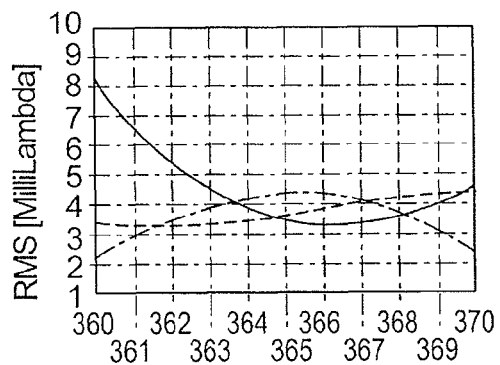

Projection objective 900 in FIG. 9A (seventh embodiment) is optimized for use with the mercury l-line only, but improved with respect to bandwidth around the central wavelength of the i-line. An image-side numerical aperture NA=0.80 is obtained in a 26 mm*5.5 mm image field. The projection objective allows to use a mercury vapour radiation source with reduced complexity of construction since the expenditure for filtering etc. may be reduced. As indicated by FIGS. 9C and 9D the optical system provides very good correction of distortion and wavefront error over a spectral range with overall bandwidth (wavelength difference between smallest and largest wavelength) of about 4 nm (365 nm±2 nm). Chromatic variation of image field curvature may be characterized by dp/dλ=0.036 RU/nm.

In each of the embodiments in FIGS. 5 to 9 the first objective part configured to image the pattern into a first intermediate image includes a sequence of consecutive lens groups having alternating refractive powers including a first lens group with a positive refractive power, a second lens group with negative refractive power immediately following the first lens group, a third lens group with positive refractive power immediately following the second lens group, a fourth lens group with negative refractive power immediately following the third lens group and a fourth lens group with positive refractive power immediately following the fourth lens group such that at least two separate waist regions are created where a beam diameter of radiation passing through the first objective part has a local minimum. The waists are denoted with reference numerals W1 and W2, respectively in FIG. 9. The waists are generally formed at or near a negative lens. The double waist structure in the first (relay) objective part supports Petzval sum correction by refractive means.

The projection objectives outlined in connection with the above embodiments each provide good correction of wavefront error and distortion as well as chromatic aberrations for the wavelength or wavelengths for which they are designed. Significant contributions to correction are made by the catadioptric group (including at least one concave mirror at or near to a pupil and a negative group close to the concave mirror) and the use of dioptric materials with different dispersion. No special emphasis was placed on the correction of the chromatic axial aberration of the pupil imaging. This aberration may cause a natural (undercorrected) chromatic variation of the focal length of the projection objective which, in turn, transforms to a chromatic variation the position of the entrance and exit pupil and therefore of telecentricity properties in systems with fixed position of the aperture stop. This is equivalent to an undercorrection of axial chromatic aberration for the pupil imaging which may be favourably corrected for at or close to the pupil positions of the pupil imaging, which correspond to regions close to the object surface, image surface or to intermediate image surfaces of the projection objective.

Projection objective 1000 (eighth embodiment) includes dioptric means specifically dedicated to correcting the chromatic axial aberration of the pupil imaging, thereby improving object-side telecentricity. An image-side numerical aperture NA=0.60 is obtained in an 26 mm*5.5 mm image field. Projection objective 1000 includes a first achromatic group AG1 immediately following the object surface in a region optically close to the object surface where the chief ray height is larger than the marginal ray height, and a second achromatic group AG2 optically close to the first and second intermediate images IMI1 and IMI2, i.e. optically close to another field surface optically conjugate to the object surface OS.

The first achromatic group AG1 includes biconvex positive lens L1-1 made of calcium fluoride, a negative meniscus lens L1-2 concave on the image-side and made of LF5, and a biconvex positive lens L1-3 made of fused silica. Achromatic group AG2 is formed by a biconvex positive lens L2-1 made of calcium fluoride, a negative meniscus lens L2-2 having a concave surface opposite to the positive lens L2-1 made of LF5, and a biconvex positive lens L2-3 made of calcium fluoride. LF5 is a relative flint material relative to both calcium fluoride and fused silica. Therefore, lenses L1-1 and L1-2 may be described as forming a lens doublet with a positive lens L1-1 made from a relative crown material, arranged directly adjacent to a negative lens L1-2 made from a relative flint material thereby creating a chromatic overcorrection of the axial chromatic aberration of the pupil imaging. Likewise the combination of lenses L1-2 and L1-3 may be described as a lens doublet having such relative relation of dispersion and refractive power.

Similarly, second achromatic group AG2 may be described as including two pairs of directly adjacent lenses, wherein one of the lenses is a positive lens from relative crown material, and the other lens is an negative lens from relative flint material.

Each of the achromatic groups AG1, AG2 is thereby effective to reduce the axial chromatic aberration. Due to the positioning of the achromatic lens groups AG1, AG2 close to field surfaces of projection objective, the effect is to reduce axial chromatic aberrations of the pupil imaging, which in turn in reduces telecentricity errors on the object-side.

Figure 10A:
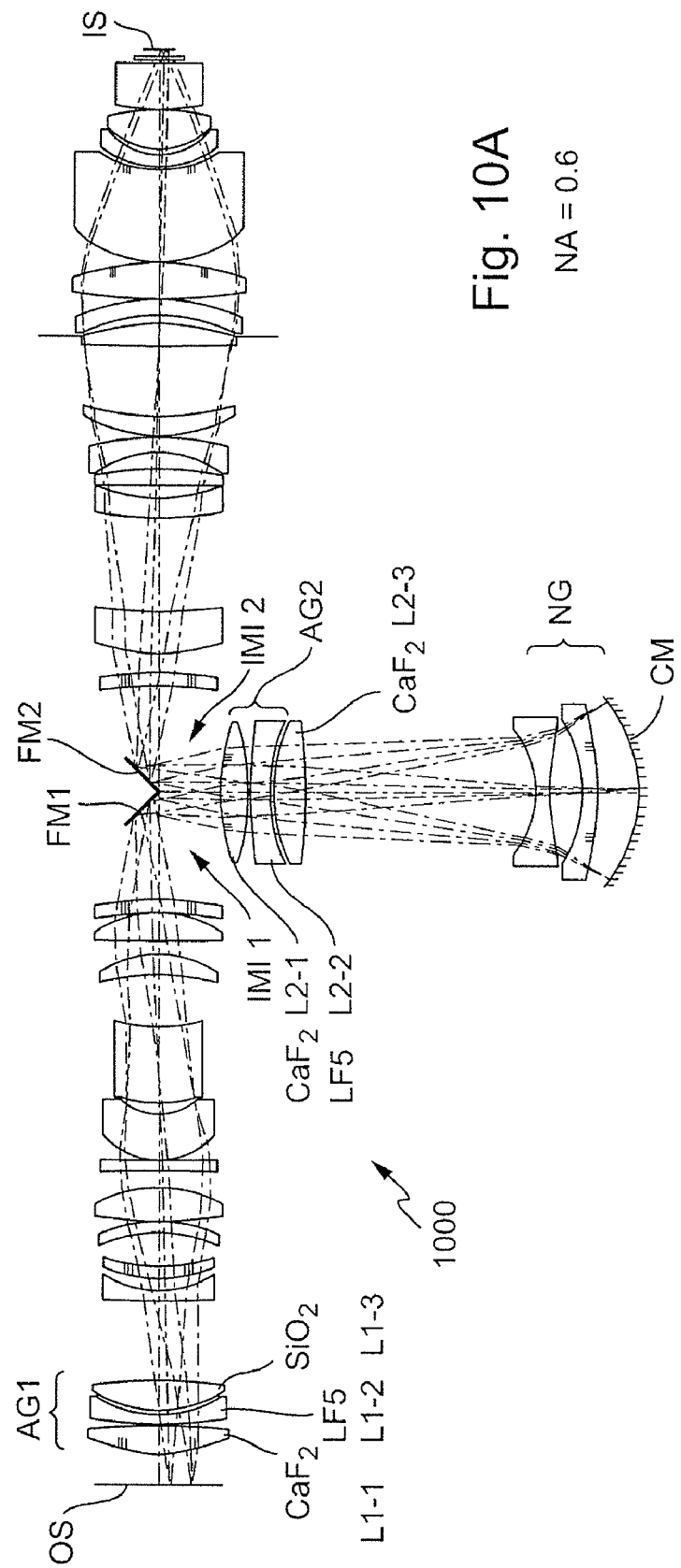
FIG. 10 shows an eighth embodiment of a catadioptric projection objective in FIG. 10A and diagrams representing optical properties of the embodiment in FIGS. 10B, 10O, 10D and 10E.
Figure 10B:
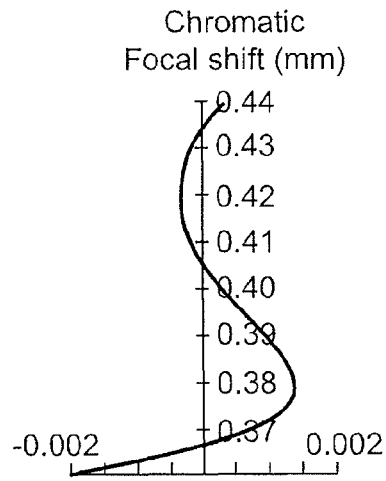
Figure 10C:
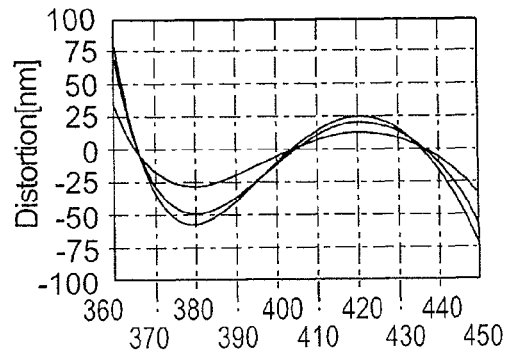
Figure 10D:
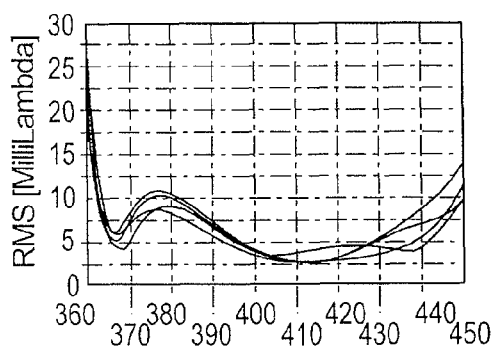
Figure 10E:
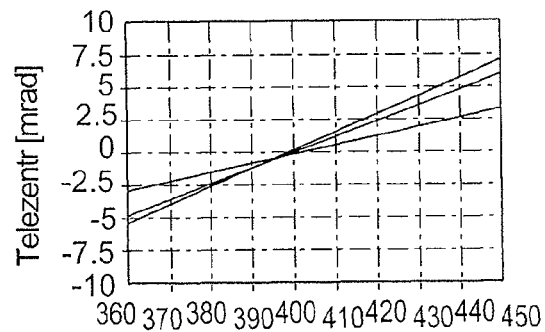

The effects on performance may be taken from FIG. 10B to FIG. 10E. Axial chromatic aberration in the image surface is corrected for three wavelengths around the considered mercury spectral lines. Distortion is minimized for each of the mercury spectral lines (FIG. 10C). Wavefront correction is significantly better than 10 nm for each of the spectral lines (FIG. 10D). Object-side telecentricity is perfect for about 405 nm and has an absolute value less about than 1.5 mrad for each of the larger wavelength (436 nm) and shorter wavelength (365 nm). It is evident from a comparison with FIG. 6E that the achromatic groups AG1 and AG2 are effective to sufficiently reduce telecentricity errors on the object-side, thereby allowing to relax specifications for the exit side telecentricity of the illumination system.

FIGS. 11 to 14 show embodiments of catadioptric projection objectives useful for microlithography where all lenses are made from the same material (so-called one-material systems). In the embodiments, fused silica is used for all lenses. Correction of chromatic variation of Petzval sum is obtained by balancing the contribution of all dioptric components and all reflective components of the projection objective such that the combined Petzval sum of all dioptric components (lenses) is substantially 0 and that the combined Petzval sum of all reflective components (mirrors) is substantially 0. In order to fulfil such requirements for the reflective components, a convex mirror is provided in addition to the at least one concave mirror utilized in connection with negative refractive power to correct a major fraction of axial and lateral color.

Projection objective 1100 forming a ninth embodiment is designed for primary UV radiation including three mercury lines at about 365 nm (i-line), about 405 nm (h-line) and about 436 nm (g-line), i.e. an operating wavelength band with wavelengths spaced apart by at least a wavelength difference $\Delta\lambda=71$ nm. Given a demagnifying imaging scale of 4:1 ($\beta=-0.25$) the projection objective is telecentric on the object side and on the image side and has an image-side numerical aperture NA=0.5. The image field size is 26 mm by 5.5 mm. The specification is given in tables 11, 11A.

Projection objective 1100 is designed to project an image of a pattern on a reticle arranged in the planar object surface OS (object plane) into the planar image surface IS (image plane) on a reduced scale, for example, 4:1, while creating exactly two real intermediate images IMI1, IMI2. The rectangular effective object field OF and image field IF are off-axis, i.e. entirely outside the optical axis OA. A first refractive objective part OP1 is designed for imaging the pattern provided in the object surface into the first intermediate image IMI1. A second, catadioptric (refractive/reflective) objective part OP2 images the first intermediate image IMI1 into the second intermediate image IMI2 at a magnification close to 1:(−1). A third, catadioptric objective part OP3 images the second intermediate image IMI2 onto the image surface IS with a strong reduction ratio.

The first, purely refractive objective part OP1 has twelve fused silica lenses forming a refractive single-waist relay system having a first positive lens group LG1 formed by six immediately consecutive positive lenses, a second, negative lens group LG2 formed by three immediately consecutive negative lenses, and a positive lens group LG3 formed by four immediately consecutive lenses.

The second objective part OP2 includes a single first concave mirror CM1 situated close to the second pupil surface P2. A first planar folding mirror FM1 is arranged optically close to the first intermediate image IMI1 at an angle of 45° to the optical axis OA such that it reflects the radiation coming from the object surface in the direction of the first concave mirror CM1. A second folding mirror FM2, having a planar mirror surface aligned at right angles to the planar mirror surface of the first folding mirror, reflects the radiation coming from the first concave mirror CM1 in the direction of the image surface, which is parallel to the object surface. The folding mirrors FM1, FM2 are each located in the optical vicinity of the closest intermediate image. A double pass region where the radiation passes twice in opposite directions is thereby formed geometrically between the deflecting mirrors FM1, FM2 and the concave mirror CM1. A single positive lens L2-1 is arranged in the double pass region geometrically close to the folding mirrors FM1, FM2 and optically close to both the first and second intermediate images, thereby acting as a positive field lens. A negative group NG having exactly one negative meniscus lens L2-2 is arranged in a region with large marginal ray height near the concave mirror and coaxial with the concave mirror such that the radiation passes twice in opposite directions through the negative group. No optical element is arranged between the negative group and the concave mirror.

The third objective part OP3 is a catadioptric objective part including a second concave mirror CM2, a convex mirror CVM and eight fused silica lenses. Second concave mirror CM2 has a central hole in the region of the optical axis and a reflecting surface facing the image surface. Convex mirror CVM has a convex reflecting surface facing the second concave mirror CM2 and is positioned on the optical axis on the image-side of second concave mirror CM2. Radiation coming from second intermediate image IMI2 first passes a negative-positive lens doublet prior to entering the space between second concave mirror CM2 and convex mirror CVM through the central hole in the second concave mirror CM2. Radiation passes a large negative meniscus lens L3-3 placed directly in front of second concave mirror CM2 and having the same sense of curvature. Radiation diverged by negative lens L3-3 is incident on convex mirror CVM, which has negative optical power, thereby increasing the divergence angle of the reflected radiation beam directed towards negative lens L3-3 and second concave mirror CM2. Radiation passes through negative lens L3-3 a second time and is incident on concave mirror CM2, which has positive optical power and generates convergent radiation directed towards the image surface IS. Radiation reflected by concave mirror CM2 passes negative lens L3-3 a third time and is directed past convex mirror CVM through lenses L3-4 to L3-8 and a plane parallel plate towards image surface IS. Second concave mirror CM2 and negative lens L3-3 are positioned optically close to third pupil surface P3, thereby contributing to correction of chromatic aberrations in a manner basically similar to the combination of negative group NG and concave mirror CM1 in the second objective part OP2. A central pupil obscuration is generated due to the hole in second concave mirror CM2.

Figure 11A:
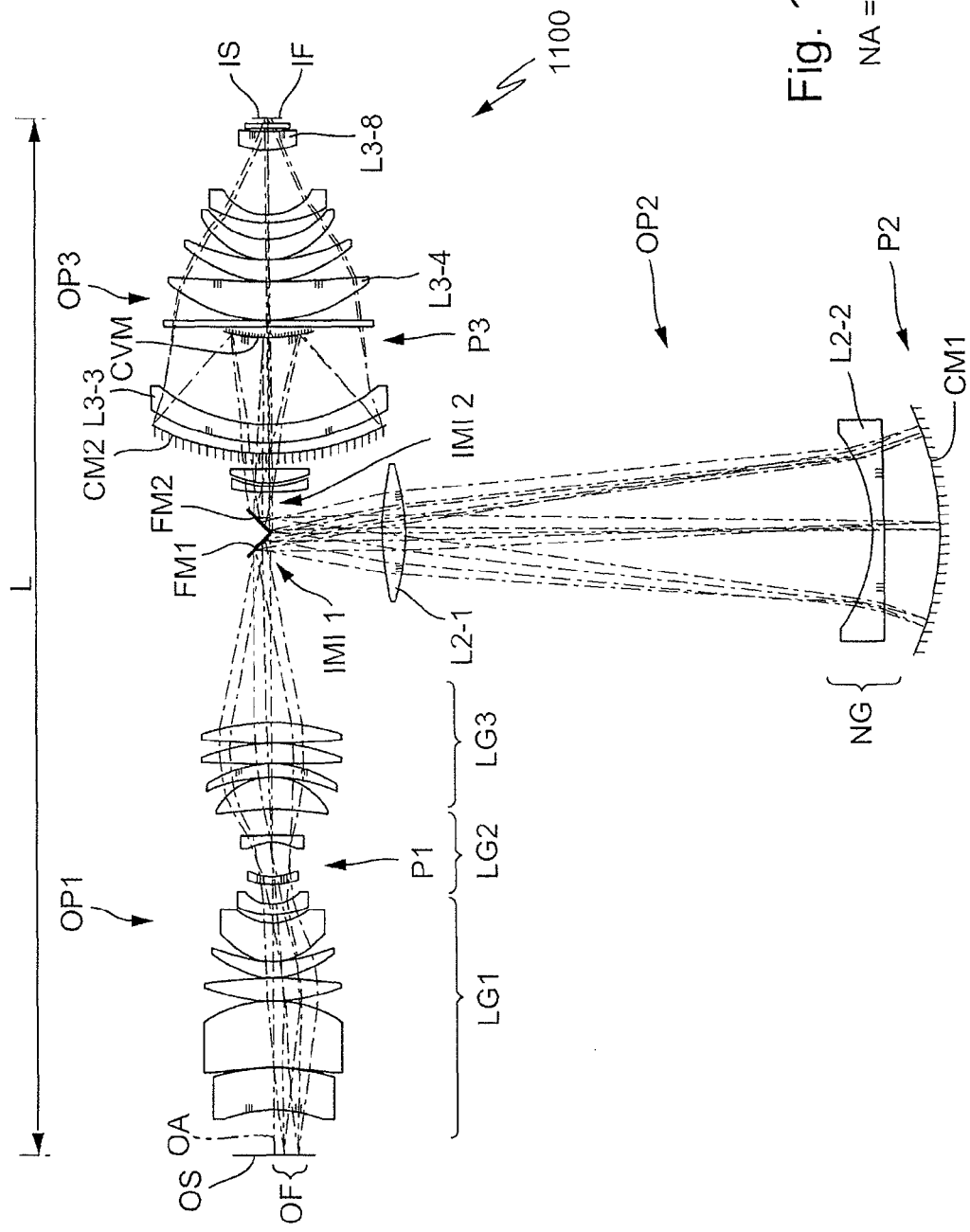
FIG. 11 shows a ninth embodiment of a catadioptric projection objective in FIG. 11A and diagrams representing optical properties of the embodiment in FIGS. 11B and 11C.
Figure 11:
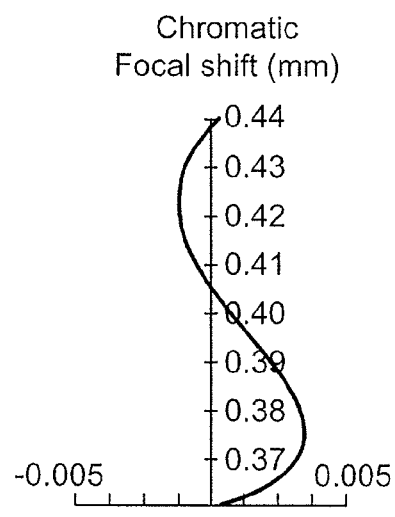

The radius of curvature of the convex mirror CVM is adapted to the radii of curvature of the first and second concave mirrors CM1, CM2 such that the sum of the base curvatures of the curved mirrors is substantially 0 in the projection objective. As used in this application, the term "base radius" refers to the radius of curvature of the curved mirrors at the vertex thereof, i.e. at the intersection of the optical axis OA with the surface of curvature defined by the respective reflective surface. The sum of the base curvatures of the curved mirrors may be exactly zero. However, small deviations may also be acceptable depending on the specification. In general, the sum may be considered as being "substantially zero" if the condition:

$$|C_M \cdot L| < 2 \quad (9)$$

is fulfilled. In some embodiments the upper limit may be smaller such that $|C_M \cdot L| < 1$ or $|C_M \cdot L| < 0.5$, for example. In equation (9) parameter L denotes the geometrical distance between the object surface OS and the image surface (also denoted as track length) and $$C_M = \sum_{Mirrors} c_i \quad (10)$$

is the sum of the base curvatures $c_i$ of the curved mirrors in the projection objective, where convex base curvatures are counted positive and concave base curvatures are counted negative. In the embodiment of FIG. 11A, $|C_M \cdot L| = 0.251$.

Figure 11C:
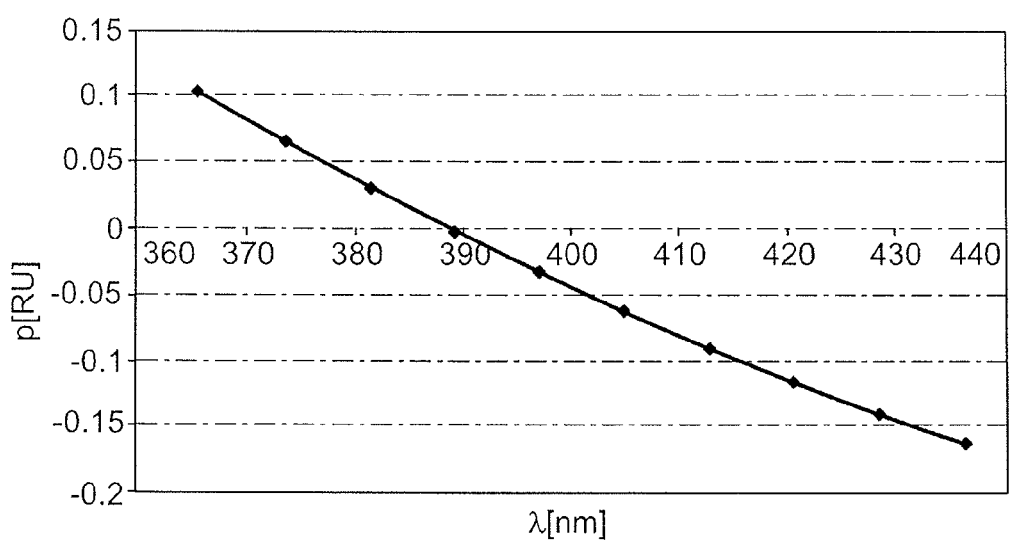

Some relevant optical properties of the ninth embodiment in FIG. 11A are shown in FIGS. 11B and 11C. The diagram of FIG. 11B shows the chromatic focal shift, i.e. the position of the focal plane with respect to the reference image plane for different wavelengths between 360 nm and 440 nm. The curve exhibits three zero-crossings at about 360 nm, 405 nm and 437 nm, essentially corresponding to the mercury l-, h- and g-lines, respectively.

FIG. 11C shows a diagram representing the chromatic variation of image field curvature, where the abscissa represents the wavelengths λ and the ordinate represents the longitudinal departure p of the Petzval surface from an ideal image surface at an edge field point of the image field at maximum image height y' in units of the Rayleigh unit $RU = \lambda/NA^2$. It can be seen that the rate of change of the longitudinal departure p with wavelength, dp/dλ, is about 0.0028 RU/nm over the entire wavelength band between about 365 nm and about 440 nm.

FIG. 12 shows schematically three variants of projection objectives each having two concave mirrors and a single convex mirror.

In the schematics, the curved mirrors are represented by curved lines, lens groups with overall positive refractive power are represented by double-arrows with arrow-heads pointing outwardly, and lens groups with overall negative refractive power are represented by double-arrows with arrow heads pointing inwardly. Therefore, FIG. 12A basically corresponds to design having the general layout of ninth embodiment in FIG. 11A (without negative lens L3-3). In embodiments according to FIG. 12B the first objective part OP1 is catadioptric, the second objective part OP2 is catadioptric and the third objective part OP3 is dioptric. (C-C-R configuration) The combination of second concave mirror CM2 and convex mirror CVM is incorporated into the first objective part OP1, whereas the third objective part is basically a single-waste refractive objective part with one or more waists providing the image-side numerical aperture from the numerical aperture present at the second intermediate image. Note that in these embodiments no lens is arranged between the second concave mirror CM2 and the convex mirror CVM. A dioptric lens may be provided between the convex mirror CVM and the concave mirror CM2, like shown in embodiment 1100. Likewise, negative lens L3-3 in projection objective 1100 may be omitted, where desired.

Figure 12A:
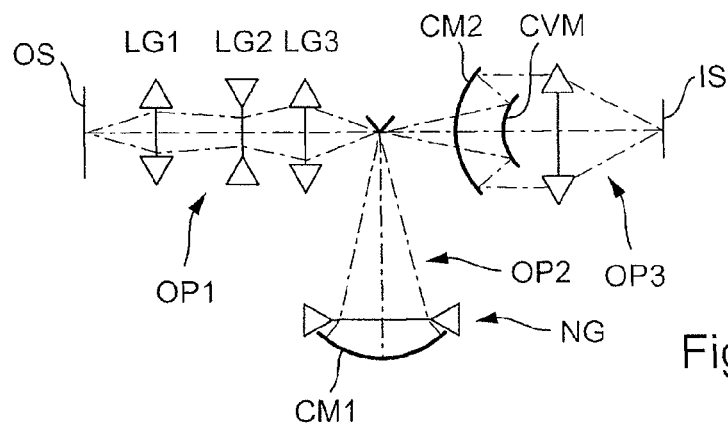
FIG. 12 shows three variants, in FIG. 12A-12C, of the projection objective shown in FIG. 11A.
Figure 12B:
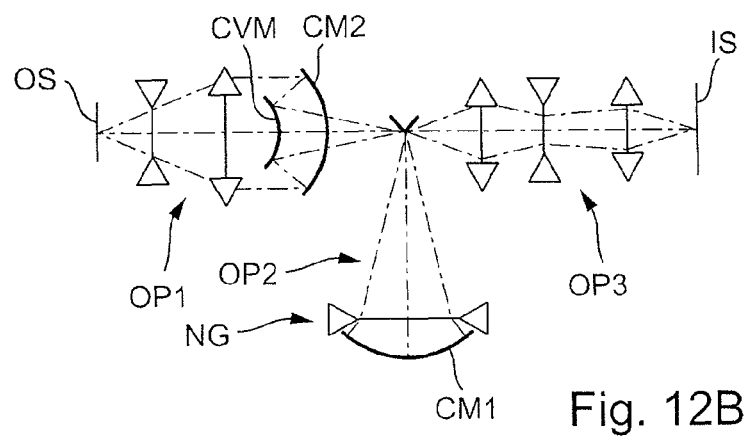
Figure 12C:
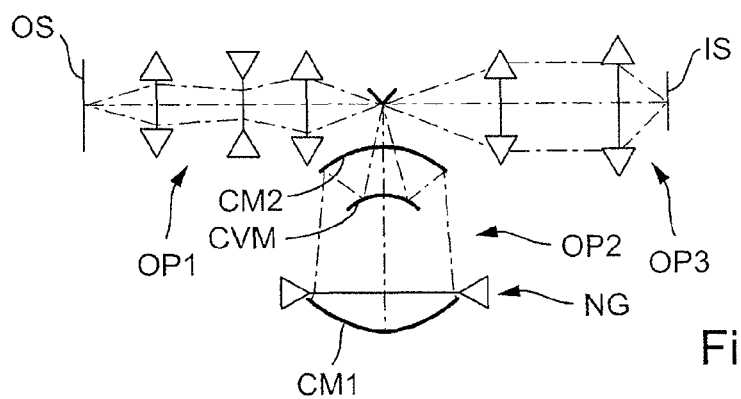

In the variant of FIG. 12C the combination of second concave mirror CM2 and convex mirror CVM is incorporated in the catadioptric second objective part such that convex mirror CVM is disposed geometrically between the two concave mirrors CM1, CM2. In this embodiment, the first objective part OP1 and the third objective part OP3 each are purely refractive (R-C-R configuration). A dioptric lens may be inserted between CVM and CM2, if desired.

Projection objective 1300 (tenth embodiment) is another example of a projection objective having exactly two intermediate images, two concave mirrors and one convex mirror and a plurality of lenses, where all lenses are made of the same material (fused silica). The first objective part OP1 is purely refractive. Planar first folding mirror FM1 is positioned inside first objective part OP1 such that first intermediate image IMI1 is generated optically behind the first folding mirror FM1. Alternatively, the intermediate image may be positioned between first folding mirror FM1 and concave mirror CM1. Catadioptric objective part OP2 includes first concave mirror CM1 at second pupil surface P2, and negative group NG directly in front of first concave mirror CM1. A negative field lens L2-1 is arranged optically close to both intermediate images, a positive lens L2-2 is positioned in an intermediate region. Third objective part OP3 is catadioptric and includes second concave mirror CM2 having the mirror surface concave towards the object-side and convex mirror CVM arranged geometrically between second folding mirror FM2 and concave mirror CM2 facing the image surface. A number of lenses is arranged optically downstream of concave mirror CVM to converge radiation towards the image surface.

The projection objective is designed to create an off-axis image field without pupil obscuration despite the fact that a mirror group with a convex mirror CVM and a concave mirror CM2 is integrated into the third objective part. An arc shaped object field OF and image field are used to avoid vignetting. Radiation from the object surface forms first intermediate image IMI1, which is re-imaged to form second intermediate image IMI2 by the second objective part OP2. Second intermediate image IMI2 is created geometrically near the outer edge of concave mirror CVM at a small distance from the edge such that radiation reflected from second folding mirror FM2 is first directed to concave mirror CM2. Concave mirror CM2 is formed as a Mangin element by a reflective coating applied to a convex back face of a transparent substrate L3-1 shaped like a positive meniscus lens passed twice by radiation impinging on and reflected from second concave mirror CM2. Radiation reflected from second concave mirror CM2 is incident on concave mirror CVM, which reflects radiation through a lens portion of the substrate L3-1 towards a group of lenses arranged geometrically between concave mirror CM2 and image surface IS. The convex mirror CM2 may also be realized as an individual mirror with a lens upstream thereof or as a mirror without adjacent lens element.

As evident from FIG. 13B, the system is apochromatic allowing three common foci at about 371 nm, about 405 nm and about 420 nm within the wavelength band covered by the three mercury lines. Chromatic variation of image field curvature may be characterized by $dp/d\lambda=0.0309$ RU/nm.

Figure 14A:
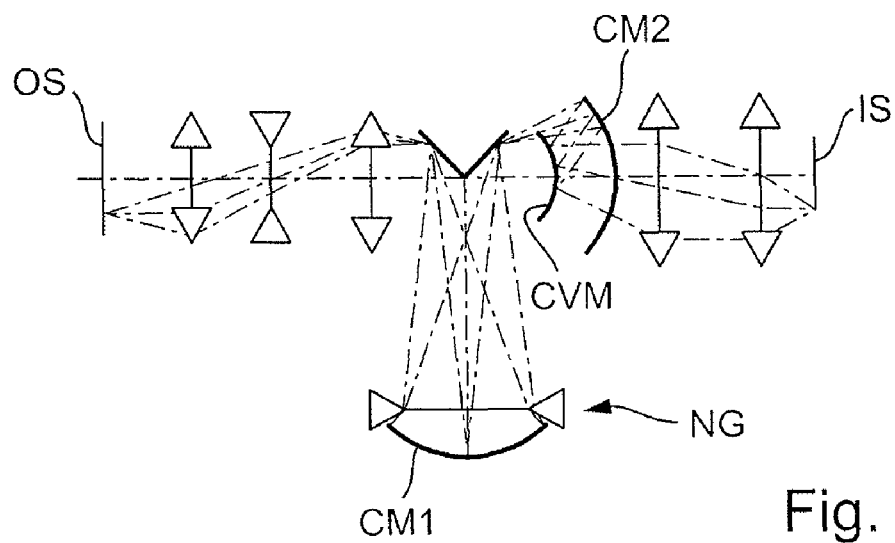
FIG. 14 shows two variants, in FIGS. 14A and 14B, of the projection objective in FIG. 13A.
Figure 14B:
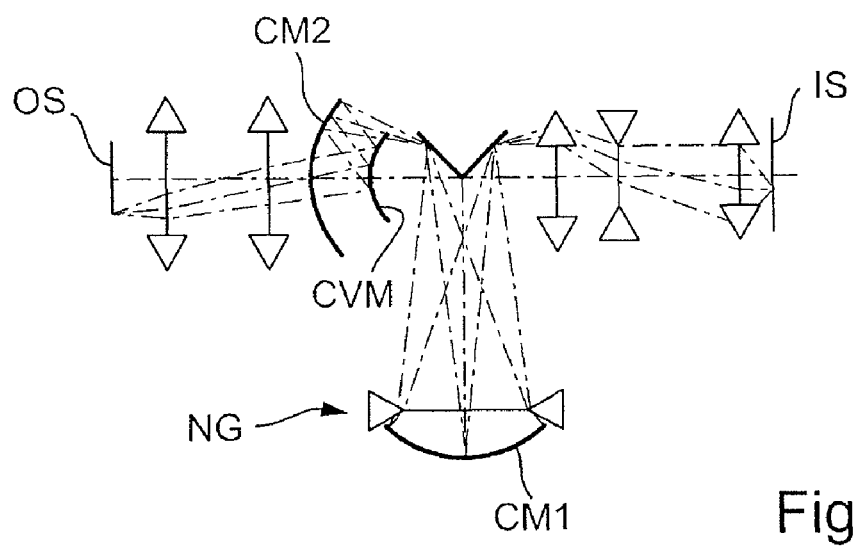

FIG. 14 shows two variants of catadioptric projection objectives using an arc shaped field (ring field) to obtain an image field without vignetting and pupil obscuration in a system where a mirror group with a convex mirror CVM and a concave mirror CM2 coaxial with the convex mirror are integrated. In the embodiment of FIG. 14A the coaxial mirror group CM2, CVM is incorporated in the third objective part, similar to the embodiment of FIG. 13A. In the embodiment of FIG. 14B, the mirror group including coaxial concave mirror CM2 and convex mirror CVM is incorporated into the first objective part OP1 forming the first intermediate image IMI2.

Figure 15:
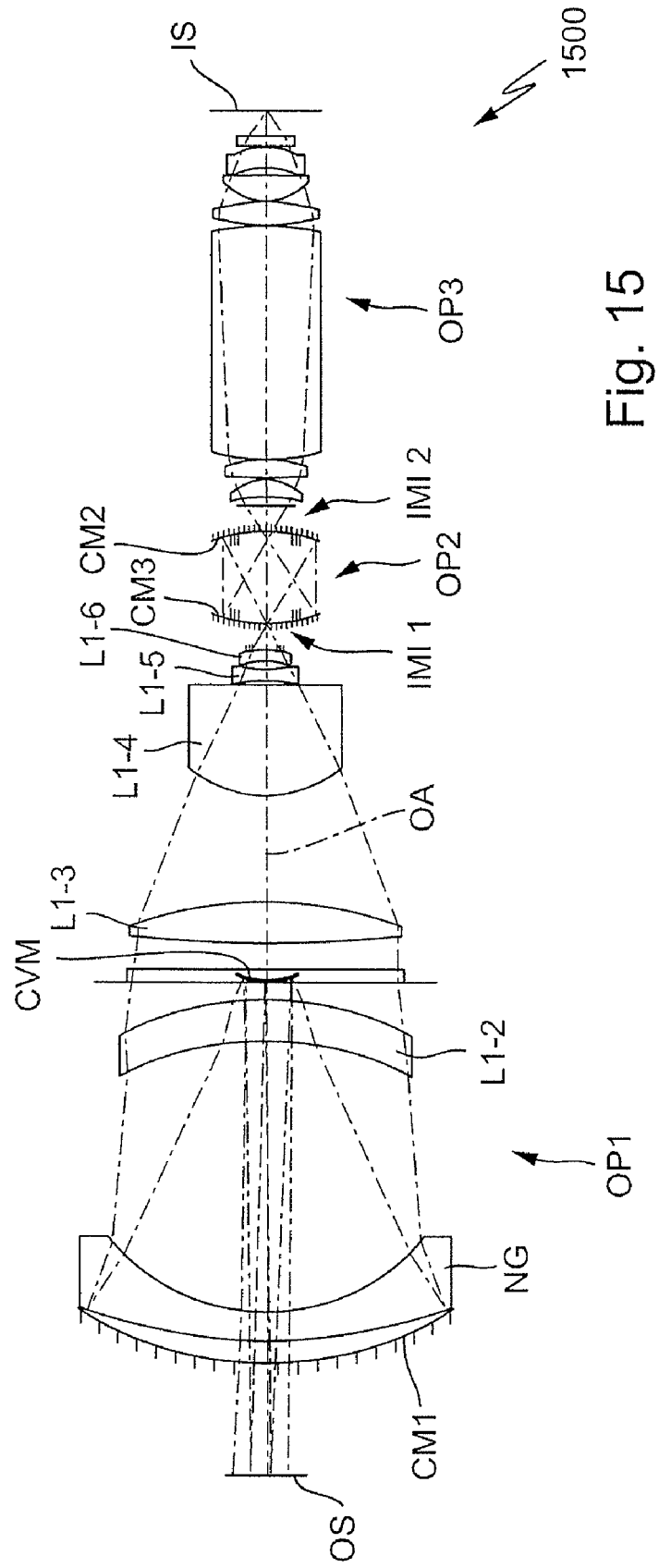
FIG. 15 shows a microscope objective according to an embodiment.

FIG. 15 shows an example of a catadioptric objective 1500 with improved correction of chromatic variation of Petzval sum in accordance with the teachings outlined above. With an object placed at infinity (corresponding to a collimated beam entering the objective from the left hand side) a numerical aperture NA=0.6 is obtained on the high NA side to the right. When the objective is used in a microscope, an object to be magnified would be placed in the image surface IS. The objective includes, from the low NA side to the high NA side, a catadioptric first objective part OP1 creating first intermediate image IMI1, a second, catoptric (purely reflective) objective part OP2 creating a second intermediate image IMI2 from the first intermediate image, and a third, refractive objective part OP3 re-imaging the second intermediate image IMI2 onto the image surface. All optical elements are aligned along an unfolded, straight optical axis OA (in-line system). The first objective part includes, from the object side to the image side, a first concave mirror CM1 concave towards the image side, a negative group NG formed by a single negative meniscus lens directly in front of the concave mirror CM1, a thin meniscus lens L1-2, a convex mirror CMV having a convex reflective surface facing the first concave mirror CM1, and lenses L1-3 to L1-6 to converge radiation towards the first intermediate image IMI1. Second objective part OP2 is purely reflective (catoptric) and includes two concave mirrors CM2, CM3 having aspheric reflecting surfaces facing each other, where each concave mirror has a central hole on the optical axis to allow radiation to enter and exit the space included between the concave mirrors. First intermediate image IMI1 is formed in or near the hole in the third concave mirror CM3, and second intermediate image IMI2 is formed in or near the hole of the second concave mirror CM2. Purely refractive third objective part OP3 collimates diverging radiation originating from second intermediate image IMI2 towards the image surface IS1 when the objective is transirradiated from the low NA side to the high NA side.

Correction of axial chromatic aberration is mainly supported by the combination of concave mirror CM1 and negative group NG provided in a region of large marginal ray heights in the first objective part OP1. A further contribution to overcorrection of the field curvature is provided by the two concave mirrors CM2, CM3 in the second objective part OP2. The overcorrection of field curvature provided by the concave mirrors is compensated by convex mirror CVM having opposite sign of curvature. Chromatic variation of image field curvature may be characterized by $dp/d\lambda=0.0003$ RU/nm.

Table B below summarizes the derivative of p with respect to wavelength $\lambda$, $dp/d\lambda$ (in Rayleigh units (RU) per nanometer (nm)) for each of the designs in the respective figures together with other relevant data as explained above.

TABLE B

| | FIG. | | | | | |
|---|---|---|---|---|---|---|
| | 3 | 4 | 5 | 6 | 7 | 8 |
| | Table | | | | | |
| | 3 | 4 | 5 | 6 | 7 | 8 |
| $\lambda$ [nm] | 405 | 405 | 193 | 405 | 405 | 405 |
| $\Delta\lambda$ [nm] | 71 | 71 | 0.18 | 71 | 71 | 71 |
| L [mm] | 1500 | 1000 | 1500 | 1500 | 1500 | 1500 |
| NA | 0.5 | 0.16 | 1 | 0.6 | 0.6 | 0.6 |
| y' [mm] | 15.5 | 20 | 15.5 | 15.5 | 15.5 | 15.5 |
| $\lambda/NA^2$ [μm] | 1.62 | 15.82 | 0.19 | 1.13 | 1.13 | 1.13 |
| $dp/d\lambda$ [RE/nm] | 0.0085 | 0.0121 | 5.35 | 0.0081 | 0.016 | 0.0019 |

| | FIG. | | | | |
|---|---|---|---|---|---|
| | 9 | 10 | 11 | 13 | 15 |
| | Table | | | | |
| | 9 | 10 | 11 | 13 | 15 |
| $\lambda$ [nm] | 365.5 | 405 | 405 | 405 | 405 |
| $\Delta\lambda$ [nm] | 5 | 71 | 71 | 71 | 71 |
| L [mm] | 1500 | 1500 | 1500 | 1500 | 247 |
| NA | 0.8 | 0.6 | 0.5 | 0.5 | 0.6 |
| y' [mm] | 15.5 | 15.5 | 15.5 | 15.9 | 0.25 |
| $\lambda/NA^2$ [μm] | 0.57 | 1.13 | 1.62 | 1.62 | 1.13 |
| $dp/d\lambda$ [RE/nm] | 0.036 | 0.0092 | 0.0028 | 0.0309 | 0.0003 |

Aspects of the invention may be implemented in catadioptric objectives having different constructions. For example, folded catadioptric projection objectives having at least one intermediate image which have one or more planar folding mirrors in combination with a single catadioptric group designed in the manner of a "Schupmann achromat" basically as disclosed in U.S. Pat. No. 6,909,492 B2 or US 2004/

0160677 A1 or US 2003/0011755 A1 or U.S. Pat. No. 6,665, 126 or EP 1 480 065 may be modified. Folded designs with more than one catadioptric group designed in the manner of a "Schupmann achromat" basically as disclosed in WO 2005/040890 my also be modified. Unfolded projection objectives (in-line systems) having a concave mirror arranged near the pupil and having a further concave mirror as shown e.g. in EP 1 069 448 A1 may be modified. Other in-line systems, in part having four or six concave mirrors, basically as shown in the U.S. Pat. No. 6,636,350 or U.S. Pat. No. 6,995,918 may be modified. Those system types can be utilized in principle, with corresponding adaptation, in the context of embodiments.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The content of all the claims is made part of this description by reference.

The following tables summarize specifications of embodiments described above. In the tables, column 1 specifies the number of a refractive surface or a reflective surface or a surface distinguished in some other way, column 2 specifies the radius r (radius of curvature) of the surface (in mm), column 3 specifies the distance d—also denoted as thickness—between the surface and the subsequent surface (in mm), and column 4 specifies the material of the optical components. Column 5 indicates the refractive index of the material, and column 6 specifies the optically free radius or the optically free semidiameter (or the lens height) of a lens surface or other surfaces (in mm). Radius r=0 corresponds to a planar surface.

The table or tables are designated by the same numbers as the respective figures. A table with additional designation "A" specifies the corresponding aspheric or other relevant data. The aspheric surfaces are calculated according to the following specification:

$$p(h)=[((1/r)h^2)/(1+\text{SQRT}(1-(1+K)(1/r)^2h^2))]+C1*h^4+C2*h^6+\ldots$$

In this case, the reciprocal (1/r) of the radius specifies the surface curvature and h specifies the distance between a surface point and the optical axis (i.e. the ray height). Consequently, p(h) specifies the so-called sagitta, that is to say the distance between the surface point and the surface vertex in the z direction (direction of the optical axis). Constant K is the conic constant, and parameters, C1, C2 are aspheric constants.

TABLE 3

| | | | | | | |
|---|---|---|---|---|---|---|
| NA | 0.5 | | | | | |
| OBH | 62 | | | | | |
| WL | 405 | | 365.5 | | 436 | |

| SURF | RADIUS | THICKNESS | MATERIAL | INDEX1 | INDEX2 | INDEX3 | SEMIDIAM. |
|---|---|---|---|---|---|---|---|
| 0 | 0.000000 | 30.999606 | | | | | 62.0 |
| 1 | 442.210327 | 19.399644 | SILUV | 1.469595 | 1.474477 | 1.466705 | 66.7 |
| 2 | −519.098537 | 133.950194 | | | | | 67.0 |
| 3 | −115.471793 | 9.999752 | SILUV | 1.469595 | 1.474477 | 1.466705 | 66.4 |
| 4 | 620.664725 | 82.839011 | | | | | 73.7 |
| 5 | −8114.454958 | 42.716031 | SILUV | 1.469595 | 1.474477 | 1.466705 | 103.6 |
| 6 | −185.432886 | 0.999576 | | | | | 106.1 |
| 7 | 759.870106 | 45.909768 | SILUV | 1.469595 | 1.474477 | 1.466705 | 109.0 |
| 8 | −223.104448 | 0.999513 | | | | | 109.0 |
| 9 | 108.556004 | 44.184151 | SILUV | 1.469595 | 1.474477 | 1.466705 | 92.3 |
| 10 | 226.758476 | 0.999571 | | | | | 86.8 |
| 11 | 87.389465 | 62.916943 | SILUV | 1.469595 | 1.474477 | 1.466705 | 72.7 |
| 12 | 46.681583 | 25.937231 | | | | | 37.1 |
| 13 | −6393.436173 | 9.999569 | LLF1 | 1.569035 | 1.579164 | 1.563301 | 32.1 |
| 14 | 64.185307 | 70.096512 | | | | | 26.2 |
| 15 | −113.365188 | 45.892870 | SILUV | 1.469595 | 1.474477 | 1.466705 | 48.5 |
| 16 | −75.373921 | 0.998865 | | | | | 59.9 |
| 17 | 204.094038 | 34.671249 | SILUV | 1.469595 | 1.474477 | 1.466705 | 65.4 |
| 18 | −155.351422 | 54.833584 | | | | | 66.2 |
| 19 | −500.000000 | 0.000000 | SILUV | 1.469595 | 1.474477 | 1.466705 | 56.5 |
| 20 | −500.000000 | 90.000000 | | | | | 56.5 |
| 21 | 0.000000 | −98.001733 | REFL | | | | 47.0 |
| 22 | −1918.979286 | −30.000065 | SILUV | 1.469595 | 1.474477 | 1.466705 | 66.8 |
| 23 | 224.227390 | −483.329791 | | | | | 69.4 |
| 24 | 146.188532 | −15.000000 | SILUV | 1.469595 | 1.474477 | 1.466705 | 98.2 |
| 25 | −3322.789744 | −90.200337 | | | | | 114.2 |
| 26 | 303.674356 | 90.200337 | REFL | | | | 139.6 |
| 27 | −3322.789744 | 15.000000 | SILUV | 1.469595 | 1.474477 | 1.466705 | 106.1 |
| 28 | 146.188532 | 483.329791 | | | | | 88.8 |
| 29 | 224.227390 | 30.000065 | SILUV | 1.469595 | 1.474477 | 1.466705 | 68.5 |
| 30 | −1918.979286 | 98.001733 | | | | | 66.3 |
| 31 | 0.000000 | −90.000000 | REFL | | | | 49.7 |
| 32 | −500.000000 | 0.000000 | SILUV | 1.469595 | 1.474477 | 1.466705 | 56.3 |
| 33 | −500.000000 | −0.999434 | | | | | 56.3 |
| 34 | −88.613541 | −40.063824 | SILUV | 1.469595 | 1.474477 | 1.466705 | 59.9 |
| 35 | 389.461534 | −0.999871 | | | | | 58.2 |
| 36 | −85.096736 | −9.999048 | SILUV | 1.469595 | 1.474477 | 1.466705 | 52.3 |
| 37 | −60.357818 | −43.175897 | | | | | 46.6 |
| 38 | 151.005116 | −9.999800 | LLF1 | 1.569035 | 1.579164 | 1.563301 | 45.2 |
| 39 | −154.602510 | −59.622445 | | | | | 46.3 |

TABLE 3-continued

| | | | | | | | |
|---|---|---|---|---|---|---|---|
| 40 | −209.277964 | −25.732855 | SILUV | 1.469595 | 1.474477 | 1.466705 | 63.6 |
| 41 | −2668.608907 | −37.078249 | | | | | 64.7 |
| 42 | −118.939706 | −25.943557 | SILUV | 1.469595 | 1.474477 | 1.466705 | 68.3 |
| 43 | −208.205009 | −32.287180 | | | | | 65.7 |
| 44 | 184.455133 | −14.999433 | SILUV | 1.469595 | 1.474477 | 1.466705 | 65.3 |
| 45 | −1666.008680 | −3.979634 | | | | | 70.5 |
| 46 | −1690.411885 | −42.649332 | SILUV | 1.469595 | 1.474477 | 1.466705 | 71.5 |
| 47 | 109.373142 | −0.999292 | | | | | 73.7 |
| 48 | −122.073750 | −31.195782 | SILUV | 1.469595 | 1.474477 | 1.466705 | 68.6 |
| 49 | −428.173772 | 5.053196 | | | | | 66.5 |
| 50 | 0.000000 | −84.671911 | | | | | 67.8 |
| 51 | 230.712331 | −16.783825 | SILUV | 1.469595 | 1.474477 | 1.466705 | 58.5 |
| 52 | 95.347852 | −25.305725 | | | | | 58.5 |
| 53 | −118.738065 | −26.920074 | SILUV | 1.469595 | 1.474477 | 1.466705 | 49.8 |
| 54 | −3094.028810 | −0.999632 | | | | | 46.4 |
| 55 | −855.681538 | −66.820809 | SILUV | 1.469595 | 1.474477 | 1.466705 | 43.5 |
| 56 | 0.000000 | −6.000000 | | | | | 19.1 |
| 57 | 0.000000 | 0.000000 | | | | | 15.5 |

TABLE 3A

Aspheric Constants

| | \multicolumn{5}{c}{SRF} |
|---|---|---|---|---|---|
| | 3 | 8 | 15 | 17 | 22 |
| K | 0 | 0 | 0 | 0 | 0 |
| C1 | −1.352838E−08 | 2.450022E−08 | 5.831651E−07 | −2.714687E−07 | 1.052250E−08 |
| C2 | 2.806019E−12 | 5.467657E−14 | −1.445186E−10 | 2.738411E−11 | 6.694347E−13 |
| C3 | 7.585058E−17 | −3.444541E−19 | 4.182731E−14 | −4.384852E−15 | −1.137411E−16 |
| C4 | −7.477742E−21 | 2.901679E−22 | −1.166677E−17 | 6.483077E−19 | 1.982512E−20 |
| C5 | 5.612990E−24 | −1.706015E−26 | 2.227669E−21 | −6.586345E−23 | −1.232921E−24 |
| C6 | −4.972510E−28 | 3.517925E−31 | −1.960258E−25 | 3.070880E−27 | −1.927329E−29 |

| | \multicolumn{5}{c}{SRF} |
|---|---|---|---|---|---|
| | 25 | 27 | 30 | 34 | 41 |
| K | 0 | 0 | 0 | 0 | 0 |
| C1 | 2.012570E−08 | 2.012570E−08 | 1.052250E−08 | 9.941130E−08 | 6.010073E−08 |
| C2 | −5.271557E−13 | −5.271557E−13 | 6.694347E−13 | 1.079479E−11 | 6.526446E−12 |
| C3 | 1.646217E−17 | 1.646217E−17 | −1.137411E−16 | 7.576753E−16 | 4.150062E−16 |
| C4 | −1.435199E−22 | −1.435199E−22 | 1.982512E−20 | 1.878135E−19 | −1.474276E−20 |
| C5 | −1.610015E−26 | −1.610015E−26 | −1.232921E−24 | −1.529136E−23 | −4.873680E−24 |
| C6 | 5.321668E−31 | 5.321668E−31 | −1.927329E−29 | 3.782198E−27 | 6.536434E−28 |

| | \multicolumn{4}{c}{SRF} |
|---|---|---|---|---|
| | 44 | 47 | 52 | 54 |
| K | 0 | 0 | 0 | 0 |
| C1 | 3.107676E−07 | −3.227235E−08 | −5.078522E−07 | 1.169030E−06 |
| C2 | 8.839418E−12 | −4.524537E−12 | 3.305415E−11 | −2.964829E−10 |
| C3 | −1.295508E−15 | −7.096715E−16 | −1.195130E−14 | 5.174490E−14 |
| C4 | 1.086911E−19 | −2.046307E−22 | 1.805728E−18 | −5.927366E−18 |
| C5 | −1.087279E−22 | −1.265102E−23 | −2.512187E−22 | 3.571492E−22 |
| C6 | 1.276003E−26 | 1.254945E−27 | 1.386411E−26 | −1.057399E−26 |

TABLE 4

| | NA | 0.16 | | | |
|---|---|---|---|---|---|
| | OBH | 20 | | | |
| | WL | 405 | 365.5 | 436 | |

| SURF | RADIUS | THICKNESS | MATERIAL | INDEX1 | INDEX2 | INDEX3 | SEMIDIAM. |
|---|---|---|---|---|---|---|---|
| 0 | 0.000000 | 30.000000 | | | | | 20.0 |
| 1 | 0.000000 | 0.000000 | LLF1 | 1.569035 | 1.579164 | 1.563301 | 24.9 |
| 2 | 0.000000 | 0.998996 | | | | | 24.9 |
| 3 | 71.505020 | 17.278950 | SILUV | 1.469595 | 1.474477 | 1.466705 | 25.8 |
| 4 | −135.600697 | 15.835785 | | | | | 25.6 |
| 5 | −102.466827 | 10.040269 | SILUV | 1.469595 | 1.474477 | 1.466705 | 23.8 |
| 6 | 46.804849 | 23.666744 | | | | | 23.7 |
| 7 | −30.207629 | 11.605794 | SILUV | 1.469595 | 1.474477 | 1.466705 | 25.0 |

TABLE 4-continued

| | | | | | | | |
|---|---|---|---|---|---|---|---|
| 8 | −40.037302 | 1.777476 | | | | | 31.0 |
| 9 | −48.615984 | 15.261606 | SILUV | 1.469595 | 1.474477 | 1.466705 | 32.5 |
| 10 | −49.955842 | 1.042998 | | | | | 37.9 |
| 11 | 237.806369 | 26.314328 | SILUV | 1.469595 | 1.474477 | 1.466705 | 44.5 |
| 12 | −92.826530 | 1.098565 | | | | | 45.8 |
| 13 | 63.699725 | 24.305861 | SILUV | 1.469595 | 1.474477 | 1.466705 | 43.6 |
| 14 | 268.334625 | 31.933675 | | | | | 40.3 |
| 15 | −78.553440 | 10.000200 | SILUV | 1.469595 | 1.474477 | 1.466705 | 31.1 |
| 16 | −124.449232 | 10.194899 | | | | | 29.8 |
| 17 | −67.929099 | 13.230878 | LLF1 | 1.569035 | 1.579164 | 1.563301 | 27.0 |
| 18 | −71.976583 | 1.003059 | | | | | 26.7 |
| 19 | 52.063287 | 15.522656 | LLF1 | 1.569035 | 1.579164 | 1.563301 | 23.2 |
| 20 | −2603.360008 | 6.694216 | | | | | 19.5 |
| 21 | −52.911743 | 9.999313 | LLF1 | 1.569035 | 1.579164 | 1.563301 | 16.9 |
| 22 | 141.860863 | 11.120098 | | | | | 15.6 |
| 23 | −23.980962 | 18.719479 | LLF1 | 1.569035 | 1.579164 | 1.563301 | 16.2 |
| 24 | −32.850592 | 0.998004 | | | | | 22.4 |
| 25 | 49.471203 | 29.076524 | SILUV | 1.469595 | 1.474477 | 1.466705 | 24.6 |
| 26 | −73.792921 | 1.012391 | | | | | 22.8 |
| 27 | −374.091002 | 10.030736 | SILUV | 1.469595 | 1.474477 | 1.466705 | 21.5 |
| 28 | −133.661999 | 7.972129 | | | | | 19.6 |
| 29 | −155.779117 | 11.461812 | SILUV | 1.469595 | 1.474477 | 1.466705 | 17.5 |
| 30 | −54.134768 | 2.490036 | | | | | 16.1 |
| 31 | 0.000000 | 0.000000 | SILUV | 1.469595 | 1.474477 | 1.466705 | 14.1 |
| 32 | 0.000000 | 20.000000 | | | | | 14.1 |
| 33 | 282.108008 | 40.676565 | | | | | 10.3 |
| 34 | −390.922222 | 20.000015 | SILUV | 1.469595 | 1.474477 | 1.466705 | 22.3 |
| 35 | −280.977870 | 42.922714 | | | | | 27.0 |
| 36 | −211.457624 | 5.775018 | SILUV | 1.469595 | 1.474477 | 1.466705 | 40.1 |
| 37 | 0.000000 | 5.775018 | SILUV | 1.469595 | 1.474477 | 1.466705 | 42.7 |
| 38 | 211.457624 | 42.922714 | | | | | 45.5 |
| 39 | 280.977870 | 20.000015 | SILUV | 1.469595 | 1.474477 | 1.466705 | 72.4 |
| 40 | 390.922222 | 40.676565 | | | | | 76.7 |
| 41 | −282.108008 | −40.676565 | REFL | | | | 86.7 |
| 42 | 390.922222 | −20.000015 | SILUV | 1.469595 | 1.474477 | 1.466705 | 84.2 |
| 43 | 280.977870 | −42.922714 | | | | | 83.9 |
| 44 | 211.457624 | −5.775018 | SILUV | 1.469595 | 1.474477 | 1.466705 | 75.8 |
| 45 | 0.000000 | −5.775018 | SILUV | 1.469595 | 1.474477 | 1.466705 | 75.4 |
| 46 | −211.457624 | −42.922714 | | | | | 75.8 |
| 47 | −280.977870 | −20.000015 | SILUV | 1.469595 | 1.474477 | 1.466705 | 83.9 |
| 48 | −390.922222 | −40.676565 | | | | | 84.2 |
| 49 | 282.108008 | 40.676565 | REFL | | | | 86.7 |
| 50 | −390.922222 | 20.000015 | SILUV | 1.469595 | 1.474477 | 1.466705 | 76.7 |
| 51 | −280.977870 | 42.922714 | | | | | 72.4 |
| 52 | −211.457624 | 5.775018 | SILUV | 1.469595 | 1.474477 | 1.466705 | 45.5 |
| 53 | 0.000000 | 5.775018 | SILUV | 1.469595 | 1.474477 | 1.466705 | 42.7 |
| 54 | 211.457624 | 42.922714 | | | | | 40.1 |
| 55 | 280.977870 | 20.000015 | SILUV | 1.469595 | 1.474477 | 1.466705 | 27.0 |
| 56 | 390.922222 | 40.676565 | | | | | 22.3 |
| 57 | −282.108008 | 20.000000 | | | | | 10.3 |
| 58 | 0.000000 | 0.000000 | SILUV | 1.469595 | 1.474477 | 1.466705 | 14.1 |
| 59 | 0.000000 | 2.490036 | | | | | 14.1 |
| 60 | 54.134768 | 11.461812 | SILUV | 1.469595 | 1.474477 | 1.466705 | 16.1 |
| 61 | 155.779117 | 7.972129 | | | | | 17.5 |
| 62 | 133.661999 | 10.030736 | SILUV | 1.469595 | 1.474477 | 1.466705 | 19.6 |
| 63 | 374.091002 | 1.012391 | | | | | 21.5 |
| 64 | 73.792921 | 29.076524 | SILUV | 1.469595 | 1.474477 | 1.466705 | 22.8 |
| 65 | −49.471203 | 0.998004 | | | | | 24.6 |
| 66 | 32.850592 | 18.719479 | LLF1 | 1.569035 | 1.579164 | 1.563301 | 22.4 |
| 67 | 23.980962 | 11.120098 | | | | | 16.2 |
| 68 | −141.860863 | 9.999313 | LLF1 | 1.569035 | 1.579164 | 1.563301 | 15.6 |
| 69 | 52.911743 | 6.694216 | | | | | 16.9 |
| 70 | 2603.360008 | 15.522656 | LLF1 | 1.569035 | 1.579164 | 1.563301 | 19.5 |
| 71 | −52.063287 | 1.003059 | | | | | 23.2 |
| 72 | 71.976583 | 13.230878 | LLF1 | 1.569035 | 1.579164 | 1.563301 | 26.7 |
| 73 | 67.929099 | 10.194899 | | | | | 27.0 |
| 74 | 124.449232 | 10.000200 | SILUV | 1.469595 | 1.474477 | 1.466705 | 29.8 |
| 75 | 78.553440 | 31.933675 | | | | | 31.1 |
| 76 | −268.334625 | 24.305861 | SILUV | 1.469595 | 1.474477 | 1.466705 | 40.3 |
| 77 | −63.699725 | 1.098565 | | | | | 43.6 |
| 78 | 92.826530 | 26.314328 | SILUV | 1.469595 | 1.474477 | 1.466705 | 45.8 |
| 79 | −237.806369 | 1.042998 | | | | | 44.6 |
| 80 | 49.955842 | 15.261606 | SILUV | 1.469595 | 1.474477 | 1.466705 | 37.9 |
| 81 | 48.615984 | 1.777476 | | | | | 32.5 |
| 82 | 40.037302 | 11.605794 | SILUV | 1.469595 | 1.474477 | 1.466705 | 31.0 |
| 83 | 30.207629 | 23.666744 | | | | | 25.0 |
| 84 | −46.804849 | 10.040269 | SILUV | 1.469595 | 1.474477 | 1.466705 | 23.7 |
| 85 | 102.466827 | 15.835785 | | | | | 23.8 |
| 86 | 135.600697 | 17.278950 | SILUV | 1.469595 | 1.474477 | 1.466705 | 25.6 |
| 87 | −71.505020 | 0.998996 | | | | | 25.8 |

TABLE 4-continued

| | | | | | | | |
|---|---|---|---|---|---|---|---|
| 88 | 0.000000 | 0.000000 | LLF1 | 1.569035 | 1.579164 | 1.563301 | 24.9 |
| 89 | 0.000000 | 30.000000 | | | | | 24.9 |
| 90 | 0.000000 | 0.000000 | | | | | 20.004 |

TABLE 4A

Aspheric Constants

| | SRF | | | | |
|---|---|---|---|---|---|
| | 28 | 46 | 49 | 52 | 54 |
| K | 0 | 0 | 0 | 0 | 0 |
| C1 | 4.526533E−06 | 1.050730E−07 | −9.387324E−09 | 1.050730E−07 | −1.050730E−07 |
| C2 | 1.481358E−09 | −1.076582E−11 | 3.284049E−13 | −1.076582E−11 | 1.076582E−11 |
| C3 | 4.401153E−13 | 1.004293E−15 | 1.082200E−17 | 1.004293E−15 | −1.004293E−15 |
| C4 | 6.492931E−15 | −1.102576E−19 | −1.034500E−21 | −1.102576E−19 | 1.102576E−19 |
| C5 | −1.244203E−17 | 7.702115E−24 | 8.502093E−26 | 7.702115E−24 | −7.702115E−24 |
| C6 | 1.672184E−20 | −3.347093E−28 | −1.706409E−30 | −3.347093E−28 | 3.347093E−28 |

| | SRF | |
|---|---|---|
| | 57 | 74 |
| K | 0 | 0 |
| C1 | 9.387324E−09 | −4.868716E−07 |
| C2 | −3.284049E−13 | 1.010109E−09 |
| C3 | −1.082200E−17 | 6.221108E−14 |
| C4 | 1.034500E−21 | −1.082355E−16 |
| C5 | −8.502093E−26 | −8.554228E−20 |
| C6 | 1.706409E−30 | 4.272266E−23 |

TABLE 5

| | | | | | | |
|---|---|---|---|---|---|---|
| NA | 1 | | | | | |
| OBH | 62 | | | | | |
| WL | 193 | | 192.95 | | 193.05 | |

| SURF | RADIUS | THICKNESS | MATERIAL | INDEX1 | INDEX2 | INDEX3 | SEMIDIAM. |
|---|---|---|---|---|---|---|---|
| 0 | 0.000000 | 52.003963 | | | | | 62.0 |
| 1 | −215.712833 | 23.035701 | SILUV | 1.560970 | 1.561050 | 1.560890 | 71.8 |
| 2 | −128.076348 | 0.999450 | | | | | 76.0 |
| 3 | 151.426866 | 42.474347 | CAFUV | 1.501395 | 1.501443 | 1.501347 | 82.9 |
| 4 | −729.275651 | 7.071245 | | | | | 81.3 |
| 5 | −426.546840 | 9.999189 | SILUV | 1.560970 | 1.561050 | 1.560890 | 80.2 |
| 6 | 261.642774 | 16.043848 | | | | | 77.6 |
| 7 | −11777.049949 | 9.999491 | SILUV | 1.560970 | 1.561050 | 1.560890 | 77.8 |
| 8 | 169.293494 | 56.379980 | | | | | 78.6 |
| 9 | 691.791322 | 73.161522 | CAFUV | 1.501395 | 1.501443 | 1.501347 | 96.0 |
| 10 | −141.860549 | 0.999306 | | | | | 101.5 |
| 11 | 116.062052 | 46.924402 | CAFUV | 1.501395 | 1.501443 | 1.501347 | 91.5 |
| 12 | 494.204476 | 0.999795 | | | | | 87.1 |
| 13 | 102.783313 | 57.100880 | SILUV | 1.560970 | 1.561050 | 1.560890 | 73.0 |
| 14 | 63.969000 | 25.033136 | | | | | 42.1 |
| 15 | −246.879276 | 9.999595 | SILUV | 1.560970 | 1.561050 | 1.560890 | 37.9 |
| 16 | 995.973277 | 82.840679 | | | | | 41.5 |
| 17 | −227.141816 | 12.314049 | SILUV | 1.560970 | 1.561050 | 1.560890 | 75.2 |
| 18 | −297.081330 | 1.000034 | | | | | 82.1 |
| 19 | −432.392392 | 44.994112 | CAFUV | 1.501395 | 1.501443 | 1.501347 | 84.7 |
| 20 | −113.419623 | 0.999918 | | | | | 89.2 |
| 21 | −2525.154853 | 44.365477 | CAFUV | 1.501395 | 1.501443 | 1.501347 | 94.4 |
| 22 | −139.684282 | 109.398402 | | | | | 96.7 |
| 23 | 0.000000 | −98.001733 | REFL | | | | 73.1 |
| 24 | −443.052731 | −30.000907 | CAFUV | 1.501395 | 1.501443 | 1.501347 | 83.1 |
| 25 | 373.578857 | −362.178493 | | | | | 84.2 |
| 26 | 176.909720 | −15.000000 | SILUV | 1.560970 | 1.561050 | 1.560890 | 90.3 |
| 27 | 563.266306 | −51.728642 | | | | | 97.8 |
| 28 | 119.506240 | −15.000000 | SILUV | 1.560970 | 1.561050 | 1.560890 | 99.8 |
| 29 | 420.143117 | −37.416219 | | | | | 130.2 |
| 30 | 198.624832 | 37.416219 | REFL | | | | 135.7 |
| 31 | 420.143117 | 15.000000 | SILUV | 1.560970 | 1.561050 | 1.560890 | 130.7 |
| 32 | 119.506240 | 51.728642 | | | | | 101.3 |
| 33 | 563.266306 | 15.000000 | SILUV | 1.560970 | 1.561050 | 1.560890 | 100.2 |
| 34 | 176.909720 | 362.178493 | | | | | 93.2 |

TABLE 5-continued

| | | | | | | |
|---|---|---|---|---|---|---|
| 35 | 373.578857 | 30.000907 | CAFUV | 1.501395 | 1.501443 | 1.501347 | 93.1 |
| 36 | −443.052731 | 98.001733 | | | | | 92.4 |
| 37 | 0.000000 | −90.999924 | REFL | | | | 71.6 |
| 38 | −129.776522 | −48.648200 | CAFUV | 1.501395 | 1.501443 | 1.501347 | 84.8 |
| 39 | 827.646034 | −63.899751 | | | | | 83.0 |
| 40 | 372.011643 | −9.999744 | SILUV | 1.560970 | 1.561050 | 1.560890 | 68.2 |
| 41 | −273.104022 | −28.121346 | | | | | 65.9 |
| 42 | 190.398249 | −14.999809 | SILUV | 1.560970 | 1.561050 | 1.560890 | 66.6 |
| 43 | 1016.184194 | −168.331693 | | | | | 73.2 |
| 44 | 531.087094 | −56.072211 | SILUV | 1.560970 | 1.561050 | 1.560890 | 131.1 |
| 45 | 177.485817 | −0.999626 | | | | | 137.2 |
| 46 | −537.586457 | −56.628557 | SILUV | 1.560970 | 1.561050 | 1.560890 | 140.0 |
| 47 | 397.129639 | −44.087590 | | | | | 138.9 |
| 48 | 0.000000 | 43.087853 | | | | | 118.4 |
| 49 | −153.486833 | −67.057493 | SILUV | 1.560970 | 1.561050 | 1.560890 | 117.7 |
| 50 | −249.299442 | −20.267809 | | | | | 104.8 |
| 51 | −162.370282 | −20.842280 | CAFUV | 1.501395 | 1.501443 | 1.501347 | 92.1 |
| 52 | −156.733700 | −9.203222 | | | | | 83.7 |
| 53 | −117.699878 | −55.240329 | CAFUV | 1.501395 | 1.501443 | 1.501347 | 77.3 |
| 54 | −149.805182 | −0.998971 | | | | | 55.9 |
| 55 | −62.433321 | −55.696773 | SILUV | 1.560970 | 1.561050 | 1.560890 | 47.3 |
| 56 | 0.000000 | −3.000000 | H2OV193 | 1.437468 | 1.437576 | 1.437360 | 18.5 |
| 57 | 0.000000 | 0.000000 | | | | | 15.5 |

TABLE 5A

Aspheric Constants

| | SRF | | | | |
|---|---|---|---|---|---|
| | 1 | 10 | 17 | 21 | 24 |
| K | 0 | 0 | 0 | 0 | 0 |
| C1 | −6.708531E−08 | 2.403412E−08 | 4.755112E−08 | −8.563057E−08 | 4.477313E−09 |
| C2 | −1.705483E−12 | 5.166728E−13 | −1.636240E−11 | 2.159181E−12 | −1.420701E−14 |
| C3 | −7.297932E−17 | 1.588393E−17 | 9.465561E−16 | −8.271916E−17 | 1.771705E−18 |
| C4 | 7.204007E−21 | 1.305430E−21 | −1.062161E−19 | 7.540861E−21 | 5.190139E−22 |
| C5 | −1.589172E−24 | −1.770637E−26 | 7.674898E−24 | −3.712728E−25 | −5.453752E−26 |
| C6 | 9.231896E−29 | 2.718726E−30 | −4.144957E−28 | 5.093035E−30 | 2.236635E−30 |

| | SRF | | | | |
|---|---|---|---|---|---|
| | 29 | 31 | 36 | 38 | 41 |
| K | 0 | 0 | 0 | 0 | 0 |
| C1 | 6.085379E−09 | 6.085379E−09 | 4.477313E−09 | 1.767039E−08 | −1.728330E−07 |
| C2 | −8.735959E−14 | −8.735959E−14 | −1.420701E−14 | 8.316564E−13 | −1.025592E−11 |
| C3 | 2.780158E−18 | 2.780158E−18 | 1.771705E−18 | 4.937988E−17 | −8.277512E−16 |
| C4 | −9.170747E−23 | −9.170747E−23 | 5.190139E−22 | 5.039321E−21 | −4.377410E−20 |
| C5 | 2.453451E−27 | 2.453451E−27 | −5.453752E−26 | −1.717773E−25 | −1.042063E−23 |
| C6 | −3.229238E−32 | −3.229238E−32 | 2.236635E−30 | 2.891565E−29 | 3.839128E−28 |

| | SRF | | | |
|---|---|---|---|---|
| | 44 | 47 | 50 | 54 |
| K | 0 | 0 | 0 | 0 |
| C1 | 3.870375E−08 | −1.633267E−09 | 3.936289E−08 | 3.278814E−09 |
| C2 | −6.465213E−13 | −4.107714E−14 | −1.118071E−12 | 2.417322E−11 |
| C3 | −1.535545E−17 | −1.794721E−17 | 2.312000E−17 | −5.059698E−15 |
| C4 | −1.454853E−23 | 7.679954E−22 | −3.066503E−21 | 5.143166E−19 |
| C5 | 2.932144E−26 | −1.568521E−26 | 1.702929E−25 | −7.127504E−23 |
| C6 | −5.208776E−31 | 1.467656E−31 | −3.177511E−30 | 2.926135E−27 |

TABLE 6

| | NA | 0.6 | | | | | |
|---|---|---|---|---|---|---|---|
| | OBH | 62 | | | | | |
| | WL | 405 | | 365.5 | | 436 | |
| SURF | RADIUS | THICKNESS | MATERIAL | INDEX1 | INDEX2 | INDEX3 | SEMIDIAM. |
| 0 | 0.000000 | 36.200602 | | | | | 62.0 |
| 1 | 171.518544 | 32.339567 | FK5 | 1.498902 | 1.503934 | 1.495918 | 69.8 |
| 2 | −317.786104 | 79.008130 | | | | | 69.3 |

TABLE 6-continued

| | | | | | | | |
|---|---|---|---|---|---|---|---|
| 3 | −147.047114 | 9.999748 | FK5 | 1.498902 | 1.503934 | 1.495918 | 55.1 |
| 4 | 342.405051 | 20.144647 | | | | | 55.5 |
| 5 | −140.400996 | 11.668079 | FK5 | 1.498902 | 1.503934 | 1.495918 | 55.9 |
| 6 | 557.807949 | 37.480362 | | | | | 62.1 |
| 7 | −682.419001 | 28.287548 | FK5 | 1.498902 | 1.503934 | 1.495918 | 75.6 |
| 8 | −158.158201 | 0.999647 | | | | | 79.5 |
| 9 | 2791.087463 | 36.298237 | FK5 | 1.498902 | 1.503934 | 1.495918 | 85.4 |
| 10 | −163.612629 | 0.999498 | | | | | 86.9 |
| 11 | 163.587527 | 34.932650 | FK5 | 1.498902 | 1.503934 | 1.495918 | 83.0 |
| 12 | −1411.005987 | 6.407633 | | | | | 80.6 |
| 13 | 77.014420 | 17.848764 | LF5 | 1.606590 | 1.619068 | 1.599610 | 63.3 |
| 14 | 74.562204 | 75.241594 | | | | | 56.1 |
| 15 | 1709.016613 | 9.999818 | FK5 | 1.498902 | 1.503934 | 1.495918 | 33.0 |
| 16 | 86.348889 | 19.951833 | | | | | 34.2 |
| 17 | −115.135799 | 18.126817 | FK5 | 1.498902 | 1.503934 | 1.495918 | 36.7 |
| 18 | −84.865845 | 86.519899 | | | | | 41.5 |
| 19 | 19952.065163 | 33.257664 | CAFUV | 1.441484 | 1.444863 | 1.439477 | 67.2 |
| 20 | −114.476351 | 0.999646 | | | | | 69.0 |
| 21 | −269.872351 | 20.702731 | LF5 | 1.606590 | 1.619068 | 1.599610 | 68.2 |
| 22 | −138.267238 | 97.475014 | | | | | 69.5 |
| 23 | 0.000000 | −71.735184 | REFL | | | | 50.9 |
| 24 | −245.337556 | −29.999844 | CAFUV | 1.441484 | 1.444863 | 1.439477 | 61.3 |
| 25 | 333.850389 | −296.940370 | | | | | 62.3 |
| 26 | 137.245344 | −15.000000 | SILUV | 1.469595 | 1.474477 | 1.466705 | 63.0 |
| 27 | 1268.305030 | −29.114799 | | | | | 67.6 |
| 28 | 132.293526 | −15.000000 | FK5 | 1.498902 | 1.503934 | 1.495918 | 70.7 |
| 29 | 435.521613 | −64.440722 | | | | | 85.3 |
| 30 | 216.777334 | 64.440722 | REFL | | | | 115.7 |
| 31 | 435.521613 | 15.000000 | FK5 | 1.498902 | 1.503934 | 1.495918 | 94.0 |
| 32 | 132.293526 | 29.114799 | | | | | 80.7 |
| 33 | 1268.305030 | 15.000000 | SILUV | 1.469595 | 1.474477 | 1.466705 | 79.6 |
| 34 | 137.245344 | 296.940370 | | | | | 72.8 |
| 35 | 333.850389 | 29.999844 | CAFUV | 1.441484 | 1.444863 | 1.439477 | 67.9 |
| 36 | −245.337556 | 71.735184 | | | | | 66.8 |
| 37 | 0.000000 | −93.381314 | REFL | | | | 50.5 |
| 38 | −107.581987 | −42.025300 | SILUV | 1.469595 | 1.474477 | 1.466705 | 64.5 |
| 39 | 247.652865 | −0.999459 | | | | | 63.2 |
| 40 | −365.522301 | −9.999229 | LF5 | 1.606590 | 1.619068 | 1.599610 | 59.3 |
| 41 | −156.785496 | −27.775457 | | | | | 55.7 |
| 42 | 215.516764 | −9.999346 | LF5 | 1.606590 | 1.619068 | 1.599610 | 54.1 |
| 43 | −186.416544 | −28.697629 | | | | | 54.3 |
| 44 | −3995.126063 | −21.876902 | FK5 | 1.498902 | 1.503934 | 1.495918 | 58.7 |
| 45 | 162.926370 | −12.599437 | | | | | 60.0 |
| 46 | 99.826076 | −15.000424 | SILUV | 1.469595 | 1.474477 | 1.466705 | 60.0 |
| 47 | 153.618881 | −144.443627 | | | | | 64.8 |
| 48 | −186.191390 | −23.831946 | CAFUV | 1.441484 | 1.444863 | 1.439477 | 87.4 |
| 49 | −476.244153 | −42.228444 | | | | | 86.6 |
| 50 | −413.374893 | −36.176646 | CAFUV | 1.441484 | 1.444863 | 1.439477 | 85.2 |
| 51 | 214.495806 | −5.020862 | | | | | 84.4 |
| 52 | 201.213917 | −19.999607 | LF5 | 1.606590 | 1.619068 | 1.599610 | 83.4 |
| 53 | 358.671343 | 29.882770 | | | | | 86.1 |
| 54 | 0.000000 | −58.991901 | | | | | 85.9 |
| 55 | −301.790975 | −29.667431 | SILUV | 1.469595 | 1.474477 | 1.466705 | 86.7 |
| 56 | 640.247261 | −0.998732 | | | | | 85.4 |
| 57 | −111.315063 | −77.785400 | LF5 | 1.606590 | 1.619068 | 1.599610 | 81.6 |
| 58 | −111.070627 | −1.047719 | | | | | 57.1 |
| 59 | −91.910863 | −11.770454 | LF5 | 1.606590 | 1.619068 | 1.599610 | 55.9 |
| 60 | −58.089956 | −8.095749 | | | | | 47.6 |
| 61 | −61.321099 | −42.499546 | CAFUV | 1.441484 | 1.444863 | 1.439477 | 47.4 |
| 62 | 290.536721 | −0.999509 | | | | | 41.6 |
| 63 | −425.141129 | −36.248294 | LF5 | 1.606590 | 1.619068 | 1.599610 | 37.8 |
| 64 | −5184.051745 | −2.053661 | | | | | 23.8 |
| 65 | 0.000000 | −5.000000 | SILUV | 1.469595 | 1.474477 | 1.466705 | 22.3 |
| 66 | 0.000000 | −6.000000 | | | | | 20.0 |
| 67 | 0.000000 | 0.000000 | | | | | 15.5 |

TABLE 6A

Aspheric Constants

| SRF | 1 | 6 | 21 | 24 | 29 |
|---|---|---|---|---|---|
| K | 0 | 0 | 0 | 0 | 0 |
| C1 | 7.821851E−09 | 2.019984E−07 | −8.707918E−08 | 1.672282E−08 | 1.350610E−08 |
| C2 | −4.052293E−12 | −1.334213E−11 | −1.886222E−12 | −3.595586E−13 | −2.922381E−13 |

TABLE 6A-continued

Aspheric Constants

| | | | | | |
|---|---|---|---|---|---|
| C3 | 3.821805E−16 | −9.167908E−16 | 2.097888E−18 | 1.743202E−17 | 7.887008E−18 |
| C4 | −3.079520E−20 | 1.911693E−19 | −2.628100E−20 | 4.201755E−22 | −1.332483E−21 |
| C5 | 1.934159E−24 | −1.067121E−23 | 4.098044E−24 | 7.233906E−25 | 1.160768E−25 |
| C6 | −7.115391E−29 | 1.595763E−28 | −3.598416E−28 | −8.373187E−29 | −1.934082E−30 |

| | SRF | | | | |
|---|---|---|---|---|---|
| | 31 | 36 | 38 | 56 | 58 |
| K | 0 | 0 | 0 | 0 | 0 |
| C1 | 1.350610E−08 | 1.672282E−08 | 9.769778E−08 | −6.550682E−08 | 9.791014E−09 |
| C2 | −2.922381E−13 | −3.595586E−13 | 3.453391E−12 | −1.560644E−13 | −7.781176E−12 |
| C3 | 7.887008E−18 | 1.743202E−17 | 2.976442E−16 | −5.817328E−17 | −9.884985E−17 |
| C4 | −1.332483E−21 | 4.201755E−22 | 1.726040E−20 | −2.712719E−21 | 6.888650E−21 |
| C5 | 1.160768E−25 | 7.233906E−25 | −6.147409E−26 | 1.429099E−25 | 6.352680E−24 |
| C6 | −1.934082E−30 | −8.373187E−29 | 1.933603E−28 | −4.115515E−29 | −1.260629E−28 |

TABLE 7

| | NA | 0.6 | | | | |
|---|---|---|---|---|---|---|
| | OBH | 62 | | | | |
| | WL | 405 | | 365.5 | | 436 |

| SURF | RADIUS | THICKNESS | MATERIAL | INDEX1 | INDEX2 | INDEX3 | SEMIDIAM. |
|---|---|---|---|---|---|---|---|
| 0 | 0.000000 | 34.808993 | | | | | 62.0 |
| 1 | 170.953570 | 48.314819 | FK5 | 1.498902 | 1.503934 | 1.495918 | 69.6 |
| 2 | −348.563652 | 76.127192 | | | | | 68.1 |
| 3 | −121.551034 | 9.999796 | FK5 | 1.498902 | 1.503934 | 1.495918 | 55.0 |
| 4 | 390.647960 | 20.425620 | | | | | 56.4 |
| 5 | −137.936653 | 18.688128 | FK5 | 1.498902 | 1.503934 | 1.495918 | 57.0 |
| 6 | 1839.684661 | 31.593236 | | | | | 65.7 |
| 7 | −1016.867210 | 29.294191 | FK5 | 1.498902 | 1.503934 | 1.495918 | 78.5 |
| 8 | −162.136440 | 0.999636 | | | | | 82.1 |
| 9 | 4389.236277 | 36.772688 | FK5 | 1.498902 | 1.503934 | 1.495918 | 88.1 |
| 10 | −168.369436 | 0.999530 | | | | | 89.7 |
| 11 | 175.091671 | 35.550265 | FK5 | 1.498902 | 1.503934 | 1.495918 | 86.1 |
| 12 | −1214.508467 | 0.999763 | | | | | 83.8 |
| 13 | 81.914223 | 27.014446 | LF5 | 1.606590 | 1.619068 | 1.599610 | 67.9 |
| 14 | 72.400375 | 51.756442 | | | | | 55.7 |
| 15 | 271.721751 | 52.860899 | FK5 | 1.498902 | 1.503934 | 1.495918 | 41.6 |
| 16 | 82.426550 | 25.551029 | | | | | 33.3 |
| 17 | −92.405936 | 26.193583 | FK5 | 1.498902 | 1.503934 | 1.495918 | 36.9 |
| 18 | −78.985036 | 51.966934 | | | | | 44.4 |
| 19 | 736.381190 | 40.572456 | SILUV | 1.469595 | 1.474477 | 1.466705 | 60.1 |
| 20 | −109.010821 | 0.999212 | | | | | 62.5 |
| 21 | −234.728770 | 16.781333 | LF5 | 1.606590 | 1.619068 | 1.599610 | 60.9 |
| 22 | −146.225510 | 76.172833 | | | | | 61.6 |
| 23 | 0.000000 | −66.560378 | REFL | | | | 47.7 |
| 24 | −299.050945 | −30.000133 | SILUV | 1.469595 | 1.474477 | 1.466705 | 57.7 |
| 25 | 323.230184 | −319.705713 | | | | | 59.3 |
| 26 | 135.177370 | −15.000000 | SILUV | 1.469595 | 1.474477 | 1.466705 | 69.1 |
| 27 | 766.049320 | −29.585170 | | | | | 75.3 |
| 28 | 142.363008 | −15.000000 | FK5 | 1.498902 | 1.503934 | 1.495918 | 79.4 |
| 29 | 487.000553 | −63.633859 | | | | | 95.8 |
| 30 | 223.534072 | 63.633859 | REFL | | | | 124.3 |
| 31 | 487.000553 | 15.000000 | FK5 | 1.498902 | 1.503934 | 1.495918 | 103.0 |
| 32 | 142.363008 | 29.585170 | | | | | 88.0 |
| 33 | 766.049320 | 15.000000 | SILUV | 1.469595 | 1.474477 | 1.466705 | 86.7 |
| 34 | 135.177370 | 319.705713 | | | | | 78.2 |
| 35 | 323.230184 | 30.000133 | SILUV | 1.469595 | 1.474477 | 1.466705 | 65.1 |
| 36 | −299.050945 | 66.560378 | | | | | 63.5 |
| 37 | 0.000000 | −103.992166 | REFL | | | | 48.2 |
| 38 | −103.786383 | −42.306734 | SILUV | 1.469595 | 1.474477 | 1.466705 | 63.4 |
| 39 | 228.514801 | −0.999313 | | | | | 62.2 |
| 40 | −220.182594 | −9.999287 | LF5 | 1.606590 | 1.619068 | 1.599610 | 57.5 |
| 41 | −110.370872 | −28.069207 | | | | | 53.2 |
| 42 | 138.302084 | −9.999765 | LF5 | 1.606590 | 1.619068 | 1.599610 | 52.7 |
| 43 | −213.235355 | −9.705758 | | | | | 55.0 |
| 44 | −1047.828065 | −23.921683 | FK5 | 1.498902 | 1.503934 | 1.495918 | 56.3 |
| 45 | 142.824452 | −9.454040 | | | | | 58.2 |
| 46 | 104.729965 | −19.886717 | SILUV | 1.469595 | 1.474477 | 1.466705 | 58.5 |
| 47 | 140.641782 | −104.824622 | | | | | 64.1 |
| 48 | −169.227381 | −16.128099 | SILUV | 1.469595 | 1.474477 | 1.466705 | 83.4 |
| 49 | −222.667961 | −105.563157 | | | | | 82.5 |

TABLE 7-continued

| | | | | | | | |
|---|---|---|---|---|---|---|---|
| 50 | 0.000000 | 21.631658 | | | | | 87.1 |
| 51 | −248.029065 | −44.545250 | SILUV | 1.469595 | 1.474477 | 1.466705 | 86.8 |
| 52 | 205.620581 | −5.466712 | | | | | 86.0 |
| 53 | 189.539651 | −20.000871 | LF5 | 1.606590 | 1.619068 | 1.599610 | 85.3 |
| 54 | 360.155646 | −38.897623 | | | | | 88.2 |
| 55 | −290.846282 | −33.599052 | SILUV | 1.469595 | 1.474477 | 1.466705 | 88.7 |
| 56 | 436.910026 | −0.998269 | | | | | 87.2 |
| 57 | −107.156836 | −82.856699 | LF5 | 1.606590 | 1.619068 | 1.599610 | 80.9 |
| 58 | −131.854211 | −4.919893 | | | | | 53.9 |
| 59 | −133.325829 | −9.999244 | LF5 | 1.606590 | 1.619068 | 1.599610 | 52.0 |
| 60 | −53.333982 | −7.270691 | | | | | 42.6 |
| 61 | −55.970923 | −33.068995 | SILUV | 1.469595 | 1.474477 | 1.466705 | 42.3 |
| 62 | 205.125551 | −0.990514 | | | | | 38.8 |
| 63 | −2418.727152 | −26.895913 | LF5 | 1.606590 | 1.619068 | 1.599610 | 35.0 |
| 64 | −1099.461984 | −2.248719 | | | | | 23.8 |
| 65 | 0.000000 | −5.000000 | SILUV | 1.469595 | 1.474477 | 1.466705 | 22.3 |
| 66 | 0.000000 | −6.000000 | | | | | 20.0 |
| 67 | 0.000000 | 0.000000 | | | | | 15.5 |

TABLE 7A

Aspheric Constants

| | SRF | | | | |
|---|---|---|---|---|---|
| | 1 | 10 | 25 | 28 | 37 |
| K | 0 | 0 | 0 | 0 | 0 |
| C1 | −2.114185E−08 | 1.054702E−07 | −4.275135E−08 | 3.021420E−08 | 4.868775E−08 |
| C2 | −1.750724E−12 | −3.764752E−13 | −1.372984E−12 | −1.683656E−13 | −5.672263E−13 |
| C3 | 1.274243E−16 | −3.742119E−16 | 1.762178E−17 | −8.145104E−18 | 9.474618E−17 |
| C4 | −1.457299E−20 | −9.898545E−20 | −2.356683E−20 | 8.879145E−21 | −2.107717E−21 |
| C5 | 1.135473E−24 | −2.100825E−24 | 5.272291E−24 | −1.554926E−24 | 8.157939E−26 |
| C6 | −4.050698E−29 | −1.945638E−27 | −5.662110E−28 | 1.021591E−28 | 1.338073E−29 |

| | SRF | | | | |
|---|---|---|---|---|---|
| | 39 | 48 | 50 | 68 | 70 |
| K | 0 | 0 | 0 | 0 | 0 |
| C1 | 4.868775E−08 | 3.021420E−08 | 1.900388E−08 | −5.250831E−08 | 1.468736E−08 |
| C2 | −5.672263E−13 | −1.683656E−13 | 3.608771E−13 | −9.201980E−13 | −3.031829E−12 |
| C3 | 9.474618E−17 | −8.145104E−18 | −5.270168E−17 | −1.540202E−17 | −1.306691E−15 |
| C4 | −2.107717E−21 | 8.879145E−21 | 2.365395E−20 | −4.940151E−21 | 1.417316E−19 |
| C5 | 8.157939E−26 | −1.554926E−24 | −6.443516E−24 | 3.358184E−25 | −1.951105E−23 |
| C6 | 1.338073E−29 | 1.021591E−28 | 7.466478E−28 | −3.228554E−29 | 1.556934E−27 |

TABLE 8

| NA | 0.6 | | | | | | |
|---|---|---|---|---|---|---|---|
| OBH | 62 | | | | | | |
| WL | 405 | | 360 | 370 | 436 | | |

| SURF | RADIUS | THICKNESS | MATERIAL | INDEX1 | INDEX2 | INDEX3 | INDEX4 | SEMIDIAM. |
|---|---|---|---|---|---|---|---|---|
| 0 | 0.000000 | 44.811170 | | | | | | 62.0 |
| 1 | 210.182433 | 30.174472 | FK5 | 1.498902 | 1.504780 | 1.503272 | 1.495918 | 70.7 |
| 2 | −326.391489 | 88.409321 | | | | | | 70.5 |
| 3 | −130.618974 | 9.999831 | FK5 | 1.498902 | 1.504780 | 1.503272 | 1.495918 | 58.2 |
| 4 | 267.126803 | 19.554220 | | | | | | 60.3 |
| 5 | −220.570364 | 9.999316 | FK5 | 1.498902 | 1.504780 | 1.503272 | 1.495918 | 61.2 |
| 6 | −1327.710736 | 47.668085 | | | | | | 66.0 |
| 7 | −1284.621428 | 39.185850 | FK5 | 1.498902 | 1.504780 | 1.503272 | 1.495918 | 85.3 |
| 8 | −137.855924 | 0.999817 | | | | | | 88.3 |
| 9 | 487.178102 | 33.104977 | FK5 | 1.498902 | 1.504780 | 1.503272 | 1.495918 | 91.2 |
| 10 | −293.325530 | 1.000628 | | | | | | 91.0 |
| 11 | 105.926259 | 43.802410 | FK5 | 1.498902 | 1.504780 | 1.503272 | 1.495918 | 80.6 |
| 12 | 324.516337 | 1.015188 | | | | | | 73.5 |
| 13 | 118.963359 | 29.431556 | LF5 | 1.606590 | 1.621262 | 1.617371 | 1.599610 | 65.9 |
| 14 | 108.340385 | 31.172710 | | | | | | 51.7 |
| 15 | 1396.105980 | 23.321303 | FK5 | 1.498902 | 1.504780 | 1.503272 | 1.495918 | 38.9 |
| 16 | 71.044081 | 51.368380 | | | | | | 27.7 |
| 17 | −126.060484 | 41.789099 | FK5 | 1.498902 | 1.504780 | 1.503272 | 1.495918 | 41.1 |
| 18 | −99.403845 | 22.583650 | | | | | | 52.7 |
| 19 | 857.805509 | 74.427244 | CAFUV | 1.441484 | 1.445430 | 1.444419 | 1.439477 | 61.4 |

TABLE 8-continued

| | | | | | | | | |
|---|---|---|---|---|---|---|---|---|
| 20 | −122.114606 | 5.533749 | | | | | | 67.9 |
| 21 | −209.762399 | 16.947254 | LF5 | 1.606590 | 1.621262 | 1.617371 | 1.599610 | 66.4 |
| 22 | −146.253848 | 70.999492 | | | | | | 67.7 |
| 23 | 0.000000 | −63.249129 | REFL | | | | | 55.7 |
| 24 | −208.552769 | −29.999696 | CAFUV | 1.441484 | 1.445430 | 1.444419 | 1.439477 | 61.6 |
| 25 | 424.428567 | −324.827916 | | | | | | 62.2 |
| 26 | 139.396378 | −15.000000 | SILUV | 1.469595 | 1.475299 | 1.473834 | 1.466705 | 59.9 |
| 27 | 625.984557 | −25.225350 | | | | | | 66.1 |
| 28 | 135.274526 | −15.000000 | FK5 | 1.498902 | 1.504780 | 1.503272 | 1.495918 | 70.5 |
| 29 | 456.048088 | −54.202821 | | | | | | 84.4 |
| 30 | 212.790280 | 54.202821 | REFL | | | | | 108.3 |
| 31 | 456.048088 | 15.000000 | FK5 | 1.498902 | 1.504780 | 1.503272 | 1.495918 | 92.1 |
| 32 | 135.274526 | 25.225350 | | | | | | 80.1 |
| 33 | 625.984557 | 15.000000 | SILUV | 1.469595 | 1.475299 | 1.473834 | 1.466705 | 79.2 |
| 34 | 139.396378 | 324.827916 | | | | | | 73.1 |
| 35 | 424.428567 | 29.999696 | CAFUV | 1.441484 | 1.445430 | 1.444419 | 1.439477 | 69.2 |
| 36 | −208.552769 | 63.249129 | | | | | | 68.4 |
| 37 | 0.000000 | −75.015181 | REFL | | | | | 53.8 |
| 38 | −102.357875 | −40.431118 | FK5 | 1.498902 | 1.504780 | 1.503272 | 1.495918 | 63.3 |
| 39 | 310.580801 | −1.000180 | | | | | | 61.5 |
| 40 | −1464.052553 | −10.066792 | LF5 | 1.606590 | 1.621262 | 1.617371 | 1.599610 | 58.8 |
| 41 | −119.074302 | −65.705900 | | | | | | 54.3 |
| 42 | 252.233957 | −10.774655 | LF5 | 1.606590 | 1.621262 | 1.617371 | 1.599610 | 52.7 |
| 43 | −237.924629 | −12.657002 | | | | | | 54.1 |
| 44 | −982.309305 | −24.602972 | CAFUV | 1.441484 | 1.445430 | 1.444419 | 1.439477 | 56.1 |
| 45 | 134.357661 | −9.844974 | | | | | | 57.7 |
| 46 | 97.826963 | −17.230429 | FK5 | 1.498902 | 1.504780 | 1.503272 | 1.495918 | 57.7 |
| 47 | 168.004193 | −87.239672 | | | | | | 63.4 |
| 48 | −175.762982 | −25.893749 | CAFUV | 1.441484 | 1.445430 | 1.444419 | 1.439477 | 82.9 |
| 49 | −699.027803 | −17.210584 | | | | | | 82.3 |
| 50 | −149743.474739 | −29.904546 | CAFUV | 1.441484 | 1.445430 | 1.444419 | 1.439477 | 81.9 |
| 51 | 177.810695 | −4.217914 | | | | | | 81.7 |
| 52 | 171.401135 | −15.000047 | LLF1 | 1.569035 | 1.580929 | 1.577796 | 1.563301 | 80.5 |
| 53 | 384.037176 | −34.560433 | | | | | | 81.3 |
| 54 | 0.000000 | −36.090269 | | | | | | 77.8 |
| 55 | −275.985796 | −34.854093 | SILUV | 1.469595 | 1.475299 | 1.473834 | 1.466705 | 85.0 |
| 56 | 366.768308 | −0.999932 | | | | | | 84.9 |
| 57 | −122.626193 | −68.301753 | LLF1 | 1.569035 | 1.580929 | 1.577796 | 1.563301 | 83.4 |
| 58 | −153.700052 | −0.999887 | | | | | | 66.1 |
| 59 | −112.945765 | −17.455396 | LLF1 | 1.569035 | 1.580929 | 1.577796 | 1.563301 | 65.1 |
| 60 | −74.284310 | −5.894701 | | | | | | 56.6 |
| 61 | −78.256214 | −41.228121 | CAFUV | 1.441484 | 1.445430 | 1.444419 | 1.439477 | 56.7 |
| 62 | 276.325888 | −1.000199 | | | | | | 53.4 |
| 63 | −269.254473 | −61.769289 | LLF1 | 1.569035 | 1.580929 | 1.577796 | 1.563301 | 47.5 |
| 64 | 3062.914635 | −1.999421 | | | | | | 23.9 |
| 65 | 0.000000 | −5.000000 | SILUV | 1.469595 | 1.475299 | 1.473834 | 1.466705 | 22.3 |
| 66 | 0.000000 | −6.000000 | | | | | | 20.0 |
| 67 | 0.000000 | 0.000000 | | | | | | 15.5 |

TABLE 8A

Aspheric Constants

| | SRF | | | | |
|---|---|---|---|---|---|
| | 1 | 6 | 21 | 24 | 29 |
| K | 0 | 0 | 0 | 0 | 0 |
| C1 | 1.862046E−08 | 1.365542E−07 | −7.395316E−08 | 1.970356E−08 | 9.523709E−09 |
| C2 | −2.828954E−12 | −2.458877E−12 | −2.209504E−12 | 5.033917E−14 | −1.069547E−13 |
| C3 | 2.151571E−16 | −5.576839E−16 | −2.590830E−18 | 3.242161E−17 | −4.405911E−17 |
| C4 | −1.753914E−20 | −1.015221E−20 | −2.666927E−20 | −5.485376E−21 | 7.942019E−21 |
| C5 | 1.937299E−24 | 6.091438E−24 | 4.049751E−24 | 9.280815E−25 | −7.143343E−25 |
| C6 | −1.158966E−28 | −2.884858E−28 | −3.738732E−28 | −6.499681E−29 | 2.799653E−29 |

| | SRF | | | | |
|---|---|---|---|---|---|
| | 31 | 36 | 38 | 56 | 58 |
| K | 0 | 0 | 0 | 0 | 0 |
| C1 | 9.523709E−09 | 1.970356E−08 | 9.873859E−08 | −5.846436E−08 | −6.029739E−08 |
| C2 | −1.069547E−13 | 5.033917E−14 | 5.158775E−12 | −8.519802E−13 | −5.656839E−12 |
| C3 | −4.405911E−17 | 3.242161E−17 | 3.420249E−16 | 1.039592E−17 | 4.131463E−16 |
| C4 | 7.942019E−21 | −5.485376E−21 | 4.395630E−20 | −1.484379E−20 | −1.406823E−19 |
| C5 | −7.143343E−25 | 9.280815E−25 | −7.030301E−25 | 1.237068E−24 | 2.390138E−23 |
| C6 | 2.799653E−29 | −6.499681E−29 | 3.152174E−28 | −7.465268E−29 | −1.707603E−27 |

TABLE 9

| | NA | 0.8 | | | |
|---|---|---|---|---|---|
| | OBH | 62 | | | |
| | WL | 365.5 | 363 | | 368 |

| SURF | RADIUS | THICKNESS | MATERIAL | INDEX1 | INDEX2 | INDEX3 | SEMIDIAM. |
|---|---|---|---|---|---|---|---|
| 0 | 0.000000 | 42.281274 | | | | | 62.0 |
| 1 | 166.908129 | 34.871030 | FK5 | 1.503934 | 1.504313 | 1.503563 | 74.1 |
| 2 | −341.893289 | 0.999918 | | | | | 73.8 |
| 3 | 131.686316 | 35.947291 | LLF1 | 1.579164 | 1.579953 | 1.578396 | 69.3 |
| 4 | 107.532111 | 30.309772 | | | | | 58.7 |
| 5 | −195.556850 | 9.999800 | FK5 | 1.503934 | 1.504313 | 1.503563 | 58.2 |
| 6 | 112.709650 | 26.612732 | | | | | 58.7 |
| 7 | −382.031523 | 30.093650 | FK5 | 1.503934 | 1.504313 | 1.503563 | 60.8 |
| 8 | −330.495973 | 13.081852 | | | | | 70.2 |
| 9 | 528.171459 | 47.830904 | FK5 | 1.503934 | 1.504313 | 1.503563 | 81.2 |
| 10 | −126.002394 | 0.990028 | | | | | 83.4 |
| 11 | 105.174708 | 94.034451 | LF5 | 1.619068 | 1.620048 | 1.618115 | 77.0 |
| 12 | 292.344324 | 21.869742 | | | | | 49.7 |
| 13 | −234.084742 | 9.993574 | LF5 | 1.619068 | 1.620048 | 1.618115 | 41.2 |
| 14 | 111.571995 | 10.348907 | | | | | 36.6 |
| 15 | −4730.475364 | 16.938839 | FK5 | 1.503934 | 1.504313 | 1.503563 | 38.9 |
| 16 | −130.801477 | 33.406348 | | | | | 42.5 |
| 17 | −122.494260 | 16.927788 | CAFUV | 1.444863 | 1.445117 | 1.444614 | 52.8 |
| 18 | −91.730678 | 44.231022 | | | | | 56.6 |
| 19 | −866.948845 | 33.656774 | CAFUV | 1.444863 | 1.445117 | 1.444614 | 71.7 |
| 20 | −115.085426 | 4.628809 | | | | | 73.6 |
| 21 | −349.685621 | 20.995629 | LF5 | 1.619068 | 1.620048 | 1.618115 | 72.0 |
| 22 | −163.782660 | 107.526737 | | | | | 72.9 |
| 23 | 0.000000 | −55.573674 | REFL | | | | 54.6 |
| 24 | −154.658152 | −29.626090 | CAFUV | 1.444863 | 1.445117 | 1.444614 | 65.6 |
| 25 | 572.342589 | −288.913729 | | | | | 66.3 |
| 26 | 110.160044 | −15.000000 | SILUV | 1.474477 | 1.474845 | 1.474117 | 74.0 |
| 27 | 1661.316293 | −30.266996 | | | | | 87.2 |
| 28 | 158.023919 | −15.000000 | FK5 | 1.503934 | 1.504313 | 1.503563 | 89.5 |
| 29 | 461.458850 | −36.803870 | | | | | 105.7 |
| 30 | 184.050543 | 36.803870 | REFL | | | | 114.4 |
| 31 | 461.458850 | 15.000000 | FK5 | 1.503934 | 1.504313 | 1.503563 | 105.3 |
| 32 | 158.023919 | 30.266996 | | | | | 90.4 |
| 33 | 1661.316293 | 15.000000 | SILUV | 1.474477 | 1.474845 | 1.474117 | 88.7 |
| 34 | 110.160044 | 288.913729 | | | | | 76.0 |
| 35 | 572.342589 | 29.626090 | CAFUV | 1.444863 | 1.445117 | 1.444614 | 69.8 |
| 36 | −154.658152 | 55.573674 | | | | | 69.3 |
| 37 | 0.000000 | −102.983229 | REFL | | | | 52.9 |
| 38 | −102.461599 | −43.346204 | SILUV | 1.474477 | 1.474845 | 1.474117 | 71.4 |
| 39 | 800.608314 | −0.999940 | | | | | 69.8 |
| 40 | −187.732221 | −10.035239 | LF5 | 1.619068 | 1.620048 | 1.618115 | 66.3 |
| 41 | −116.181870 | −28.943519 | | | | | 61.9 |
| 42 | 272.293629 | −10.394818 | LF5 | 1.619068 | 1.620048 | 1.618115 | 61.6 |
| 43 | −152.134293 | −20.260151 | | | | | 62.9 |
| 44 | −1759.716053 | −78.616687 | LLF1 | 1.579164 | 1.579953 | 1.578396 | 66.2 |
| 45 | 225.871084 | −20.423140 | | | | | 80.8 |
| 46 | 121.303195 | −20.000179 | SILUV | 1.474477 | 1.474845 | 1.474117 | 81.4 |
| 47 | 151.175562 | −25.512299 | | | | | 89.5 |
| 48 | −181.315542 | −18.873440 | CAFUV | 1.444863 | 1.445117 | 1.444614 | 109.0 |
| 49 | −225.795277 | −79.146460 | | | | | 108.0 |
| 50 | −229.348186 | −68.605482 | CAFUV | 1.444863 | 1.445117 | 1.444614 | 116.8 |
| 51 | 265.046380 | −5.694596 | | | | | 115.7 |
| 52 | 243.482530 | −14.992693 | LF5 | 1.619068 | 1.620048 | 1.618115 | 113.9 |
| 53 | 927.754944 | −20.172540 | | | | | 113.1 |
| 54 | 0.000000 | −10.314431 | | | | | 110.0 |
| 55 | −228.338073 | −51.669046 | SILUV | 1.474477 | 1.474845 | 1.474117 | 112.6 |
| 56 | 642.206527 | −0.999876 | | | | | 110.6 |
| 57 | −154.052849 | −32.638805 | LF5 | 1.619068 | 1.620048 | 1.618115 | 100.6 |
| 58 | −355.383378 | −8.665973 | | | | | 94.9 |
| 59 | −103.705135 | −18.674690 | LF5 | 1.619068 | 1.620048 | 1.618115 | 81.9 |
| 60 | −77.782031 | −7.387778 | | | | | 68.5 |
| 61 | −79.458605 | −77.668297 | CAFUV | 1.444863 | 1.445117 | 1.444614 | 67.5 |
| 62 | −1050.909172 | −1.243784 | | | | | 44.3 |
| 63 | −224.928327 | −21.310075 | FK5 | 1.503934 | 1.504313 | 1.503563 | 40.6 |
| 64 | 1305.278413 | −1.998158 | | | | | 30.0 |
| 65 | 0.000000 | −5.000000 | SILUV | 1.474477 | 1.474845 | 1.474117 | 26.8 |
| 66 | 0.000000 | −6.000000 | | | | | 23.6 |
| 67 | 0.000000 | 0.000000 | | | | | 15.5 |

TABLE 9A

Aspheric Constants

| SRF | 1 | 8 | 21 | 24 | 29 |
|---|---|---|---|---|---|
| K | 0 | 0 | 0 | 0 | 0 |
| C1 | −1.069190E−08 | 9.416541E−08 | −4.595192E−08 | 3.727563E−08 | 2.192364E−08 |
| C2 | −1.399566E−12 | 2.525251E−12 | −1.284346E−12 | 2.351610E−13 | −4.594443E−13 |
| C3 | 2.336566E−17 | −4.301671E−17 | 2.845285E−17 | 1.072476E−16 | 2.242516E−17 |
| C4 | −4.113735E−21 | −3.682918E−20 | −1.667194E−20 | −2.008136E−20 | −8.023095E−22 |
| C5 | 2.551561E−25 | −9.663120E−25 | 2.424974E−24 | 3.511793E−24 | 2.390197E−26 |
| C6 | −1.622700E−29 | −3.447128E−28 | −1.780620E−28 | −2.459834E−28 | −4.678263E−31 |

| SRF | 31 | 36 | 38 | 56 | 58 |
|---|---|---|---|---|---|
| K | 0 | 0 | 0 | 0 | 0 |
| C1 | 2.192364E−08 | 3.727563E−08 | 8.350902E−08 | 9.823458E−09 | −8.214838E−08 |
| C2 | −4.594443E−13 | 2.351610E−13 | 4.809445E−12 | −4.162035E−12 | 5.487551E−12 |
| C3 | 2.242516E−17 | 1.072476E−16 | 2.268610E−16 | 2.899377E−16 | −6.017095E−16 |
| C4 | −8.023095E−22 | −2.008136E−20 | 3.941727E−20 | −1.644217E−20 | 4.538588E−20 |
| C5 | 2.390197E−26 | 3.511793E−24 | −1.253329E−24 | 5.972180E−25 | −2.358426E−24 |
| C6 | −4.678263E−31 | −2.459834E−28 | 4.149074E−28 | −1.129886E−29 | 6.188033E−29 |

TABLE 10

| | | | | | | | |
|---|---|---|---|---|---|---|---|
| NA | | 0.6 | | | | | |
| OBH | | 62 | | | | | |
| WL | | 405 | | 365.5 | | 436 | |

| SURF | RADIUS | THICKNESS | MATERIAL | INDEX1 | INDEX2 | INDEX3 | SEMIDIAM. |
|---|---|---|---|---|---|---|---|
| 0 | 0.000000 | 30.999411 | | | | | 62.0 |
| 1 | 160.049940 | 28.873463 | CAFUV | 1.441484 | 1.444863 | 1.439477 | 69.0 |
| 2 | −612.800703 | 0.999346 | | | | | 68.7 |
| 3 | 562.651054 | 9.999487 | LF5 | 1.606590 | 1.619068 | 1.599610 | 67.8 |
| 4 | 124.936938 | 4.912088 | | | | | 65.2 |
| 5 | 133.737902 | 30.988506 | SILUV | 1.469595 | 1.474477 | 1.466705 | 66.1 |
| 6 | −610.136767 | 82.523616 | | | | | 65.6 |
| 7 | 5664.315171 | 10.019147 | FK5 | 1.498902 | 1.503934 | 1.495918 | 55.0 |
| 8 | 97.875194 | 12.798979 | | | | | 52.9 |
| 9 | 138.126408 | 13.783375 | FK5 | 1.498902 | 1.503934 | 1.495918 | 54.7 |
| 10 | 227.439334 | 35.032188 | | | | | 54.5 |
| 11 | −140.068683 | 10.450931 | LLF1 | 1.569035 | 1.579164 | 1.563301 | 56.6 |
| 12 | −177.688800 | 0.999944 | | | | | 59.6 |
| 13 | 473.598029 | 34.727404 | FK5 | 1.498902 | 1.503934 | 1.495918 | 62.4 |
| 14 | −139.868570 | 19.240488 | | | | | 63.5 |
| 15 | −1801.386070 | 10.050254 | FK5 | 1.498902 | 1.503934 | 1.495918 | 58.5 |
| 16 | 3294.618402 | 1.054855 | | | | | 57.5 |
| 17 | 80.335540 | 47.778166 | LF5 | 1.606590 | 1.619068 | 1.599610 | 54.8 |
| 18 | 68.155225 | 10.902616 | | | | | 39.5 |
| 19 | 133.649980 | 80.251715 | LLF1 | 1.569035 | 1.579164 | 1.563301 | 38.5 |
| 20 | 154.882915 | 55.279023 | | | | | 42.6 |
| 21 | −252.086079 | 20.530066 | FK5 | 1.498902 | 1.503934 | 1.495918 | 56.7 |
| 22 | −110.793858 | 14.517252 | | | | | 59.6 |
| 23 | 2813.840547 | 30.324966 | CAFUV | 1.441484 | 1.444863 | 1.439477 | 64.2 |
| 24 | −117.864605 | 0.999050 | | | | | 65.1 |
| 25 | −395.675659 | 12.899412 | LF5 | 1.606590 | 1.619068 | 1.599610 | 62.5 |
| 26 | −335.951936 | 116.084001 | | | | | 62.2 |
| 27 | 0.000000 | −65.130908 | REFL | | | | 50.3 |
| 28 | −242.480715 | −28.237391 | CAFUV | 1.441484 | 1.444863 | 1.439477 | 62.5 |
| 29 | 288.591213 | −2.780254 | | | | | 63.7 |
| 30 | −708.094923 | −19.844459 | LF5 | 1.606590 | 1.619068 | 1.599610 | 64.0 |
| 31 | −197.420763 | −2.401508 | | | | | 63.6 |
| 32 | −176.742702 | −34.902913 | CAFUV | 1.441484 | 1.444863 | 1.439477 | 64.3 |
| 33 | 840.762679 | −242.286700 | | | | | 64.4 |
| 34 | 112.979620 | −15.000000 | SILUV | 1.469595 | 1.474477 | 1.466705 | 58.0 |
| 35 | −346.487350 | −33.491143 | | | | | 64.2 |
| 36 | 159.571570 | −15.000000 | FK5 | 1.498902 | 1.503934 | 1.495918 | 69.2 |
| 37 | 464.555752 | −45.208278 | | | | | 82.6 |
| 38 | 179.131521 | 45.208278 | REFL | | | | 102.3 |
| 39 | 464.555752 | 15.000000 | FK5 | 1.498902 | 1.503934 | 1.495918 | 88.6 |
| 40 | 159.571570 | 33.491143 | | | | | 77.4 |
| 41 | −346.487350 | 15.000000 | SILUV | 1.469595 | 1.474477 | 1.466705 | 75.1 |
| 42 | 112.979620 | 242.286700 | | | | | 66.3 |

TABLE 10-continued

| | | | | | | | |
|---|---|---|---|---|---|---|---|
| 43 | 840.762679 | 34.902913 | CAFUV | 1.441484 | 1.444863 | 1.439477 | 73.8 |
| 44 | −176.742702 | 2.401508 | | | | | 73.8 |
| 45 | −197.420763 | 19.844459 | LF5 | 1.606590 | 1.619068 | 1.599610 | 72.7 |
| 46 | −708.094923 | 2.780254 | | | | | 73.3 |
| 47 | 288.591213 | 28.237391 | CAFUV | 1.441484 | 1.444863 | 1.439477 | 72.8 |
| 48 | −242.480715 | 65.130908 | | | | | 71.9 |
| 49 | 0.000000 | −109.174016 | REFL | | | | 54.2 |
| 50 | 444.534782 | −14.410283 | SILUV | 1.469595 | 1.474477 | 1.466705 | 56.3 |
| 51 | 556.321250 | −21.392174 | | | | | 58.3 |
| 52 | −197.721972 | −43.357955 | LF5 | 1.606590 | 1.619068 | 1.599610 | 63.3 |
| 53 | −406.898787 | −99.037117 | | | | | 61.8 |
| 54 | −359.291375 | −20.716603 | LF5 | 1.606590 | 1.619068 | 1.599610 | 64.5 |
| 55 | −201.379285 | −12.859452 | | | | | 63.2 |
| 56 | −1468.206088 | −18.746270 | FK5 | 1.498902 | 1.503934 | 1.495918 | 63.7 |
| 57 | 284.407201 | −17.054527 | | | | | 64.3 |
| 58 | 111.237525 | −15.013460 | SILUV | 1.469595 | 1.474477 | 1.466705 | 64.2 |
| 59 | 305.091626 | −3.499576 | | | | | 69.8 |
| 60 | −155.067381 | −19.151255 | CAFUV | 1.441484 | 1.444863 | 1.439477 | 75.7 |
| 61 | −272.458298 | −83.309836 | | | | | 75.2 |
| 62 | 0.000000 | 9.395386 | | | | | 79.4 |
| 63 | −3096.938214 | −23.798328 | CAFUV | 1.441484 | 1.444863 | 1.439477 | 78.9 |
| 64 | 251.532882 | −9.058033 | | | | | 79.2 |
| 65 | 186.412154 | −16.074626 | SILUV | 1.469595 | 1.474477 | 1.466705 | 79.3 |
| 66 | 220.346643 | −0.999405 | | | | | 83.4 |
| 67 | −601.395145 | −36.909051 | SILUV | 1.469595 | 1.474477 | 1.466705 | 87.1 |
| 68 | 210.054860 | −0.997007 | | | | | 88.0 |
| 69 | −128.898773 | −94.527249 | LF5 | 1.606590 | 1.619068 | 1.599610 | 85.9 |
| 70 | −120.282475 | −3.487284 | | | | | 59.8 |
| 71 | −99.777439 | −12.100203 | LF5 | 1.606590 | 1.619068 | 1.599610 | 58.6 |
| 72 | −68.345307 | −5.410149 | | | | | 52.1 |
| 73 | −71.199596 | −40.265588 | CAFUV | 1.441484 | 1.444863 | 1.439477 | 52.2 |
| 74 | 214.629531 | −0.999455 | | | | | 48.8 |
| 75 | −239.769691 | −46.991889 | LLF1 | 1.569035 | 1.579164 | 1.563301 | 42.5 |
| 76 | −825.534544 | −2.340391 | | | | | 23.8 |
| 77 | 0.000000 | −5.000000 | SILUV | 1.469595 | 1.474477 | 1.466705 | 22.3 |
| 78 | 0.000000 | −6.000000 | | | | | 20.0 |
| 79 | 0.000000 | 0.000000 | | | | | 15.5 |

TABLE 10A

Aspheric Constants

| | SRF | | | | |
|---|---|---|---|---|---|
| | 1 | 10 | 25 | 28 | 37 |
| K | 0 | 0 | 0 | 0 | 0 |
| C1 | −2.114185E−08 | 1.054702E−07 | −4.275135E−08 | 3.021420E−08 | 4.868775E−08 |
| C2 | −1.750724E−12 | −3.764752E−13 | −1.372984E−12 | −1.683656E−13 | −5.672263E−13 |
| C3 | 1.274243E−16 | −3.742119E−16 | 1.762178E−17 | −8.145104E−18 | 9.474618E−17 |
| C4 | −1.457299E−20 | −9.898545E−20 | −2.356683E−20 | 8.879145E−21 | −2.107717E−21 |
| C5 | 1.135473E−24 | −2.100825E−24 | 5.272291E−24 | −1.554926E−24 | 8.157939E−26 |
| C6 | −4.050698E−29 | −1.945638E−27 | −5.662110E−28 | 1.021591E−28 | 1.338073E−29 |

| | SRF | | | | |
|---|---|---|---|---|---|
| | 39 | 48 | 50 | 68 | 70 |
| K | 0 | 0 | 0 | 0 | 0 |
| C1 | 4.868775E−08 | 3.021420E−08 | 1.900388E−08 | −5.250831E−08 | 1.468736E−08 |
| C2 | −5.672263E−13 | −1.683656E−13 | 3.608771E−13 | −9.201980E−13 | −3.031829E−12 |
| C3 | 9.474618E−17 | −8.145104E−18 | −5.270168E−17 | −1.540202E−17 | −1.306691E−15 |
| C4 | −2.107717E−21 | 8.879145E−21 | 2.365395E−20 | −4.940151E−21 | 1.417316E−19 |
| C5 | 8.157939E−26 | −1.554926E−24 | −6.443516E−24 | 3.358184E−25 | −1.951105E−23 |
| C6 | 1.338073E−29 | 1.021591E−28 | 7.466478E−28 | −3.228554E−29 | 1.556934E−27 |

TABLE 11

| | NA | | 0.5 | |
| | OBH | | 62 | |

| SURF | RADIUS | THICKNESS | MATE-RIAL | INDEX | SEMI-DIAM. |
|---|---|---|---|---|---|
| 0 | 0.000000 | 65.555132 | | | 62.0 |
| 1 | −262.692796 | 58.390159 | SILUV | 1.469595 | 68.9 |
| 2 | −335.491269 | 1.002142 | | | 80.9 |
| 3 | −485.982299 | 95.402145 | SILUV | 1.469595 | 81.6 |
| 4 | −178.089496 | 0.998908 | | | 95.0 |
| 5 | 301.194343 | 30.926496 | SILUV | 1.469595 | 93.9 |
| 6 | −730.523345 | 0.998615 | | | 92.7 |
| 7 | 134.963732 | 23.829147 | SILUV | 1.469595 | 83.9 |
| 8 | 214.686465 | 0.998184 | | | 79.9 |
| 9 | 94.793549 | 53.781244 | SILUV | 1.469595 | 72.2 |
| 10 | 80.671778 | 12.965521 | | | 49.6 |
| 11 | 143.725446 | 13.924891 | SILUV | 1.469595 | 47.4 |
| 12 | 56.122354 | 30.110864 | | | 37.8 |
| 13 | 184.633446 | 9.999420 | SILUV | 1.469595 | 32.2 |
| 14 | 70.709704 | 50.069936 | | | 28.7 |
| 15 | −88.188113 | 9.998814 | SILUV | 1.469595 | 33.7 |
| 16 | 1639.141921 | 38.152732 | | | 42.3 |
| 17 | −452.766366 | 47.717755 | SILUV | 1.469595 | 71.2 |
| 18 | −90.282467 | 0.999222 | | | 77.1 |
| 19 | −203.492844 | 18.252322 | SILUV | 1.469595 | 84.3 |
| 20 | −151.049946 | 0.998618 | | | 87.6 |
| 21 | 3424.253364 | 28.068559 | SILUV | 1.469595 | 93.4 |
| 22 | −275.141884 | 0.998939 | | | 94.7 |
| 23 | 1095.872351 | 30.146098 | SILUV | 1.469595 | 95.0 |
| 24 | −289.000591 | 271.986113 | | | 94.9 |
| 25 | 0.000000 | −165.255256 | REFL | | 44.8 |
| 26 | −543.613185 | −29.999930 | SILUV | 1.469595 | 74.6 |
| 27 | 364.048320 | −677.088340 | | | 76.0 |
| 28 | 225.653383 | −15.000000 | SILUV | 1.469595 | 128.6 |
| 29 | −8889.084188 | −83.801565 | | | 147.7 |
| 30 | 406.604358 | 83.801565 | REFL | | 172.2 |
| 31 | −8889.084188 | 15.000000 | SILUV | 1.469595 | 153.4 |
| 32 | 225.653383 | 677.088340 | | | 136.8 |
| 33 | 364.048320 | 29.999930 | SILUV | 1.469595 | 91.3 |
| 34 | −543.613185 | 165.255256 | | | 89.9 |
| 35 | 0.000000 | −60.999486 | REFL | | 46.5 |
| 36 | −248.722657 | −9.999624 | SILUV | 1.469595 | 49.7 |
| 37 | −124.021747 | −3.776030 | | | 49.8 |
| 38 | −126.072837 | −20.177162 | SILUV | 1.469595 | 50.8 |
| 39 | −2579.523815 | −40.088038 | | | 50.9 |
| 40 | −304.558745 | −24.999919 | SILUV | 1.469595 | 51.7 |
| 41 | −228.739251 | −127.090268 | | | 50.6 |
| 42 | −195.231753 | 127.090268 | REFL | | 56.5 |
| 43 | −228.739251 | 24.999919 | SILUV | 1.469595 | 130.5 |
| 44 | −304.558745 | 15.449014 | | | 149.9 |
| 45 | −353.360267 | −15.449014 | REFL | | 163.0 |
| 46 | −304.558745 | −24.999919 | SILUV | 1.469595 | 159.3 |
| 47 | −228.739251 | −142.090268 | | | 148.6 |
| 48 | 0.000000 | −10.000000 | SILUV | 1.469595 | 140.4 |
| 49 | 0.000000 | −0.999090 | | | 139.8 |
| 50 | −208.937715 | −54.704843 | SILUV | 1.469595 | 135.0 |
| 51 | −3444.288303 | −0.998850 | | | 131.9 |
| 52 | −159.376740 | −30.213730 | SILUV | 1.469595 | 113.5 |
| 53 | −226.044729 | −0.998872 | | | 107.7 |
| 54 | −99.116898 | −28.577130 | SILUV | 1.469595 | 89.5 |
| 55 | −104.030988 | −24.590921 | | | 80.3 |
| 56 | −180.364312 | −9.999790 | SILUV | 1.469595 | 77.1 |
| 57 | −68.074055 | −93.378648 | | | 58.9 |
| 58 | −87.812319 | −27.638274 | SILUV | 1.469595 | 33.9 |
| 59 | −248.098009 | −5.059518 | | | 25.4 |
| 60 | 0.000000 | −5.000000 | SILUV | 1.469595 | 23.1 |
| 61 | 0.000000 | −10.000000 | | | 21.3 |
| 62 | 0.000000 | 0.000000 | | | 15.5 |

TABLE 11A

Aspheric Constants

| | SRF | | | | |
|---|---|---|---|---|---|
| | 1 | 13 | 20 | 27 | 29 |
| K | 0 | 0 | 0 | 0 | 0 |
| C1 | −5.755134E−08 | 1.257426E−07 | 1.746543E−08 | −1.028877E−08 | 4.311682E−09 |
| C2 | −1.878304E−12 | 3.158426E−11 | 6.867790E−13 | 1.901025E−14 | −4.199724E−14 |
| C3 | −6.883986E−17 | 5.520463E−15 | 2.422369E−17 | 1.731970E−18 | 4.941219E−19 |
| C4 | −1.810212E−20 | 1.538498E−18 | 8.419344E−22 | −3.546398E−23 | −4.176595E−24 |
| C5 | 2.094060E−24 | −6.359530E−22 | 2.862393E−26 | 2.594256E−27 | 5.734147E−30 |
| C6 | −2.075578E−28 | −2.859857E−25 | 2.452940E−30 | −2.169849E−31 | 1.584763E−34 |

| | SRF | | | | |
|---|---|---|---|---|---|
| | 31 | 33 | 40 | 42 | 44 |
| K | 0 | 0 | 0 | 1.096180 | 0 |
| C1 | 4.311682E−09 | −1.028877E−08 | −8.491784E−10 | 0.000000E+00 | −8.491784E−10 |
| C2 | −4.199724E−14 | 1.901025E−14 | −1.138273E−14 | 0.000000E+00 | −1.138273E−14 |
| C3 | 4.941219E−19 | 1.731970E−18 | −1.123799E−19 | 0.000000E+00 | −1.123799E−19 |
| C4 | −4.176595E−24 | −3.546398E−23 | −1.110851E−24 | 0.000000E+00 | −1.110851E−24 |
| C5 | 5.734147E−30 | 2.594256E−27 | −1.428900E−29 | 0.000000E+00 | −1.428900E−29 |
| C6 | 1.584763E−34 | −2.169849E−31 | −2.789684E−34 | 0.000000E+00 | −2.789684E−34 |

| | SRF | | |
|---|---|---|---|
| | 46 | 51 | 59 |
| K | 0 | 0 | 0 |
| C1 | −8.491784E−10 | −8.342928E−09 | 6.045965E−07 |
| C2 | −1.138273E−14 | 5.550791E−14 | 2.453289E−11 |
| C3 | −1.123799E−19 | −4.161956E−19 | −5.303577E−14 |
| C4 | −1.110851E−24 | −1.852225E−24 | −1.222148E−16 |
| C5 | −1.428900E−29 | 6.941238E−29 | 1.863660E−19 |
| C6 | −2.789684E−34 | 9.151959E−34 | −1.271608E−22 |

TABLE 13

| | NA | | 0.5 | |
|---|---|---|---|---|
| | OBH | | 63.13 | |

| SURF | RADIUS | THICKNESS | MATERIAL | INDEX | SEMI-DIAM. |
|---|---|---|---|---|---|
| 0 | 0.000000 | 30.999901 | | | 63.1 |
| 1 | 352.100506 | 9.999238 | SILUV | 1.469595 | 67.6 |
| 2 | 299.112304 | 0.999782 | | | 68.3 |
| 3 | 160.170855 | 35.197130 | SILUV | 1.469595 | 70.0 |
| 4 | −272.295394 | 37.070906 | | | 69.7 |
| 5 | 4280.985563 | 9.999101 | SILUV | 1.469595 | 61.3 |
| 6 | 144.106953 | 41.623829 | | | 58.6 |
| 7 | −80.869280 | 10.596275 | SILUV | 1.469595 | 58.6 |
| 8 | −147.787619 | 1.414406 | | | 65.2 |
| 9 | −354.217751 | 10.723672 | SILUV | 1.469595 | 67.6 |
| 10 | 262.847784 | 20.206270 | | | 73.8 |
| 11 | −537.366032 | 24.136927 | SILUV | 1.469595 | 76.2 |
| 12 | −179.202003 | 1.004382 | | | 80.4 |
| 13 | 433.783416 | 49.527682 | SILUV | 1.469595 | 91.4 |
| 14 | −163.736190 | 0.999059 | | | 93.1 |
| 15 | 257.199757 | 25.769544 | SILUV | 1.469595 | 89.4 |
| 16 | 15065.300591 | 0.998689 | | | 87.7 |
| 17 | 153.282386 | 24.817103 | SILUV | 1.469595 | 81.5 |
| 18 | 354.352062 | 0.998458 | | | 77.9 |
| 19 | 103.512120 | 49.204101 | SILUV | 1.469595 | 69.6 |
| 20 | 63.335357 | 5.215736 | | | 45.8 |
| 21 | 62.448757 | 53.951200 | SILUV | 1.469595 | 44.2 |
| 22 | 52.316362 | 36.399551 | | | 21.7 |
| 23 | −57.975068 | 9.999020 | SILUV | 1.469595 | 27.3 |
| 24 | −168.359577 | 21.370197 | | | 33.7 |
| 25 | −110.026859 | 9.999453 | SILUV | 1.469595 | 44.4 |
| 26 | −309.306552 | 0.998977 | | | 51.5 |
| 27 | 617.306803 | 52.552537 | SILUV | 1.469595 | 57.4 |
| 28 | −751.837962 | 3.136581 | | | 75.7 |
| 29 | −4472.469303 | 36.790931 | SILUV | 1.469595 | 79.2 |
| 30 | −335.977329 | 0.999700 | | | 88.5 |
| 31 | 349.440658 | 48.466362 | SILUV | 1.469595 | 95.7 |
| 32 | −161.233077 | 0.999113 | | | 98.5 |
| 33 | 251.193853 | 43.001663 | SILUV | 1.469595 | 102.9 |
| 34 | −479.286567 | 95.998539 | | | 102.0 |
| 35 | 0.000000 | −230.845227 | REFL | | 74.2 |
| 36 | 137.186190 | −10.000000 | SILUV | 1.469595 | 62.5 |
| 37 | 412.408427 | −383.574884 | | | 65.4 |
| 38 | 933.172212 | −30.001428 | SILUV | 1.469595 | 118.8 |
| 39 | 261.021411 | −274.087200 | | | 120.2 |
| 40 | 365.416470 | −15.000000 | SILUV | 1.469595 | 116.7 |
| 41 | −276.031009 | −54.345556 | | | 122.4 |
| 42 | 355.768801 | 54.345556 | REFL | | 125.4 |
| 43 | −276.031009 | 15.000000 | SILUV | 1.469595 | 121.0 |
| 44 | 365.416470 | 274.087200 | | | 112.0 |
| 45 | 261.021411 | 30.001428 | SILUV | 1.469595 | 111.1 |
| 46 | 933.172212 | 383.574884 | | | 109.7 |
| 47 | 412.408427 | 10.000000 | SILUV | 1.469595 | 69.3 |
| 48 | 137.186190 | 230.845227 | | | 66.6 |
| 49 | 0.000000 | −293.610022 | REFL | | 82.2 |
| 50 | 2450.097020 | −25.000000 | SILUV | 1.469595 | 126.2 |
| 51 | 582.198145 | 25.000000 | REFL | 1.469595 | 128.7 |
| 52 | 2450.097020 | 173.510495 | | | 124.9 |
| 53 | 310.101034 | −173.510495 | REFL | | 56.8 |
| 54 | 2450.097020 | −25.000000 | SILUV | 1.469595 | 56.6 |
| 55 | 582.198145 | −14.321186 | | | 56.8 |
| 56 | 159.877367 | −9.999169 | SILUV | 1.469595 | 56.5 |
| 57 | −649.160080 | −20.169434 | | | 58.7 |
| 58 | 188.208878 | −67.830259 | SILUV | 1.469595 | 60.1 |
| 59 | 147.140721 | −0.998999 | | | 73.6 |
| 60 | −496.278915 | −28.772948 | SILUV | 1.469595 | 75.8 |
| 61 | 229.044072 | −0.998595 | | | 75.9 |
| 62 | −176.316076 | −25.458327 | SILUV | 1.469595 | 71.6 |
| 63 | 1913.113358 | 8.841967 | | | 70.8 |
| 64 | 0.000000 | −9.840838 | | | 71.8 |
| 65 | −97.753416 | −47.419715 | SILUV | 1.469595 | 67.0 |
| 66 | −92.271860 | −30.224639 | | | 53.3 |
| 67 | 437.045983 | −9.999462 | SILUV | 1.469595 | 50.9 |
| 68 | −72.399349 | −6.511379 | | | 47.1 |
| 69 | −82.744883 | −28.425240 | SILUV | 1.469595 | 48.1 |
| 70 | 732.945497 | −0.999834 | | | 47.1 |
| 71 | −86.412037 | −19.156627 | SILUV | 1.469595 | 44.7 |
| 72 | −253.551246 | −1.075789 | | | 41.7 |
| 73 | −73.478775 | −23.301264 | SILUV | 1.469595 | 38.6 |
| 74 | −72.591632 | −9.781690 | | | 30.4 |
| 75 | −469.190155 | −12.924465 | SILUV | 1.469595 | 28.7 |
| 76 | 155.107728 | −2.055207 | | | 25.7 |
| 77 | 0.000000 | −5.000000 | SILUV | 1.469595 | 23.4 |
| 78 | 0.000000 | −10.000000 | | | 21.6 |
| 79 | 0.000000 | 0.000000 | | | 15.8 |

TABLE 13A

Aspheric Constants

| | SRF | | | | |
|---|---|---|---|---|---|
| | 1 | 25 | 31 | 39 | 41 |
| K | 0 | 0 | 0 | 0 | 0 |
| C1 | −3.661258E−07 | 3.464559E−07 | −1.305972E−07 | −8.640857E−09 | 3.747660E−08 |
| C2 | 1.843015E−10 | −1.827813E−11 | 5.295276E−12 | 4.122788E−14 | −7.383285E−13 |
| C3 | −6.268258E−14 | 9.923469E−15 | −3.005150E−16 | −1.211841E−18 | 2.271622E−17 |
| C4 | 1.260432E−17 | 3.105717E−18 | 7.641800E−21 | 2.586648E−23 | −6.270152E−22 |
| C5 | −1.377543E−21 | −1.902555E−21 | 8.273928E−26 | −6.141904E−28 | 1.356418E−26 |
| C6 | 6.363984E−26 | 2.869632E−25 | −9.242276E−30 | 6.191402E−33 | −1.478323E−31 |

| | SRF | | | | |
|---|---|---|---|---|---|
| | 43 | 45 | 51 | 53 | 55 |
| K | 0 | 0 | 0 | 0 | 0 |
| C1 | 3.747660E−08 | −8.640857E−09 | −5.179072E−10 | −2.124238E−09 | −5.179072E−10 |
| C2 | −7.383285E−13 | 4.122788E−14 | −1.738331E−15 | −1.918149E−14 | −1.738331E−15 |
| C3 | 2.271622E−17 | −1.211841E−18 | 1.880377E−19 | 2.010594E−16 | 1.880377E−19 |
| C4 | −6.270152E−22 | 2.586648E−23 | −1.509297E−23 | −3.842452E−20 | −1.509297E−23 |
| C5 | 1.356418E−26 | −6.141904E−28 | 6.484461E−28 | 8.836848E−24 | 6.484461E−28 |
| C6 | −1.478323E−31 | 6.191402E−33 | −1.081688E−32 | −8.715692E−28 | −1.081688E−32 |

TABLE 13A-continued

Aspheric Constants

| | SRF | | |
|---|---|---|---|
| | 62 | 67 | 76 |
| K | 0 | 0 | 0 |
| C1 | 3.148507E−08 | −1.234016E−07 | −1.048054E−06 |
| C2 | 1.380670E−12 | −4.625862E−12 | 1.803949E−09 |
| C3 | 3.697255E−17 | 1.096597E−15 | −2.780582E−12 |
| C4 | 5.878420E−21 | −2.873895E−19 | 3.426059E−15 |
| C5 | −5.716172E−25 | 5.922872E−23 | −2.424520E−18 |
| C6 | 4.374170E−29 | −7.953932E−27 | 7.260331E−22 |

TABLE 15

| | NA | 0.6 | | | | | |
|---|---|---|---|---|---|---|---|
| | OBH | 5 | | | | | |
| | WL | 405 | | 365.5 | | 436 | |
| SURF | RADIUS | THICKNESS | MATERIAL | INDEX1 | INDEX2 | INDEX3 | SEMIDIAM. |
| 0 | 0.000000 | 100.000000 | | | | | 5.00 |
| 1 | 0.000000 | 23.978926 | | | | | 6.69 |
| 2 | 100.279375 | 4.997550 | SILUV | 1.469595 | 1.474477 | 1.466705 | 5.49 |
| 3 | 38.347603 | 48.860824 | | | | | 5.22 |
| 4 | −63.524424 | 7.500790 | SILUV | 1.469595 | 1.474477 | 1.466705 | 4.67 |
| 5 | −59.086406 | 3.427079 | | | | | 4.79 |
| 6 | 21.437764 | −3.427079 | REFL | | | | 4.72 |
| 7 | −59.086406 | −7.500790 | SILUV | 1.469595 | 1.474477 | 1.466705 | 6.71 |
| 8 | −63.524424 | −48.860824 | | | | | 8.64 |
| 9 | 38.347603 | −4.997550 | SILUV | 1.469595 | 1.474477 | 1.466705 | 26.51 |
| 10 | 100.279375 | −3.978926 | | | | | 32.70 |
| 11 | 68.011922 | 3.978926 | REFL | | | | 33.28 |
| 12 | 100.279375 | 4.997550 | SILUV | 1.469595 | 1.474477 | 1.466705 | 32.95 |
| 13 | 38.347603 | 48.860824 | | | | | 28.42 |
| 14 | −63.524424 | 7.500790 | SILUV | 1.469595 | 1.474477 | 1.466705 | 25.42 |
| 15 | −59.086406 | 5.427079 | | | | | 25.92 |
| 16 | 0.000000 | 2.000000 | SILUV | 1.469595 | 1.474477 | 1.466705 | 24.76 |
| 17 | 0.000000 | 2.987131 | | | | | 24.61 |
| 18 | 225.245996 | 7.432028 | SILUV | 1.469595 | 1.474477 | 1.466705 | 23.91 |
| 19 | −69.420918 | 19.596774 | | | | | 23.69 |
| 20 | 23.134512 | 20.599033 | SILUV | 1.469595 | 1.474477 | 1.466705 | 13.22 |
| 21 | −276.448248 | 0.870385 | | | | | 5.51 |
| 22 | −28.412945 | 1.997697 | SILUV | 1.469595 | 1.474477 | 1.466705 | 5.13 |
| 23 | 21.255456 | 1.109912 | | | | | 4.03 |
| 24 | −31.221803 | 2.081591 | SILUV | 1.469595 | 1.474477 | 1.466705 | 3.80 |
| 25 | −16.655361 | 21.725692 | | | | | 3.28 |
| 26 | −28.142553 | −16.629382 | REFL | | | | 9.12 |
| 27 | 28.142553 | 23.241691 | REFL | | | | 8.70 |
| 28 | −27.198294 | 3.352300 | SILUV | 1.469595 | 1.474477 | 1.466705 | 4.74 |
| 29 | −9.909839 | 0.198323 | | | | | 5.66 |
| 30 | 259.226768 | 3.184463 | SILUV | 1.469595 | 1.474477 | 1.466705 | 6.40 |
| 31 | −21.910436 | 0.199199 | | | | | 6.86 |
| 32 | 27.736079 | 42.459484 | SILUV | 1.469595 | 1.474477 | 1.466705 | 7.28 |
| 33 | −36.360999 | 0.198349 | | | | | 8.60 |
| 34 | 48.850843 | 3.912770 | SILUV | 1.469595 | 1.474477 | 1.466705 | 8.47 |
| 35 | −29.828770 | 0.190193 | | | | | 8.27 |
| 36 | 11.325954 | 4.718220 | SILUV | 1.469595 | 1.474477 | 1.466705 | 7.08 |
| 37 | −82.204408 | 1.146759 | | | | | 6.19 |
| 38 | −19.195841 | 3.439905 | SILUV | 1.469595 | 1.474477 | 1.466705 | 5.78 |
| 39 | −17.019410 | 0.355875 | | | | | 4.71 |
| 40 | 0.000000 | 2.000000 | SILUV | 1.469595 | 1.474477 | 1.466705 | 3.98 |
| 41 | 0.000000 | 4.000000 | | | | | 3.12 |
| 42 | 0.000000 | 0.000000 | | | | | 0.25 |

TABLE 15A

Conic Constants

| Conic Srf | constant K |
|---|---|
| 26 | −4.263306 |
| 27 | −4.263306 |

What is claimed is:

1. A catadioptric objective comprising:
a plurality of optical elements arranged along an optical axis to image a pattern from an object field in an object surface of the objective to an image field in an image surface region of the objective at an image-side numerical aperture NA with electromagnetic radiation from a wavelength band around a central wavelength λ<300 nm, the optical elements including:
a concave mirror; and
a plurality of lenses;
wherein the projection objective forms an image of the pattern in a respective Petzval surface for each wavelength λ of a wavelength band, the Petzval surfaces deviating from each other for different wavelengths;
wherein the plurality of lenses include lenses made from different materials having substantially different Abbe numbers;
and wherein a longitudinal departure p of the Petzval surface at a given wavelength from a planar reference surface at an edge field point of the image field, at maximum image height y', measured parallel to the optical axis in the image surface region, varies with the wavelength λ according to $$dp/d\lambda < (15\ \lambda/NA^2)/nm.$$

2. Objective according to claim 1, wherein the objective reduces a longitudinal departure p of the Petzval surface at a given wavelength from a planar reference surface at an edge field point of the image field at the maximum image height y' to less than $\lambda/NA^2$ for each wavelength in the wavelength band.

3. Objective according to claim 1, wherein the image field has an image field size defined by the maximum image field height y' greater than 3 mm.

4. Objective according to claim 3, wherein the maximum image field height y' is at least 10 mm.

5. Objective according to claim 1, wherein the objective has an image-side numerical aperture NA>0.2.

6. Objective according to claim 5, wherein the objective has an image-side numerical aperture NA≧0.6.

7. Objective according to claim 1, wherein the objective is configured as an immersion objective with image-side numerical aperture NA≧1 when used in conjunction with an immersion liquid in an image-side working space between an exit surface of the objective and the image surface during operation.

8. Objective according to claim 1, wherein the concave mirror is arranged at or optically close to a pupil surface of the objective and a negative group comprising at least one negative lens is arranged in front of the concave mirror on a reflecting side thereof in a double pass region such that radiation passes at least twice in opposite directions through the negative group.

9. Objective according to claim 1, wherein the plurality of lenses include lenses made from different materials having different Abbe numbers defining a median Abbe number, wherein at least one of the plurality of lenses is a first lens made from a first material having a first Abbe number equal to or greater than the median Abbe number and at least one of the plurality of lenses is made from a second material having an Abbe number smaller than the median Abbe number.

10. Objective according to claim 9, wherein more than 50% of all the lenses are made from the second material and less than 50% are made from the first material.

11. Objective according to claim 9, wherein at least one second lens made from the second material is a negative lens.

12. Objective according to claim 11, wherein the negative lens is a biconcave negative lens.

13. Objective according to claim 11, wherein the negative lens has an optically free diameter substantially smaller than an optically free diameter of at least one lens directly adjacent to the negative lens.

14. Objective according to claim 13, wherein the negative lens has an optically free diameter which is less than 80% of an optically free diameter of a largest lens of the objective.

15. Objective according to claim 14, wherein the optically free diameter of the negative lens is less than 50% of the optically free diameter of the largest lens of the objective.

16. Objective according to claim 11, wherein the negative lens is arranged between two adjacent lenses, where each of the two adjacent lenses has an optically free diameter substantially larger than the optically free diameter of the negative lens.

17. Objective according to claim 11, wherein the objective includes at least one waist region where a beam diameter of a radiation beam passing through the objective has a local minimum, and wherein the negative lens is positioned in the waist region.

18. Objective according to claim 11, wherein the objective includes at least two negative lenses of the second material.

19. Objective according to claim 9, wherein the first material is fused silica ($SiO_2$).

20. Objective according to claim 9, wherein the optical elements include a lens doublet consisting of a first lens and a second lens directly adjacent to the first lens, wherein the first lens is a positive lens made from the first material and the second lens is a negative lens made from the second material.

21. Objective according to claim 20, wherein the lens doublet is arranged in a region optically close to a field surface of the projection objective, where a chief ray height is at least 50% of a maximum chief ray height in the objective.

22. Objective according to claim 21, wherein the field surface is the object surface.

23. Objective according to claim 1, wherein more than 50% of all the lenses are made of fused silica ($SiO_2$).

24. Objective according to claim 1, wherein the optical elements are arranged to form at least one intermediate image in an intermediate image surface between the object surface and the image surface.

25. Objective according to claim 24, wherein the intermediate image has substantial chromatic aberration and wherein at least one lens is arranged in a region optically close to the intermediate image.

26. Objective according to claim 25, wherein the lens arranged close to the intermediate image is arranged in a region where a marginal ray height of the imaging is smaller than a chief ray height.

27. Objective according to claim 1, wherein the optical elements are arranged to form exactly two intermediate images between the object surface and the image surface.

28. Objective according to claim 1, wherein the objective includes:
a first objective part configured to image the pattern into a first intermediate image;

a second objective part configured to image the first intermediate image into a second intermediate image; and
a third objective part configured to image the second intermediate image onto the image surface.

29. Objective according to claim 28, wherein the second objective part includes the at least one concave mirror.

30. Objective according to claim 28, wherein the first objective part is a refractive objective part.

31. Objective according to claim 28, wherein the third objective part is a refractive objective part.

32. Objective according to claim 28, further comprising:
a first deflecting mirror arranged to deflect radiation from the object surface towards the concave mirror or to deflect radiation from the concave mirror towards the image surface such that a double pass region is formed geometrically between the first deflecting mirror and the concave mirror.

33. Objective according to claim 32, further comprising:
a second deflecting mirror arranged to deflect radiation from the first deflecting mirror towards the image surface such that the image surface is parallel to the object surface.

34. Objective according to claim 28, wherein the second objective part configured to image the first intermediate image into the second intermediate image has a second magnification $\beta_2$ according to the condition $0.8 \leq |\beta_2| \leq 1.1$.

35. Objective according to claim 28, wherein the first objective part configured to image the pattern into a first intermediate image includes a sequence of consecutive lens groups having alternating refractive powers including a first lens group with a positive refractive power, a second lens group with negative refractive power immediately following the first lens group, a third lens group with positive refractive power immediately following the second lens group, a fourth lens group with negative refractive power immediately following the third lens group and a fifth lens group with positive refractive power immediately following the fourth lens group, such that at least two separate waist regions are created where a beam diameter of radiation passing through the first objective part has a local minimum.

36. Objective according to claim 28, wherein there is exactly one concave mirror.

* * * * *

UNITED STATES PATENT AND TRADEMARK OFFICE
CERTIFICATE OF CORRECTION

Figure 2D:
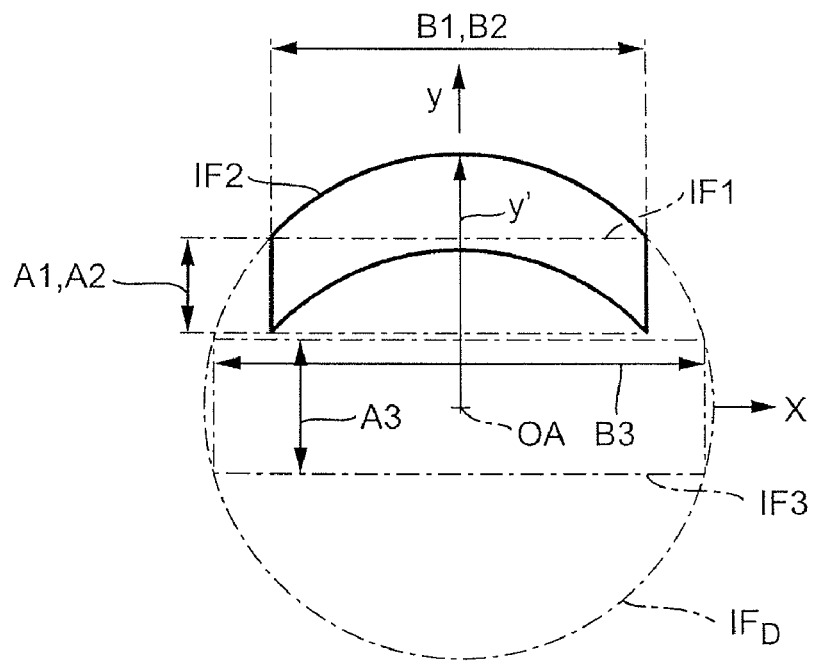

PATENT NO.         : 8,004,756 B2                                            Page 1 of 1
APPLICATION NO.    : 12/834485
DATED              : August 23, 2011
INVENTOR(S)        : Alexander Epple It is certified that error appears in the above-identified patent and that said Letters Patent is hereby corrected as shown below:

Column 4, Line 16: delete "nm" and insert -- nm. --
Column 4, Line 32: delete "tangetial" and insert -- tangential --
Column 5, Line 59: delete "negligible" and insert -- negligible. --
Column 6, Line 16: delete "$R_p$" and insert -- $R_P$ --
Column 11, Line 46: delete "FIG. 2D." and insert -- FIG. 2D; --
Column 12, Line 3: delete "100," and insert -- 10C, --
Column 12, Line 8: delete "FIG." and insert -- FIGS. --
Column 13, Line 63: delete "microlithograpy" and insert -- microlithography --
Column 14, Line 67: delete "(1-line)," and insert -- (I-line), --
Column 15, Line 37-38: delete "a part" and insert -- apart --
Column 16, Line 9: delete "1-lines" and insert -- I-lines --
Column 19, Line 7: delete "approriate" and insert -- appropriate --
Column 24, Line 18: delete "silica:" and insert -- silica. --
Column 25, Line 67: delete "1-line" and insert -- I-line --
Column 29, Line 48: delete "1-," and insert -- I-, --
Column 32, Line 2: delete "CMV" and insert -- CVM --
Column 33, Line 5: delete "my also" and insert -- may also --

Signed and Sealed this

Thirteenth Day of November, 2012

David J. Kappos
*Director of the United States Patent and Trademark Office*